(12) United States Patent
Machkaoutsan et al.

(10) Patent No.: US 10,043,796 B2
(45) Date of Patent: Aug. 7, 2018

(54) VERTICALLY STACKED NANOWIRE FIELD EFFECT TRANSISTORS

(71) Applicant: QUALCOMM Incorporated, San Diego, CA (US)

(72) Inventors: Vladimir Machkaoutsan, Wezemaal (BE); Stanley Seungchul Song, San Diego, CA (US); Mustafa Badaroglu, Kessel-Lo (BE); John Jianhong Zhu, San Diego, CA (US); Junjing Bao, San Diego, CA (US); Jeffrey Junhao Xu, San Diego, CA (US); Da Yang, San Diego, CA (US); Matthew Michael Nowak, San Diego, CA (US); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/097,142

(22) Filed: Apr. 12, 2016

(65) Prior Publication Data
US 2017/0221884 A1    Aug. 3, 2017

Related U.S. Application Data

(60) Provisional application No. 62/289,819, filed on Feb. 1, 2016.

(51) Int. Cl.
*H01L 29/06* (2006.01)
*H01L 27/088* (2006.01)
(Continued)

(52) U.S. Cl.
CPC .... *H01L 27/088* (2013.01); *H01L 21/823418* (2013.01); *H01L 21/823481* (2013.01);
(Continued)

(58) Field of Classification Search
None
See application file for complete search history.

(56) References Cited

U.S. PATENT DOCUMENTS

| 5,398,200 A | 3/1995 | Mazure et al. |
|---|---|---|
| 7,052,941 B2 | 5/2006 | Lee |

(Continued)

FOREIGN PATENT DOCUMENTS

| JP | 2007059680 A | 3/2007 | |
|---|---|---|---|
| JP | 2007250652 | * 9/2007 | ......... H01L 21/8234 |

(Continued)

OTHER PUBLICATIONS

Larrieu et al. "Vertical nanowire array-based field effect transistors for ultimate scaling", 2013, RSC Publishing, pp. 2437-2441.*

(Continued)

*Primary Examiner* — Telly Green
(74) *Attorney, Agent, or Firm* — Qualcomm Incorporated-Tol

(57) ABSTRACT

A device includes a substrate, a first nanowire field effect transistor (FET), and a second nanowire FET positioned between the substrate and the first nanowire FET. The device also includes a first nanowire electrically coupled to the first nanowire FET and to the second nanowire FET.

33 Claims, 43 Drawing Sheets

(51) Int. Cl.
*H01L 27/02* (2006.01)
*H01L 21/8234* (2006.01)
*H01L 21/8238* (2006.01)
*H01L 29/423* (2006.01)
*H01L 27/06* (2006.01)

(52) U.S. Cl.
CPC ............ *H01L 21/823487* (2013.01); *H01L 21/823885* (2013.01); *H01L 27/0207* (2013.01); *H01L 27/0688* (2013.01); *H01L 29/0649* (2013.01); *H01L 29/0669* (2013.01); *H01L 29/0676* (2013.01); *H01L 29/42392* (2013.01)

(56) References Cited

U.S. PATENT DOCUMENTS

| | | | |
|---|---|---|---|
| 8,334,551 B2 | 12/2012 | Itagaki et al. | |
| 8,399,879 B2* | 3/2013 | Liu .................. | B82Y 10/00 257/24 |
| 8,658,518 B1* | 2/2014 | Chang ............... | B82Y 10/00 257/E21.09 |
| 8,659,006 B1* | 2/2014 | Chang ............... | B82Y 10/00 257/27 |
| 8,679,902 B1* | 3/2014 | Basker ............. | H01L 29/66439 257/E21.051 |
| 8,785,930 B2* | 7/2014 | Brambilla ........... | H01L 23/544 257/48 |
| 8,866,208 B2 | 10/2014 | Lee | |
| 8,933,516 B1 | 1/2015 | Wu et al. | |
| 9,437,501 B1* | 9/2016 | Cheng .............. | H01L 27/092 |
| 9,536,876 B2* | 1/2017 | Peng ............... | H01L 27/088 |
| 9,653,286 B2* | 5/2017 | Ohlsson ........... | H01L 21/0237 |
| 2010/0163871 A1* | 7/2010 | Brambilla .......... | H01L 23/544 257/48 |
| 2011/0207303 A1 | 8/2011 | Jeong et al. | |
| 2013/0015500 A1 | 1/2013 | Izumida et al. | |
| 2014/0030859 A1 | 1/2014 | Xie et al. | |
| 2014/0048773 A1* | 2/2014 | Chang .............. | B82Y 10/00 257/27 |
| 2014/0051213 A1* | 2/2014 | Chang .............. | B82Y 10/00 438/151 |
| 2014/0085959 A1 | 3/2014 | Saraswat et al. | |
| 2015/0014631 A1* | 1/2015 | Ohlsson ........... | H01L 21/0237 257/24 |
| 2015/0017767 A1 | 1/2015 | Masuoka et al. | |
| 2015/0035568 A1* | 2/2015 | Peng ............... | H01L 27/088 327/109 |
| 2015/0145042 A1* | 5/2015 | Bu ................. | H01L 27/1211 257/347 |
| 2015/0171032 A1* | 6/2015 | Colinge ............ | H01L 23/60 257/355 |
| 2015/0370949 A1 | 12/2015 | Moroz et al. | |
| 2016/0013284 A1 | 1/2016 | Masuoka et al. | |
| 2016/0056304 A1* | 2/2016 | Kim ............... | H01L 29/66439 257/192 |
| 2017/0316932 A1* | 11/2017 | Ohlsson ........... | H01L 21/0237 |

FOREIGN PATENT DOCUMENTS

| | | |
|---|---|---|
| JP | 2007250652 A | 9/2007 |
| KR | 100660891 B1 | 12/2006 |

OTHER PUBLICATIONS

Gaillardon et al. "Vertically-stacked Silicon Nanowire Transistors with Controllable Polarity: a Robustness Studay", 2013, IEEE.*
Partial International Search Report—PCT/US2017/012567—ISA/EPO—dated Apr. 7, 2017.
International Search Report and Written Opinion—PCT/US2017/012567—ISA/EPO—dated Jul. 31, 2017.

* cited by examiner

P-type nanowire FET Stack

N-type nanowire FET Stack

VERTICALLY STACKED NANOWIRE FIELD EFFECT TRANSISTORS

I. CROSS REFERENCE TO RELATED APPLICATIONS

The present application claims the benefit of U.S. Provisional Patent Application No. 62/289,819, entitled "VERTICALLY STACKED NANOWIRE FIELD EFFECT TRANSISTORS," filed Feb. 1, 2016, which is expressly incorporated by reference herein in its entirety.

II. FIELD

The present disclosure is generally related to vertically stacked nanowire field effect transistors.

III. DESCRIPTION OF RELATED ART

Advances in technology have resulted in smaller and more powerful computing devices. For example, a variety of portable personal computing devices, including wireless telephones such as mobile and smart phones, tablets and laptop computers, are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

Generally, computing devices use a large number of transistors, such as transistors used for processing logic and transistors used for memory devices. As computing devices continue to decrease in size, the footprint associated with transistors in various integrated circuits tends to increase unless the size of each transistor can be decreased. Decreasing the size of each transistor can increase variability between transistors. For example, the transistor-to-transistor variability of characteristics such as threshold voltage tends to increase as the size of each transistor decreases. Because of the large number of transistors and the complexity of the circuitry, variability from transistor to transistor is an increasingly difficult problem to address.

IV. SUMMARY

In a particular aspect, a device (e.g., an integrated circuit or an apparatus that includes an integrated circuit) includes a substrate, a first nanowire FET, and a second nanowire FET that is positioned between the substrate and the first nanowire FET. A first nanowire is electrically coupled to the first nanowire FET and to the second nanowire FET. Thus, the first nanowire FET and the second nanowire FET form a vertical nanowire FET stack. In this context, vertical refers to extending substantially perpendicular to a surface of the substrate.

In a particular aspect, a method includes forming a first nanowire FET on a substrate and forming a second nanowire FET on the first nanowire FET to form a nanowire FET stack. The nanowire FET stack includes a nanowire that is electrically coupled to the first nanowire FET and to the second nanowire FET. The method may include forming the first nanowire FET and the second nanowire FET concurrently.

In another particular aspect, a non-transitory computer-readable medium stores processor executable instructions that, when executed by a processor, cause the processor to initiate formation of a nanowire FET stack on a substrate. The nanowire FET stack may be formed by forming a first nanowire FET on the substrate and forming a second nanowire FET on the first nanowire FET such that a nanowire is electrically coupled to the first nanowire FET and to the second nanowire FET.

In another particular aspect, a device (e.g., an integrated circuit or an apparatus that includes an integrated circuit) includes means for supporting an integrated circuit. The device also includes first means for providing charge carriers coupled to the means for supporting and means for collecting charge carriers coupled to the means for supporting. The device also includes first means for controlling a conductive channel. The first means for controlling the conductive channel is positioned between the first means for providing charge carriers and the means for collecting charge carriers. The device further includes second means for providing charge carriers coupled to the means for supporting and second means for controlling the conductive channel. The second means for controlling the conductive channel is positioned between the second means for providing charge carriers and the means for collecting charge carriers. The device also includes means for forming the conductive channel coupled to the first means for providing charge carriers, to the first means for controlling the conductive channel, to the means for collecting charge carriers, to the second means for controlling the conductive channel, and to the second means for providing charge carriers. The means for forming the conductive channel has a dimension parallel to a surface of the means for supporting of less than 100 nanometers.

In another particular aspect, a device (e.g., an integrated circuit or an apparatus that includes an integrated circuit) includes means for supporting an integrated circuit. The device also includes first means for collecting charge carriers coupled to the means for supporting and means for providing charge carriers coupled to the means for supporting. The device further includes first means for controlling a conductive channel. The first means for controlling the conductive channel is positioned between the first means for collecting charge carriers and the means for providing charge carriers. The device also includes second means for collecting charge carriers coupled to the means for supporting and second means for controlling the conductive channel. The second means for controlling the conductive channel is positioned between the second means for collecting charge carriers and the means for providing charge carriers. The device further includes means for forming the conductive channel coupled to the first means for collecting charge carriers, to the first means for controlling the conductive channel, to the means for providing charge carriers, to the second means for controlling the conductive channel, and to the second means for collecting charge carriers. The means for forming the conductive channel has a dimension parallel to a surface of the means for supporting less than 100 nanometers.

Aspects, advantages, and features of the present disclosure will become apparent after review of the entire application, including the following sections: Brief Description of the Drawings, Detailed Description, and the Claims.

V. BRIEF DESCRIPTION OF THE DRAWINGS

Figure 46:
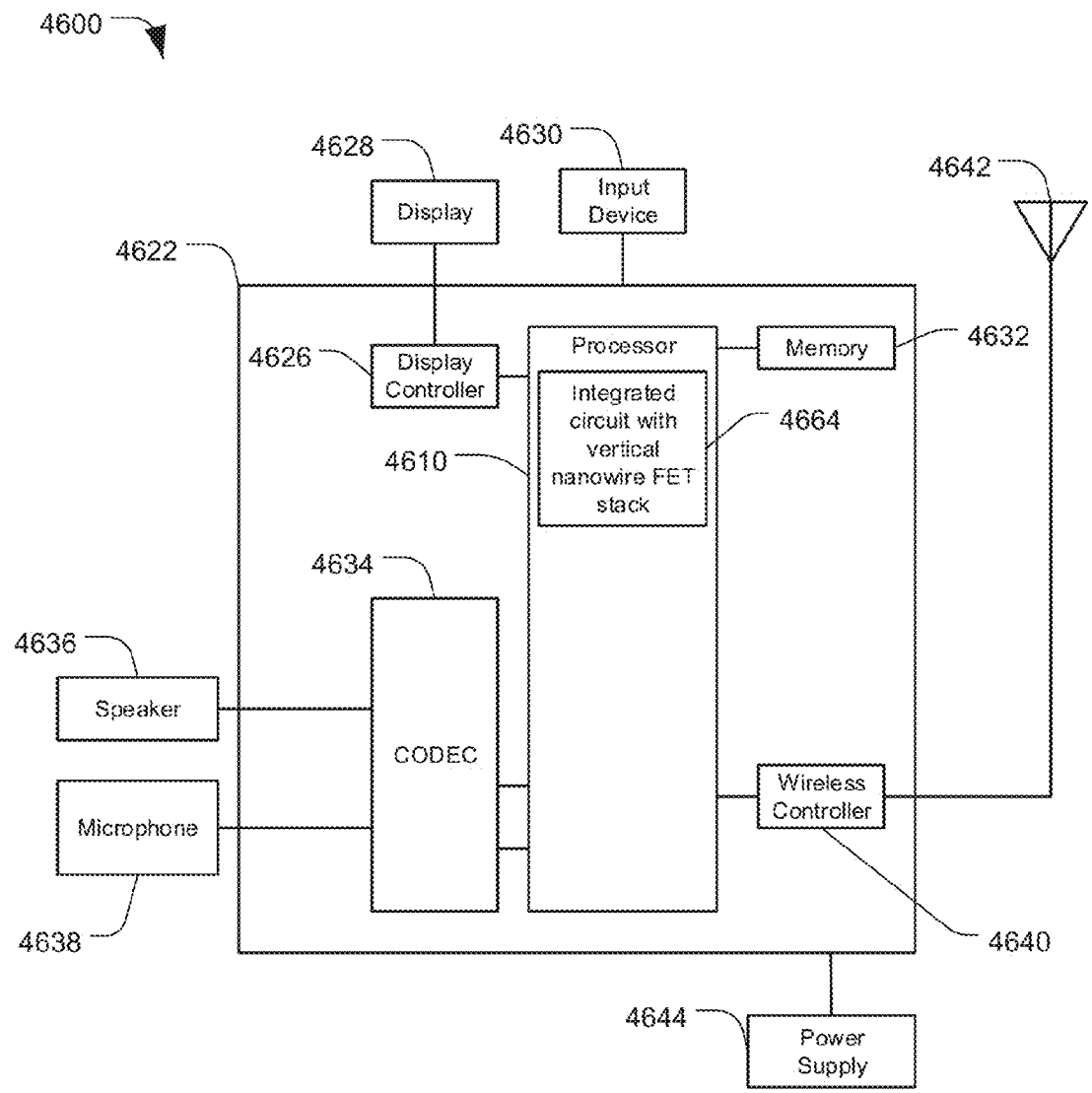
Figure 47:
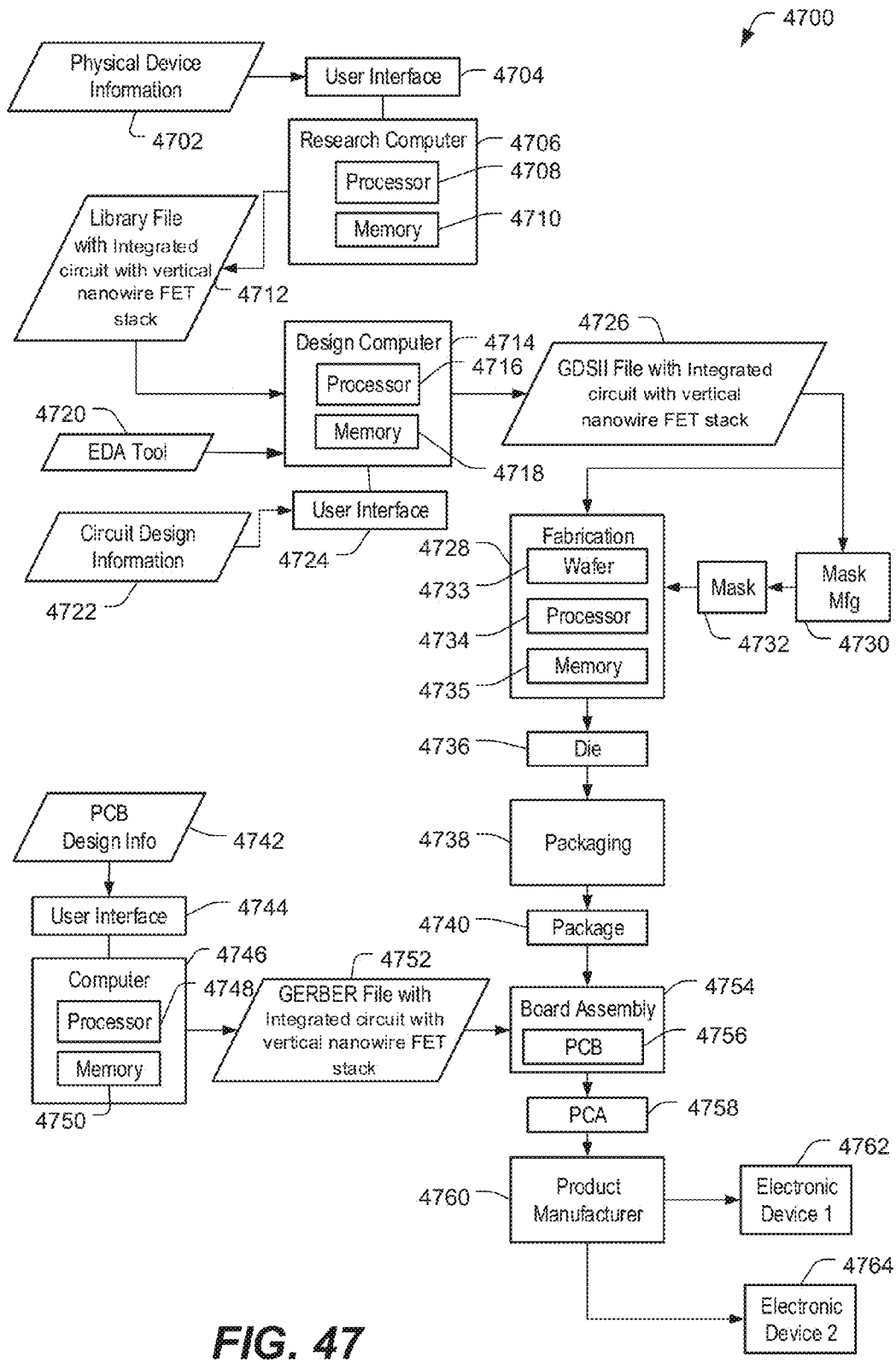

FIG. 46 is a block diagram of portable device including an integrated circuit having a nanowire FET stack according to a particular aspect of the disclosure; and FIG. 47 is a data flow diagram of a particular illustrative implementation of a manufacturing process to manufacture electronic devices that include an integrated circuit having a nanowire FET stack according to a particular aspect of the disclosure.

VI. DETAILED DESCRIPTION

Particular aspects of the present disclosure are described below with reference to the drawings. In the description, common features are designated by common reference numbers. As used herein, various terminology is used for the purpose of describing particular implementations only and is not intended to be limiting. For example, the singular forms "a," "an," and "the" are intended to include the plural forms as well, unless the context clearly indicates otherwise. It may be further understood that the terms "comprises" and "comprising" may be used interchangeably with "includes" or "including." Additionally, it will be understood that the term "wherein" may be used interchangeably with "where." As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to a grouping of one or more elements, and the term "plurality" refers to multiple elements.

Nanowire field effect transistors (FET) include one or more nanowires that extend between a source region, a drain region, and a gate region between the source region and the drain region. Typically, the nanowire is conductive (or semiconductive) to form a channel between the source region and the drain region. The channel is opened or closed based on a current or a voltage applied to the gate region. Nanowire FETs can provide improvements in electrostatic channel control as compared to other types of transistors, such as finFETs. However, laterally arranged nanowire FETs (e.g., nanowire FETs arranged roughly parallel to a surface of a substrate) suffer from the same issue of increased footprint as other types of transistors.

Aspects disclosed herein include vertically stacked nanowire FETs (e.g., nanowire FETs arranged to form a stack that extends substantially perpendicular to a surface of a substrate of an integrated circuit). The vertically stacked nanowire FETs can include multiple transistors with a common gate line, a common source line, and a common drain line, such that at any time each transistor in the stack is either active (e.g., has an open channel) or inactive (e.g., has a closed channel). In this arrangement, while the nanowire FETs stack includes multiple transistors, the transistors of the stack may act in conjunction as a single transistor. Thus, a stack can be formed to have a desired characteristic (e.g., drive strength) based on the number of transistors in the stack. To illustrate, during design of an integrated circuit, the drive strength of the stack can be increased by adding more transistors to the stack, or the drive strength of the stack can be decreased by reducing the number of transistors in the stack.

With the nanowire FETs stacked vertically, variability from transistor stack to transistor stack can be decreased because the variability is related to differences in layer thickness (rather than feature width as in laterally arranged transistors), and layer thicknesses can be more finely and more consistently controlled than feature widths.

In a particular aspect, methods of forming multiple vertical nanowire FET stacks concurrently are described. A process flow is described that enables forming a significant number of vertically stacked nanowire FETs, which may include both P-type transistors and N-type transistors, may include stacks having different characteristics, such as different drive strengths, or a combination thereof. For example, a first nanowire FET stack may include a first number of nanowire FETs, and a second nanowire FET stack on the same substrate may include a different number of nanowire FETs. In this example, the drive strength of the first stack may be different from the drive strength of the second stack. The first stack and second stack may be formed concurrently or partially concurrently.

Figure 1A:
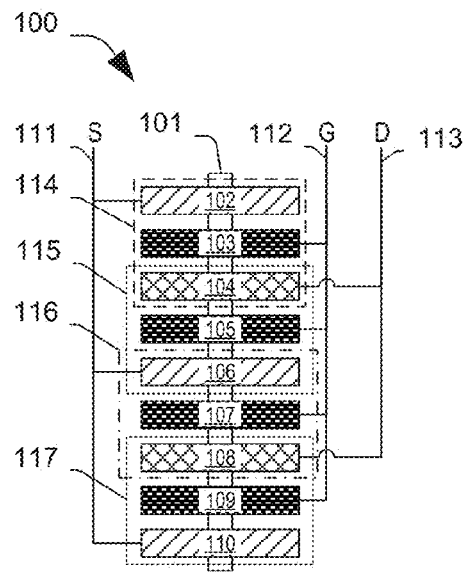
FIG. 1A is a diagram illustrating a nanowire FET stack according to a particular aspect of the disclosure.

FIG. 1A is a diagram illustrating a nanowire FET stack 100 according to a particular aspect of the disclosure. The nanowire FET stack 100 includes a plurality of layers arranged vertically above (in the view shown in FIG. 1A) a substrate (such as a substrate 202 shown in FIGS. 2 and 3). The nanowire FET stack 100 includes a nanowire 101 extending through each of the layers. Various layers of the nanowire FET stack 100 are electrically coupled to conductive lines, such as a source line 111, a drain line 113, and a gate line 112. Thus, in FIG. 1A, nanowire FETs of the nanowire FET stack 100 are coupled such that nanowire FETs of the nanowire FET stack 100 are controlled concurrently. In this manner, the nanowire FET stack 100 acts effectively as a single transistor.

In FIG. 1A, the nanowire FET stack 100 includes a plurality of source region layers, including source region layers 102, 106, and 110. Additionally, the nanowire FET stack 100 includes a plurality of gate region layers, including gate region layers 103, 105, 107, and 109. Further, the nanowire FET stack 100 includes a plurality of drain region layers, including a first drain region layer 104 and a second drain region layer 108. The various layers are arranged such that a gate region layer is between each source region layer and a corresponding drain region layer. For example, a first nanowire FET 114 (outlined using a dashed line in FIG. 1A) is formed by a first source region layer 102, a first gate region layer 103, and a first drain region layer 104. The nanowire FET stack 100 also includes a second nanowire FET 115 (outlined using a dotted line in FIG. 1A) formed by the first drain region layer 104, a second gate region layer 105, and a second source region layer 106. Additionally, in FIG. 1A, the nanowire FET stack 100 includes a third nanowire FET 116 (outlined using a dot/dash line in FIG. 1A) formed by the second source region layer 106, a third gate region layer 107, and the second drain region layer 108. Further, the nanowire FET stack 100 includes a fourth nanowire FET 117 (outlined using a dotted line in FIG. 1A) formed by the second drain region layer 108, a fourth gate region layer 109, and a third source region layer 110. Although the nanowire FET stack 100 is illustrated in FIG. 1A as including four nanowire FETs 114-117, in other implementations a nanowire FET stack may include more than four nanowire FETs or fewer than four nanowire FETs.

Figure 1B:
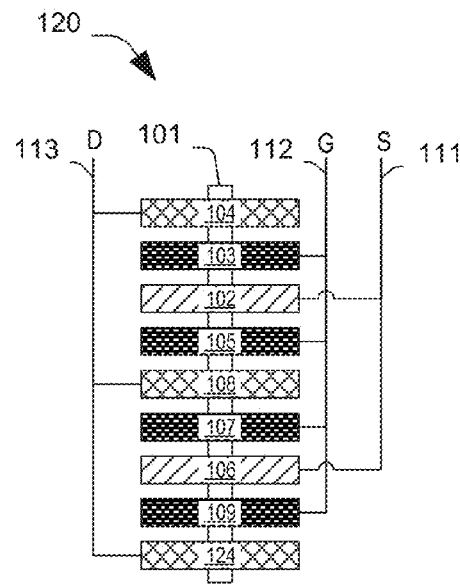
FIG. 1B is a diagram illustrating a nanowire FET stack according to a particular aspect of the disclosure.

FIG. 1B is a diagram illustrating a nanowire FET stack 120 according to a particular aspect of the disclosure. In FIG. 1B, the layers are rearranged such that the first drain region layer 104 is the top layer. Thus, the first drain region layer 104, the first gate region layer 103, and the first source region layer 102 form a first nanowire FET; the first source region layer 102, the second gate region layer 105, and the second drain region layer 108 form a second nanowire FET; the second drain region layer 108, the third gate region layer 107, and the second source region layer 106 form a third nanowire FET; and the second source region layer 106, the fourth gate region layer 109, and a third drain region layer 124 form a fourth nanowire FET. As described with reference to FIG. 1, although the nanowire FET stack 120 is illustrated in FIG. 1B as including four nanowire FETs, in other implementations a nanowire FET stack may include more than four nanowire FETs or fewer than four nanowire FETs.

Figure 1C:
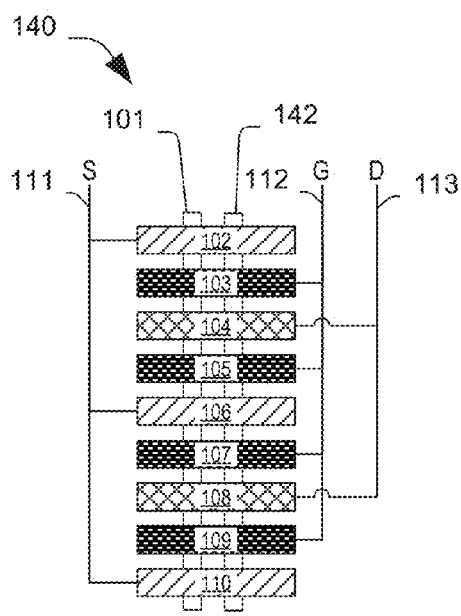
FIG. 1C is a diagram illustrating a nanowire FET stack according to a particular aspect of the disclosure.

FIG. 1C is a diagram illustrating a nanowire FET stack 140 according to a particular aspect of the disclosure. In FIG. 1C, the nanowire FET stack 140 includes a plurality of nanowires 101 and 142 extending through the various source region layers, gate region layers and drain region layers. In FIG. 1C, each of the nanowires 101, 142 extends in a direction substantially perpendicular to a surface of the substrate. Although two nanowires are illustrated in FIG. 1C, in other implementations, more than two nanowires may be utilized for a particular nanowire FET stack. For example, three or more nanowires may be used for a particular nanowire FET stack. Additionally, FIG. 1C illustrates multiple nanowires in the context of a nanowire FET stack having layers arranged as described with reference to FIG. 1A. In other implementations, multiple nanowires may be used in a nanowire FET stack having layers arranged as described with reference to FIG. 1B.

Figure 1D:
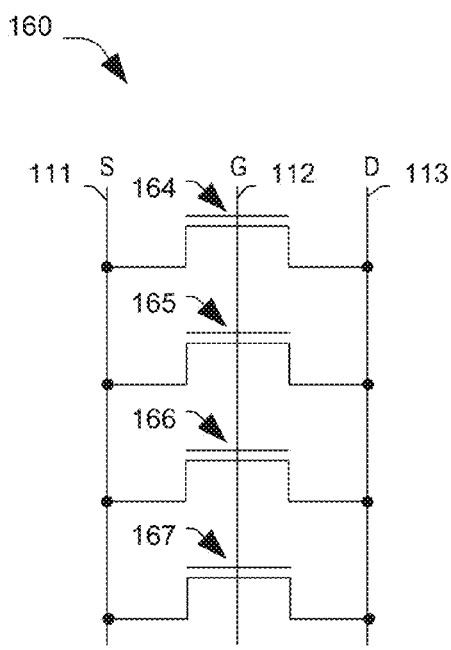
FIG. 1D is a diagram illustrating a circuit corresponding to one or more of the nanowire FET stacks of FIGS. 1A, 1B, and 1C.

FIG. 1D is a diagram illustrating a circuit 160 corresponding to one or more of the nanowire FET stacks 100, 120, or 140 of FIGS. 1A, 1B, and 1C, respectively. In FIG. 1D, the source line 111, the gate line 112, and the drain line 113 are coupled to four transistors, including transistors 164-167. In this arrangement, a single gate line (gate line 112) controls each of the transistors 164-167, and the transistors 164-167 are coupled in parallel to the source line 111 and the drain line 113. Accordingly, the transistors 164-167 act in unison as a single effective transistor in an integrated circuit. The transistors 164-147 may include or correspond to the nanowire FETs 114-117. During design of the integrated circuit, if the integrated circuit needs a single effective transistor having greater drive strength, more transistors can be designed into the circuit 160 by adding another nanowire FET to the stack. Alternately, if the integrated circuit can use a single effective transistor having less drive strength, fewer transistors can be designed into the circuit 160 by removing a nanowire FET (such as the transistor 167) from the stack.

One particular advantage provided by at least one of the disclosed implementations is that transistor-to-transistor variability can be reduced (as compared to laterally arranged transistors) by using vertical stacks of nanowire FETs with each stack acting as a single effective transistor. In addition, the reduction in transistor-to-transistor variability can be achieved without significant process flow or footprint penalties.

Figure 2:
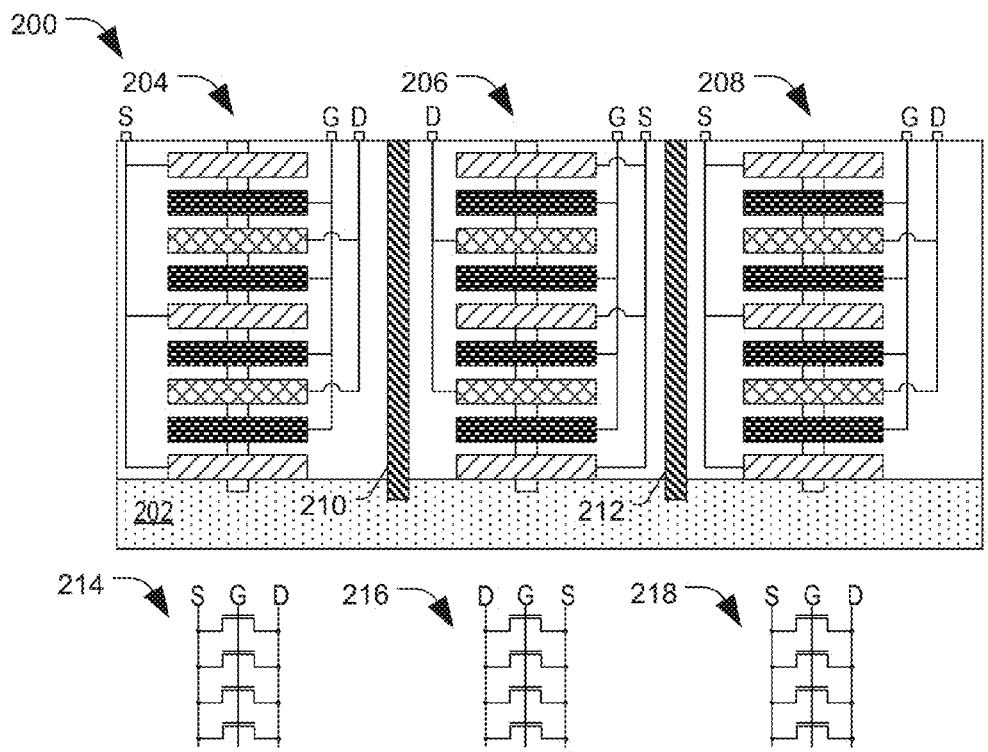
FIG. 2 is a diagram illustrating an integrated circuit including multiple nanowire FET stacks according to a particular aspect of the disclosure.

FIG. 2 is a diagram illustrating an integrated circuit 200 including multiple nanowire FET stacks according to a particular aspect of the disclosure. In FIG. 2, a plurality of nanowire FET stacks 204-208 are arranged on a substrate 202. The nanowire FET stacks 204-208 are separated electrically by isolation trenches. For example, a first isolation trench 210 separates a first nanowire FET stack 204 and a second nanowire FET stack 206. Similarly, a second isolation trench 212 separates the second nanowire FET stack 206 and a third nanowire FET stack 208. In the particular implementation illustrated in FIG. 2, three nanowire FET stacks 204, 206, 208 are shown. However, in other implementations, more than three nanowire FET stacks or fewer than three nanowire FET stacks may be formed on the substrate 202. Additionally, the representation illustrated in FIG. 2 is simplified relative the arrangement of layers in an actual integrated circuit. Greater detail regarding the arrangement of layers in an actual integrated circuit is illustrated in FIGS. 11-43.

FIG. 2 also illustrates circuit diagrams for each of the nanowire FET stacks 204-208. For example, a first schematic circuit diagram 214 corresponds to the first nanowire FET stack 204, a second schematic circuit diagram 216 corresponds to the second nanowire FET stack 206, and a third schematic circuit diagram 218 corresponds to the third nanowire FET stack 208.

Figure 3:
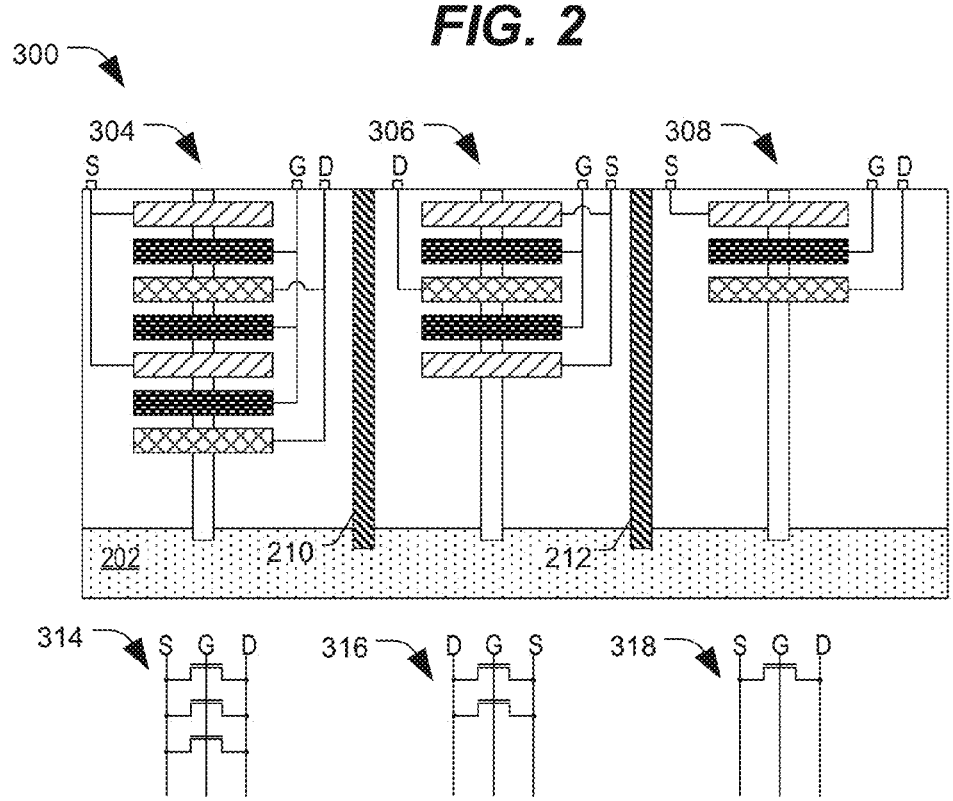
FIG. 3 is a diagram illustrating an integrated circuit including multiple nanowire FET stacks according to a particular aspect of the disclosure.

The methods of forming nanowire stacks illustrated herein enable forming different numbers of nanowire FETs in each nanowire FET stack. For example, FIG. 3 is a diagram illustrating an integrated circuit 300 including multiple nanowire FET stacks 304-308 according to a particular aspect of the disclosure. In FIG. 3, each of the nanowire FET stacks 304-308 includes a different number of nanowire FETs. For example, in FIG. 3, a first nanowire FET stack 304 is adjacent to a second nanowire FET stack 306, and a third nanowire FET stack 308 is adjacent to the second nanowire FET stack 306. The first nanowire FET stack 304, the second nanowire FET stack 306, and the third nanowire FET stack 308 are all formed on the substrate 202.

FIG. 3 also illustrates a circuit diagram representing each of the nanowire FET stacks 304-308. Thus, a first schematic circuit diagram 314 corresponds to the first nanowire FET stack 304, a second schematic circuit diagram 316 corresponds to the second nanowire FET stack 306, and a third schematic circuit diagram 318 corresponds to the third nanowire FET stack 308. As illustrated, the first nanowire FET stack 304 includes three nanowire FETs, the second nanowire FET stack 306 includes two nanowire FETs, and the third nanowire FET stack 308 includes one nanowire FET.

Although the nanowire FET stacks 304-308 are illustrated as each including a different number of transistors or nanowire FETs, in other implementations, multiple nanowire FET stacks may include the same number of nanowire FETs, and one or more other nanowire FET stacks may include a different number of nanowire FETs. Additionally, although the nanowire FET stacks 304-308 in FIG. 3 are illustrated as ranging from one nanowire FET to three nanowire FETs per stack, the nanowire FET stacks 304-308 may include different numbers of nanowire FETs. For example, the nanowire FET stacks 304-308 may include four or more nanowire FETs. The representation illustrated in FIG. 3 is simplified relative to the arrangement of layers in an actual integrated circuit. Greater detail regarding the arrangement of layers in an actual integrated circuit is illustrated in FIGS. 11-43.

FIGS. 4-10 illustrate various manufacturing stages during a process of forming an integrated circuit that includes one or more nanowire FET stacks. For example, the process may be used to form a single nanowire FET stack, such as one of the nanowire FET stacks 100, 120, 140 of FIGS. 1A, 1B and 1C, respectively. As another example, the process may be used to concurrently form multiple nanowire stacks. To illustrate, the process may be used to form the integrated circuit 200 of FIG. 2 or the integrated circuit 300 of FIG. 3. A simplified version of the process is illustrated in FIGS. 4-10. Particular aspects of the process are illustrated in greater detail in FIGS. 11-43.

Figure 4:
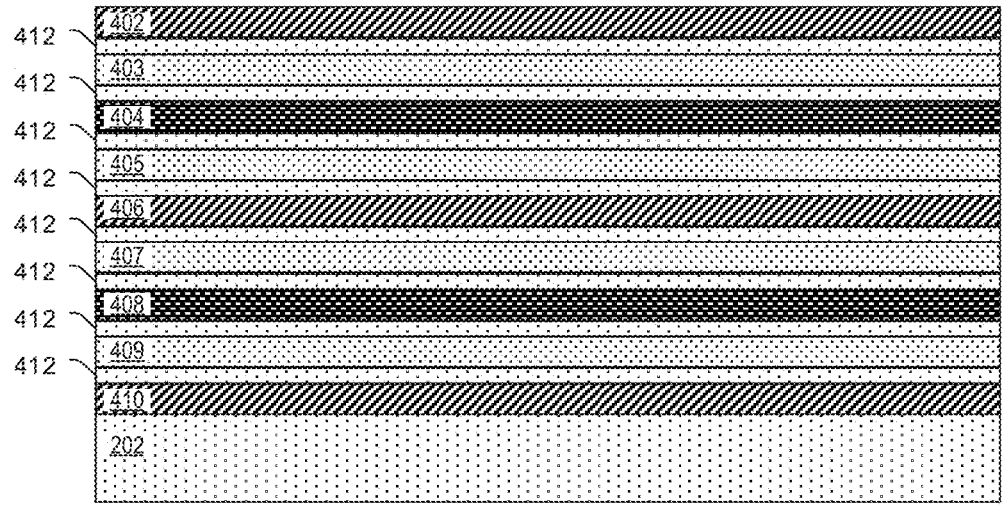
FIG. 4 is a diagram illustrating a first manufacturing stage of a process of manufacturing multiple nanowire FET stacks according to a particular aspect of the disclosure.

FIG. 4 is a diagram illustrating a first manufacturing stage of a process of manufacturing multiple nanowire FET stacks according to a particular aspect of the disclosure. The first manufacturing stage, as illustrated in FIG. 4, includes forming a plurality of dummy layers (e.g., a layer stack) on a substrate 202. The layer stack includes a plurality of source region dummy layers, such as source region dummy layers 402, 406, and 410; a plurality of gate region dummy layers, including gate region dummy layers 403, 405, 407, and 409; and a plurality of drain region dummy layers, such as drain region dummy layers 404 and 408. The dummy layers of the layer stack are separated from one another by isolation layers 412. According to a particular aspect, the stack of dummy layers illustrated in FIG. 4 corresponds to or is a simplified representation of the stack of dummy layers illustrated in FIG. 11 or FIG. 29.

The materials of the various dummy layers of the layer stack are selected such that processes are available to selectively etch one dummy layer at a time. For example, the substrate 202 may be formed of or include bulk silicon (Si), the isolation layers 412 may be formed of or include silicon nitride (SiN), the source region dummy layers may be formed of or include silicon dioxide (SiO2), the gate region dummy layers may be formed of or include silicon oxycarbide (SiOC), and the drain region dummy layers may be formed of or include aluminum nitride (AlN). The specific arrangement of layers illustrated in FIG. 4 may be changed in other implementations. For example, an isolation layer may be formed between the substrate 202 and the source region dummy layer 410. As another example, the layer stack may include more dummy layers or fewer dummy layers, depending on how many nanowire FETs will be formed in each nanowire FET stack. Also, in FIG. 4, the layer stack is illustrated as formed over an entirety of an illustrated portion of the substrate 202. However, in other implementations the layer stack (or portions of the layer stack, e.g., particular layers) may be formed only on targeted regions of the substrate 202 or on an entirety of a surface of the substrate 202. In still other implementations, an order of the dummy layers of the layer stack may be different than illustrated in FIG. 4. To illustrate, in FIG. 4, the top dummy layer is a first source region dummy layer 402; however, in other implementations, the top dummy layer may be a drain region dummy layer.

Figure 5:
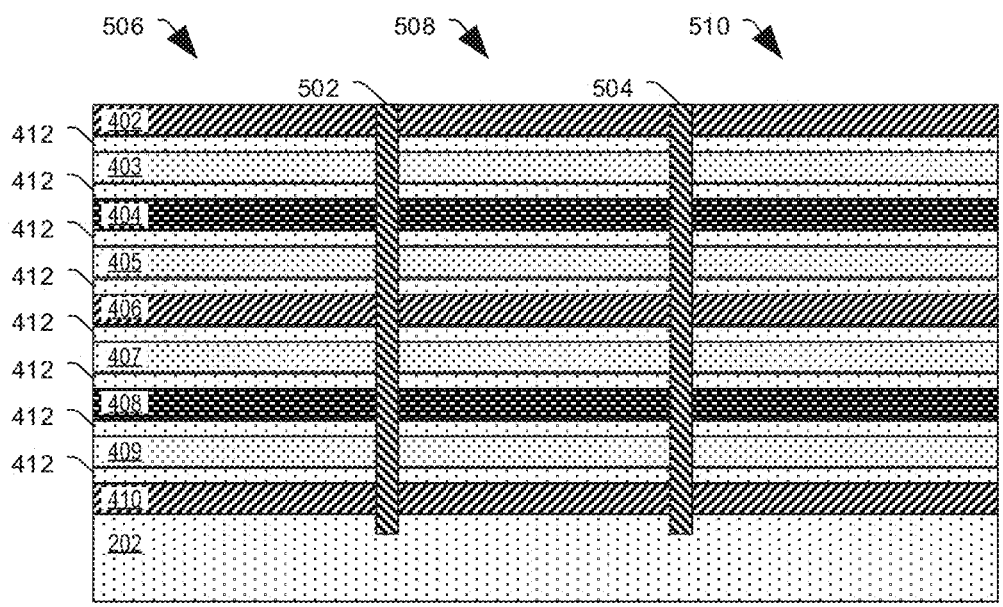
FIG. 5 is a diagram illustrating a second manufacturing stage of a process of manufacturing multiple nanowire FET stacks according to a particular aspect of the disclosure.

FIG. 5 is a diagram illustrating a second manufacturing stage of a process of manufacturing multiple nanowire FET stacks according to a particular aspect of the disclosure. The second manufacturing stage illustrated in FIG. 5 may be subsequent to the first manufacturing stage of FIG. 4.

In the second manufacturing stage of FIG. 5, isolation trenches may be formed to separate nanowire FET stack areas. For example, a first isolation trench 502 and a second isolation trench 504 may be formed. A first nanowire FET region 506 is separated from a second nanowire FET region 508 by the first isolation trench 502. Additionally, a third nanowire FET region 510 is separated from the second nanowire FET region 508 by the second isolation trench 504.

In a particular aspect, the isolation trenches 502 and 504 are formed by using a series of selective etch steps to etch through each of the dummy layer and into the substrate 202. For example, a pattern resist layer or hardmask may be formed over the first source region dummy layer 402 and used to selectively etch the dummy layers to form openings corresponding to the isolation trenches 502 and 504. After the openings are formed, one or more materials may be deposited to form the isolation trenches 502, 504. For example, silicon oxycarbide (SiOC) may be deposited in the openings. After depositing the one or more materials to form the isolation trenches 502, 504, excess material may be removed using a planarization process, such as chemical mechanical polish (CMP). Formation of the isolation trenches according to a particular aspect is illustrated in greater detail in FIG. 11.

Figure 6:
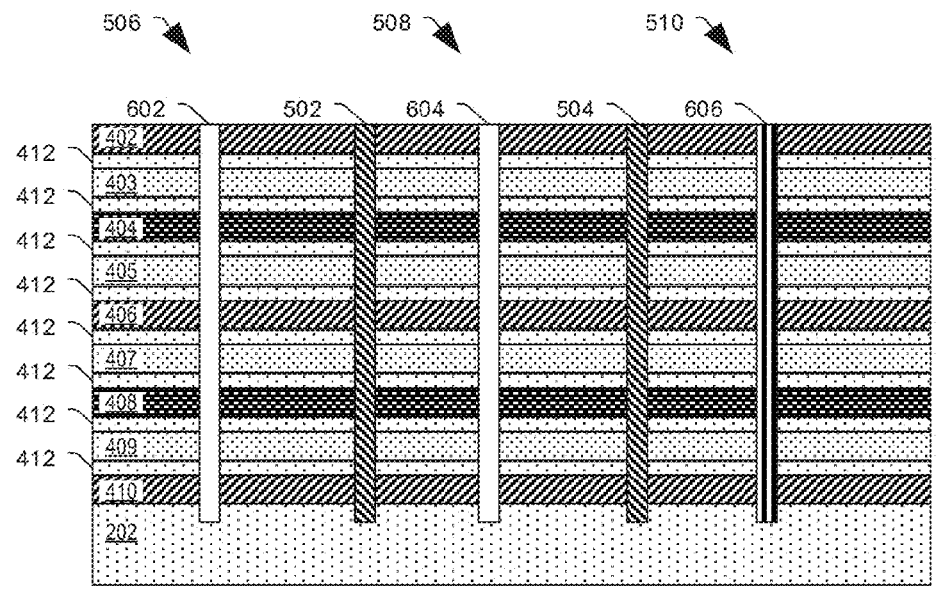
FIG. 6 is a diagram illustrating a third manufacturing stage of a process of manufacturing multiple nanowire FET stacks according to a particular aspect of the disclosure.

FIG. 6 is a diagram illustrating a third manufacturing stage of a process of manufacturing multiple nanowire FET stacks according to a particular aspect of the disclosure. The third manufacturing stage illustrated in FIG. 6 may be subsequent to the second manufacturing stage of FIG. 5.

In the third manufacturing stage of FIG. 6, nanowires may be formed within each of the nanowire FET regions 506-510. For example in FIG. 6, a first nanowire 602 is formed in the first nanowire FET region 506, a second nanowire 604 is formed in the second nanowire FET region 508, and a third nanowire 606 is formed in the third nanowire FET region 510.

In the particular implementation illustrated in FIG. 6, the first nanowire 602 and second nanowire 604 are of a first type, and the third nanowire 606 is of a second type. For example, the first nanowire 602 and the second nanowire 604 may be N-type (e.g., may include an N-type dopant), and the third nanowire 606 may be P-type (e.g., may include a P-type dopant). Although FIG. 6 shows one nanowire formed in each nanowire FET region, in other implementations, more than one nanowire may be formed in each nanowire FET region. For example, as described with reference to FIG. 1C, two or more nanowires may be formed in one or more of the nanowire FET regions 506-510. Additionally, although FIG. 6 illustrates forming multiple N-type nanowires 602 and 604 and one P-type nanowire 606, in other implementations, multiple P-type nanowires may be formed or all of one type of nanowire may be formed depending on the design of a particular integrated circuit.

To form each of the nanowires 602-606, a series of selective etches may be performed to provide an opening in the layer stack for the nanowire material. After forming openings for the nanowires are formed, a set of one or more materials may be deposited (or epitaxially grown) in the openings to form the nanowires. When different types of nanowires are formed, as illustrated in FIG. 6, a first set of nanowires may be formed, such as the nanowires 602 and 604 using a pattern resist layer or hardmask. Subsequently, the first set of nanowires may be protected while a second set of nanowires is formed, such as the nanowire 606, using another patterned resist layer or hard mask. Formation of the nanowires according to a particular aspect is illustrated in greater detail in FIG. 12.

Figure 7:
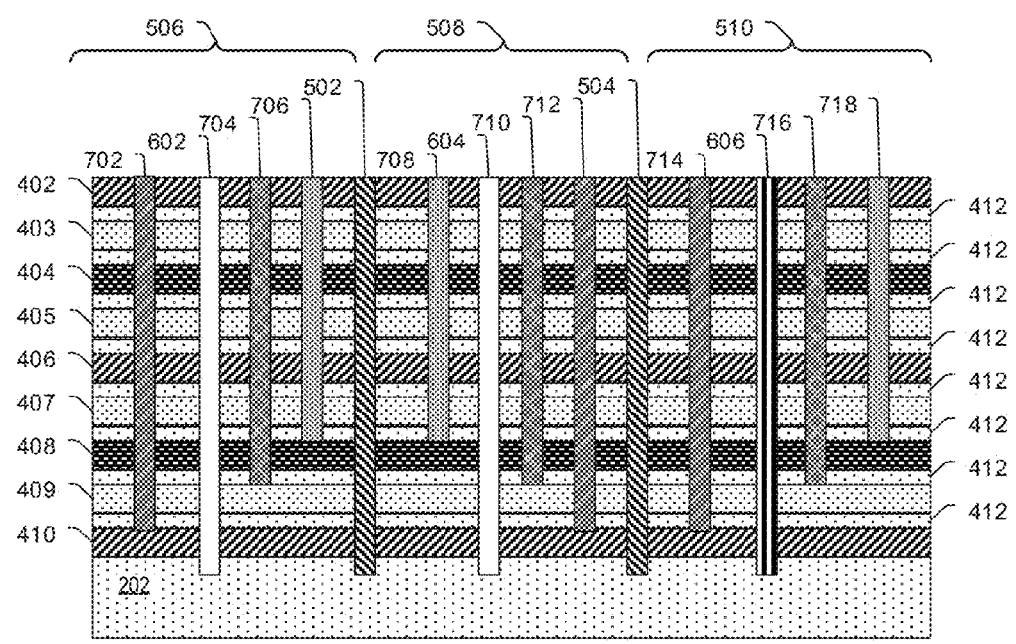
FIG. 7 is a diagram illustrating a fourth manufacturing stage of a process of manufacturing multiple nanowire FET stacks according to a particular aspect of the disclosure.

FIG. 7 is a diagram illustrating a fourth manufacturing stage of a process of manufacturing multiple nanowire FET stacks according to a particular aspect of the disclosure. The fourth manufacturing stage illustrated in FIG. 7 may be subsequent to the third manufacturing stage of FIG. 6.

In the fourth manufacturing stage of FIG. 7, access ways may be formed in the layer stack. For example, the access ways may include source access ways 702, 712, and 714; gate access ways 704, 710, and 716; and drain access ways 706, 708, and 718. The access ways 702-718 may be formed using a series of selective etches. For example, a first patterned resist layer or hardmask may be formed to guide a set of selective etch processes to form openings in the layer stack corresponding to the source access ways 702, 712, and 714. Subsequently, one or more first fill materials may be deposited to fill the openings, forming the source access ways 702, 712, and 714 as illustrated in FIG. 7. After the source access ways 702, 712, 714 are formed, a second patterned resist layer or hardmask may be formed to guide another set of selective etch processes to form openings in the layer stack corresponding to the gate access ways 704, 710, and 716. Subsequently, one or more second fill materials may be deposited to fill the openings, forming the gate access ways 704, 710, and 716 as illustrated in FIG. 7. After the gate access ways 704, 710, and 716 are formed, a third patterned resist layer or hardmask may be formed to guide another set of selective etch processes to form openings in the layer stack corresponding to the drain access ways 706, 708, and 718. Subsequently, one or more third fill materials may be deposited to fill the openings, forming the drain access ways 706, 708, and 718 as illustrated in FIG. 7. In other implementations, the source access ways, gate access ways, and drain access ways may be formed in a different order.

The materials used to fill the access ways (e.g., the first fill materials, the second fill materials, and the third fill materials) may be selected to have high etch selectivity relative to one another, relative to the dummy layers, or both. For example, the access ways may be filled with SiN, SiON, SiOCN, or SiC to provide sufficient etch selectivity relative to the dummy layers.

When an integrated circuit includes nanowire FETs with an N-type nanowire (N-type nanowire FETs) and nanowire FETs with a P-type nanowire (P-type nanowire FETs), different gate access ways may be formed for the different nanowire FET types. For example, a first type of gate access way may be formed for the N-type nanowire FETs and a second (different) type of gate access way may be formed for the P-type nanowire FETs. To illustrate, in FIG. 7, the nanowires 602 and 604 are N-type. Thus, the gate access ways 704 and 710 may be formed concurrently and each filled with the same fill material. However, the nanowire 606 is P-type. Accordingly, the gate access way 716 may be formed separately from the gate access ways 704 and 710 (e.g., using a different patterned photoresist layer or hardmask) and may be filled with a different fill material that has high etch selectivity relative to the fill material of the gate access ways 704 and 710.

Formation of the access ways according to a particular aspect is illustrated in greater detail in FIGS. 15-17 and 30-38. Each access way extends to or into a dummy layer of a type corresponding to the type of the access way. For example, in FIG. 7, the source access ways 702, 712, and 714 extend to or into the source region dummy layer 410; the gate access ways 704, 710, and 716 extend to or into the gate region dummy layer 409; and the drain access ways 706, 708, and 718 extend to or into the drain region dummy layer 408.

In FIGS. 4-10, the process is illustrated as forming four nanowire FETs per nanowire FET stack; however, as previously explained, the process can be used to form different numbers of nanowire FETs in different nanowire FET stacks. If a particular nanowire FET stack of the integrated circuit of FIG. 7 were to be formed with fewer nanowire FETs than another nanowire FET stack of the integrated circuit, the access ways of the two nanowire FET stacks would be formed to access different dummy layers. To illustrate, assume a nanowire FET stack including three nanowire FETs is to be formed in the first nanowire FET region 506 and a nanowire FET stack including four nanowire FETs is to be formed in the second nanowire FET region 508. In this illustrative example, the source access way 712, the gate access way 710 and the drain access way 708 would be formed as illustrated in FIG. 7. However, the source access way 702 would extend to or into the source region dummy layer 406, rather than to or into the source region dummy layer 410. Likewise, the gate access way 704 would extend to or into the gate region dummy layer 407 rather than to or into the gate region dummy layer 409. The drain access way 706 would be formed as illustrated in FIG. 7. The process illustrated in FIGS. 29-43 illustrates formation of nanowire FET stacks with different numbers of nanowire FETS.

Figure 8:
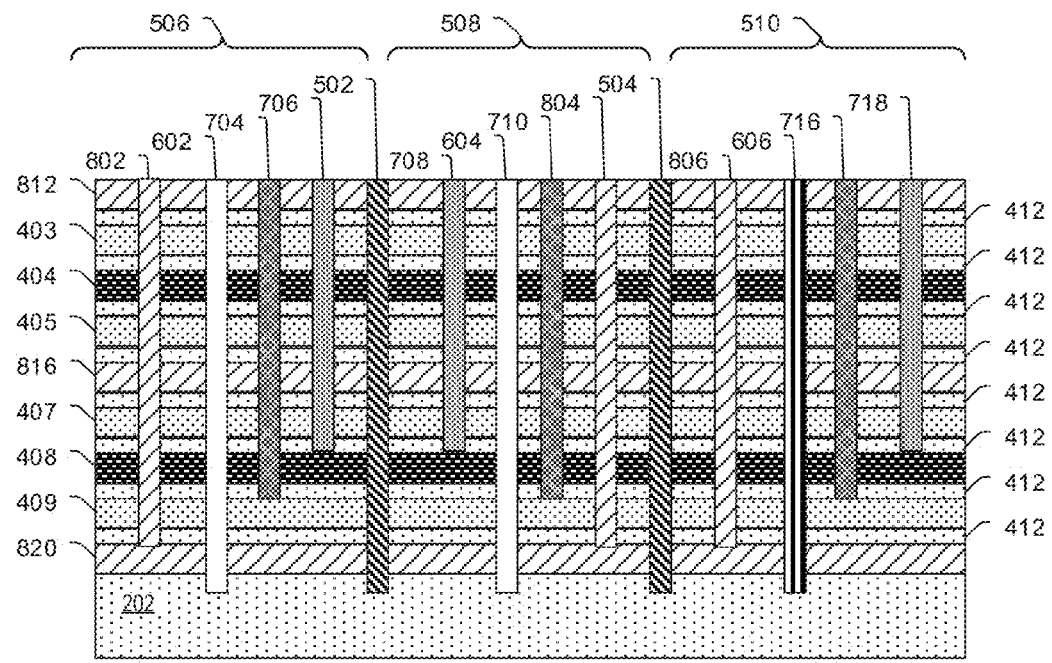
FIG. 8 is a diagram illustrating a fifth manufacturing stage of a process of manufacturing multiple nanowire FET stacks according to a particular aspect of the disclosure.

FIG. 8 is a diagram illustrating a fifth manufacturing stage of a process of manufacturing multiple nanowire FET stacks according to a particular aspect of the disclosure. The fifth manufacturing stage illustrated in FIG. 8 may be subsequent to the fourth manufacturing stage of FIG. 7.

In the fifth manufacturing stage of FIG. 8, source regions and source lines may be formed. For example, the source access ways 702, 712, and 714 may be opened using an etch process. After the source access ways 702, 712, and 714 are opened, the source region dummy layers 402, 406, and 410 exposed by opening the source access ways 702, 712, 714 may be etched. For example, a lateral (e.g., non-directional) etch process using chemistry that has high etch selectivity for material of the source region dummy layers 402, 406, and 410 relative to materials of the gate region dummy layers 403, 405, 407, and 409, the drain region dummy layers 404 and 408, the nanowires 602, 604 and 606, the isolation trenches 502 and 504, and the isolation layers 412 may be used to selectively etch the source region dummy layers 402, 406, and 410. Etching the source region dummy layers 402, 406, and 410 may expose portions of the nanowires 602, 604, 606 corresponding to the source regions. Additionally, surfaces of isolation layers 412 adjacent to the source regions may be exposed.

After etching the source region dummy layers 402, 406, and 410, source regions and source lines may be formed by depositing one or more materials. For example, an atomic layer deposition (ALD) process may be used to selectively form a monolayer on exposed surfaces as an isolation layer so that subsequently deposited metal layers (e.g., a Ti layer) are not shorted to other metal layers. In a particular implementation, the ALD process may deposit SiO, SiN, SiON, SiOCN, or another isolation material. Additionally or in the alternative, titanium (Ti) may be deposited for form a layer on the exposed surfaces, and tungsten (W) may be deposited to fill the remaining space. The Ti and W deposition processes fill the regions previously occupied by the source region dummy layers 402, 406, and 410 and the source access ways 702, 712, and 714, thereby forming source regions 812, 816, 820 and source lines 802, 804, and 806. Formation of the source regions and source lines according to a particular aspect is illustrated in greater detail in FIGS. 18 and 39.

Figure 9:
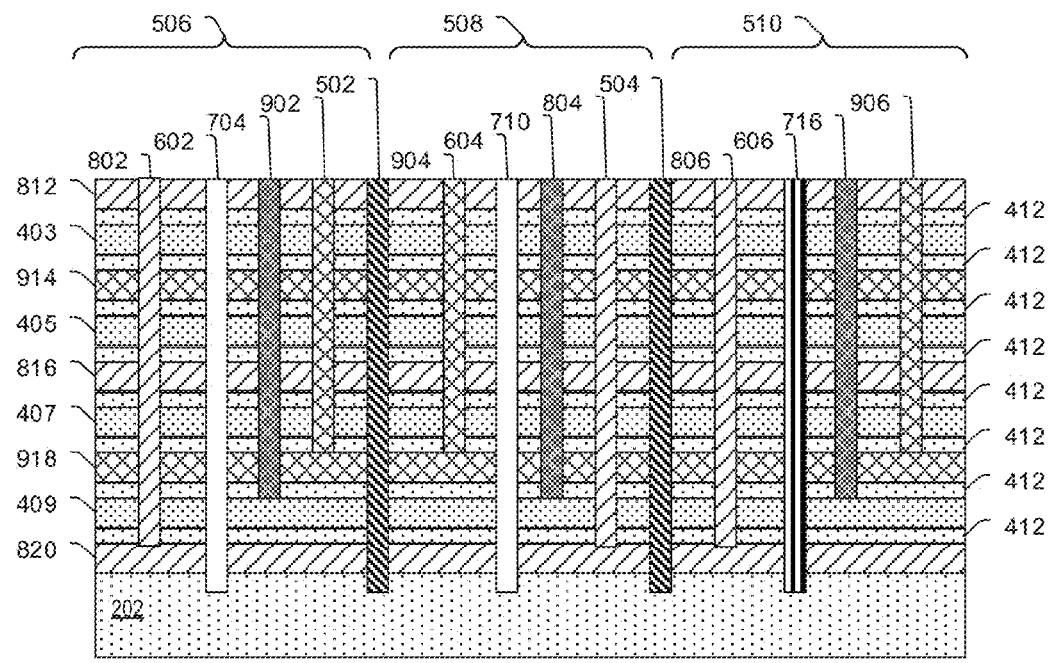
FIG. 9 is a diagram illustrating a sixth manufacturing stage of a process of manufacturing multiple nanowire FET stacks according to a particular aspect of the disclosure.

FIG. 9 is a diagram illustrating a sixth manufacturing stage of a process of manufacturing multiple nanowire FET stacks according to a particular aspect of the disclosure. The sixth manufacturing stage illustrated in FIG. 9 may be subsequent to the fifth manufacturing stage of FIG. 8.

In the sixth manufacturing stage of FIG. 9, drain regions and drain lines may be formed. For example, the drain access ways 706, 708, and 718 may be opened using an etch process. After the drain access ways 706, 708, and 718 are opened, drain region dummy layers 404 and 408 exposed by opening the drain access ways 706, 708, 718 may be etched. For example, a lateral (e.g., non-directional) etch process using chemistry that has high etch selectivity for material of the drain region dummy layers 404 and 408 relative to materials of the gate region dummy layers 403, 405, 407, and 409, the source regions 812, 816, 820, the nanowires 602, 604, 606, the isolation trenches 502 and 504, and the isolation layers 412 may be used to selectively etch the drain region dummy layers 404 and 408. Etching the drain region dummy layers may expose portions of the nanowires 602, 604, 606 corresponding to the drain regions. Additionally, surfaces of isolation layers 412 adjacent to the drain regions may be exposed.

After etching the drain region dummy layers 404 and 408, drain regions and drain lines may be formed by depositing one or more materials. For example, an atomic layer deposition (ALD) process may be used to selectively form a monolayer on exposed surfaces as an isolation layer so that subsequently deposited metal layers (e.g., a Ti layer) are not shorted to other metal layers. In a particular implementation, the ALD process may deposit SiO, SiN, SiON, SiOCN, or another isolation material. Additionally or in the alternative, Ti may be deposited for form a layer on the exposed surfaces, and W may be deposited to fill the remaining space. The Ti and W deposition processes fill the regions previously occupied by the drain region dummy layers 404 and 408 and the drain access ways 706, 708, 718, thereby forming drain regions 914 and 918 and drain lines 902, 904, and 906. Formation of the drain regions and drains lines according to a particular aspect is illustrated in greater detail in FIGS. 19 and 40.

Figure 10:
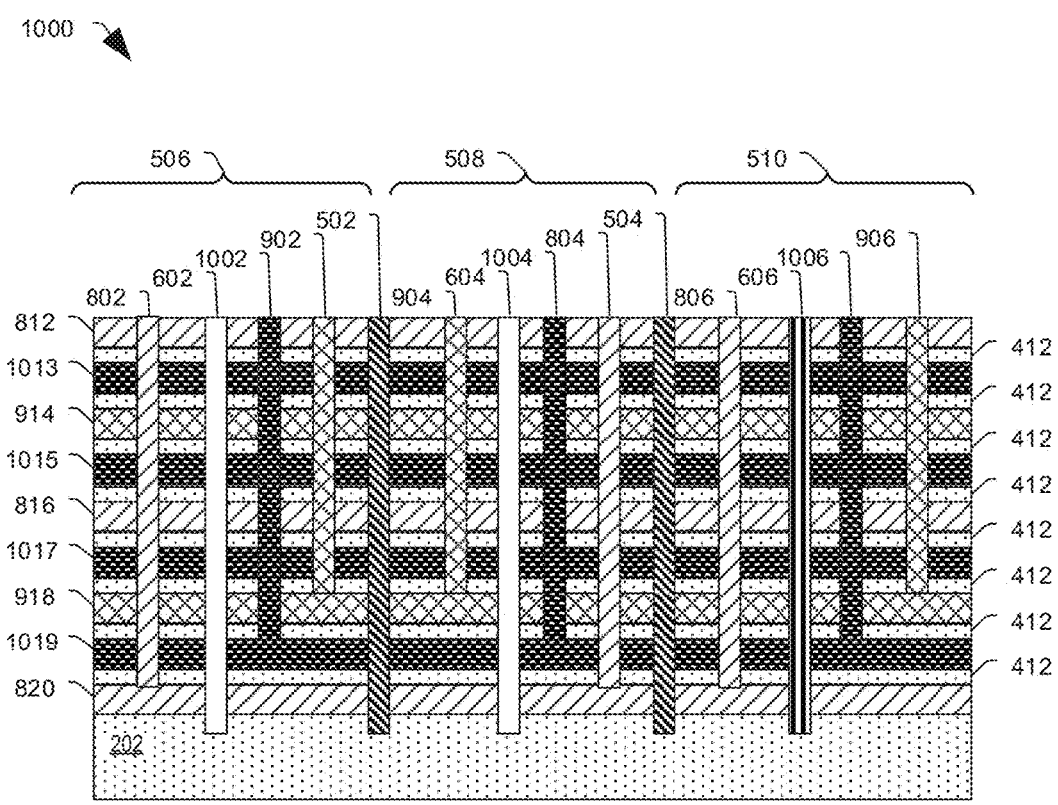
FIG. 10 is a diagram illustrating a seventh manufacturing stage of a process of manufacturing multiple nanowire FET stacks according to a particular aspect of the disclosure.

FIG. 10 is a diagram illustrating a seventh manufacturing stage of a process of manufacturing multiple nanowire FET stacks according to a particular aspect of the disclosure. The seventh manufacturing stage illustrated in FIG. 10 may be subsequent to the sixth manufacturing stage of FIG. 9.

In the seventh manufacturing stage of FIG. 10, gate regions and gate lines may be formed. For example, the gate access ways 704, 710, 716 may be opened using an etch process. After the gate access ways 704, 710, 716 are opened, gate region dummy layers 403, 405, 407, and 409 exposed by opening the gate access ways 704, 710, 716 may be etched. For example, a lateral (e.g., non-directional) etch process using chemistry that has high etch selectivity for material of the gate region dummy layers 403, 405, 407, and 409 relative to materials of the source regions 812, 816, 820, the drain regions 914 and 918, the nanowires 602, 604, 606, the isolation trenches 502 and 504, and the isolation layers 412 may be used to selectively etch the gate region dummy layers 403, 405, 407, and 409. Etching the gate region dummy layers 403, 405, 407, and 409 may expose portions of the nanowires 602, 604, 606 corresponding to the gate regions. Additionally, surfaces of isolation layers 412 adjacent to the gate regions may be exposed.

After etching the gate region dummy layers 403, 405, 407, and 409, gate regions and gate lines may be formed by depositing one or more materials. Different materials may be used to form gate regions for nanowire FETs with an N-type nanowire as compared to materials used to form gate regions for nanowire FETs with a P-type nanowire. Accordingly, while not specifically illustrated in FIG. 10, some gate access ways may be protected (e.g., using a hardmask) while others are opened. For example, the gate access ways 704 and 710 may be opened while the gate access way 716 is protected with a hardmask. This enables etching gate region dummy layers in the first nanowire FET region 506 and second nanowire FET region 508, without etching the gate region dummy layers in the third nanowire FET region 510. Formation of gate regions and gate lines for nanowire FETs with N-type nanowires may include depositing a first set of one or more materials after etching the gate region dummy layers in areas associated with those nanowire FETs. Formation of gate regions and gate lines for nanowire FETs with P-type nanowires may include depositing a second set of one or more materials after etching the gate region dummy layers in areas associated with those nanowire FETs. The first set of one or more materials may be different from the second set of one or more materials.

For example, for nanowire FETs with N-type nanowires (such as the nanowires 602 and 604), after opening the gate access ways 704 and 710 and etching the gate region dummy layers in the first nanowire FET region 506 and second nanowire FET region 508, an atomic layer deposition (ALD) process may be used to selectively form a monolayer on exposed surfaces as an isolation layer so that subsequently deposited metal layers (e.g., a Ti layer) are not shorted to other metal layers. In a particular implementation, the ALD process may deposit SiO, SiN, SiON, SiOCN, or another isolation material. Additionally or in the alternative, interface layers may be formed on exposed nanowire surfaces. To illustrate, the interface layers may include an oxide (e.g., SiO) formed using a thermal oxidation process, an ALD oxidation process, or a chemical oxidation process.

After the interface layers are formed, hafnium oxide (HfO2) may be deposited to form a layer on the exposed surfaces. A layer of TiAl may be deposited over the HfO2 layer, a layer of TiN may be deposited over the TiAl layer, and W may be deposited to fill the remaining space. The deposition processes may fill the regions previously occupied by the gate region dummy layers 403, 405, 407, and 409 in the first nanowire FET region 506 and second nanowire FET region 508 and may fill the regions previously occupied by the gate access ways 704 and 710, thereby forming parts of gate regions 1013, 1015, 1017, and 1019, and gate lines 1002 and 1004.

As another example, for nanowire FETs with P-type nanowires (such as the nanowires 606), after opening the gate access way 716 and etching the gate region dummy layers 403, 405, 407, and 409 in the third nanowire FET region 510, an atomic layer deposition (ALD) process may be used to selectively form a monolayer on exposed surfaces as an isolation layer so that subsequently deposited metal layers (e.g., a Ti layer) are not shorted to other metal layers. In a particular implementation, the ALD process may deposit SiO, SiN, SiON, SiOCN, or another isolation material. Additionally or in the alternative, interface layers may be formed on exposed nanowire surfaces. To illustrate, the interface layers may include an oxide (e.g., SiO) formed using a thermal oxidation process, an ALD oxidation process, or a chemical oxidation process.

After the interface layers are formed, HfO2 may be deposited to form a layer on the exposed surfaces. A layer of TiN may be deposited over the HfO2 layer, and W may be deposited to fill the remaining space. The deposition processes may fill the regions previously occupied by the gate access way 716 and the gate region dummy layers 403, 405, 407, and 409 in the third nanowire FET regions 510, thereby forming gate line 1006 and parts of gate regions 1013, 1015, 1017, and 1019.

Formation of the gate regions and gate lines according to a particular aspect is illustrated in greater detail in FIGS. 20, 21, 41 and 42. After formation of the gate regions and gate lines, the integrated circuit 1000, as illustrated in FIG. 10, corresponds to the integrated circuit 200 of FIG. 2, with more detail illustrated in FIG. 10 than in FIG. 2. Accordingly, the alternative implementations described with reference to FIGS. 2 and 3 also apply to the manufacturing process described with reference to FIGS. 4-10.

FIGS. 11-22 illustrate various manufacturing stages during another process of forming an integrated circuit that includes one or more nanowire FET stacks. For example, the process may be used to form a single nanowire FET stack, such as one of the nanowire FET stacks 100, 120, 140 of FIGS. 1A, 1B and 1C, respectively. As another example, the process may be used to concurrently form multiple nanowire FET stacks. To illustrate, the process may be used to form the integrated circuit 200 of FIG. 2 or the integrated circuit 300 of FIG. 3. A simplified version of the process is illustrated in FIGS. 4-10.

Figure 11:
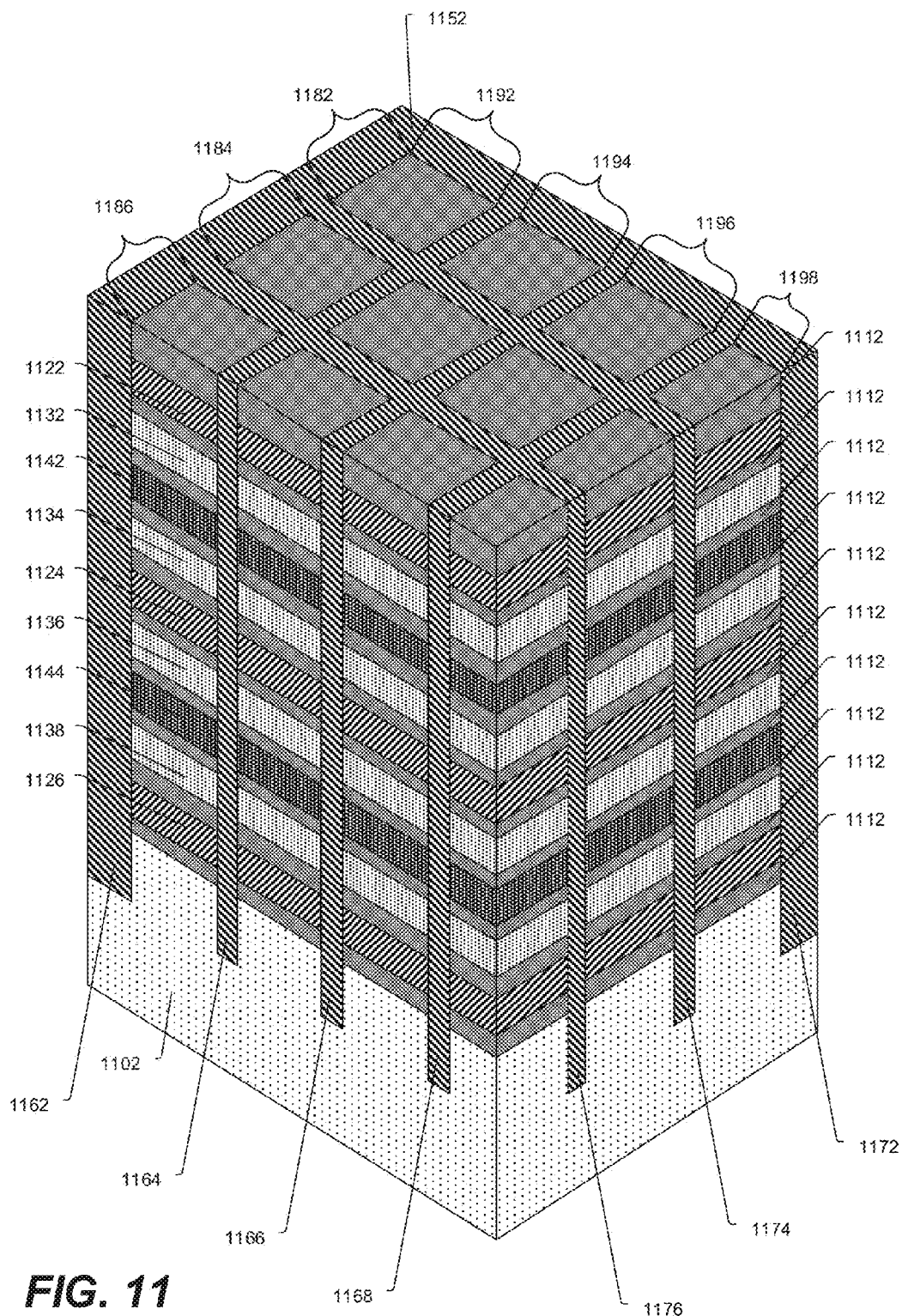
FIG. 11 is a diagram illustrating a first manufacturing stage of another process of manufacturing multiple nanowire FET stacks according to another particular aspect of the disclosure.

FIG. 11 is a diagram illustrating a first manufacturing stage of another process of manufacturing multiple nanowire FET stacks according to another particular aspect of the disclosure. Prior to the first manufacturing stage, as illustrated in FIG. 11, a plurality of dummy layers (e.g., a layer stack) are formed on a substrate 1102. The layer stack includes a plurality of source region dummy layers, such as source region dummy layers 1122, 1124, and 1126; a plurality of gate region dummy layers, including gate region dummy layers 1132, 1134, 1136, and 1138; and a plurality of drain region dummy layers, such as drain region dummy layers 1142 and 1144. The dummy layers of the layer stack are separated from one another by isolation layers 1112. The layer stack may correspond to the layer stack of FIG. 4 and the substrate 1102 may correspond to the substrate 202 of FIG. 4.

In the first manufacturing stage of FIG. 11, isolation trenches 1152 may be formed to separate nanowire FET stack areas. The isolation trenches 1152 may include or correspond to the isolation trenches 502 and 504 of FIG. 5. The isolation trenches may include isolation trench columns 1162, 1164, 1166, and 1168, and isolation trench rows 1172, 1174, and 1176. A first row of nanowire FET stacks 1182 is separated from a second row of nanowire FET stacks 1184 by the isolation trench row 1174. Additionally, a third row of nanowire FET stacks 1186 is separated from the second row of nanowire FET stacks 1184 by the isolation trench row 1176. A first column of nanowire FET stacks 1192 is separated from a second column of nanowire FET stacks 1194 by the isolation trench column 1164. Additionally, the isolation trench column 1166 may separate a third column of nanowire FET stacks 1196 from the second column of nanowire FET stacks 1194 and the isolation trench column 1168 may separate a fourth column of nanowire FET stacks 1198 from the third column of nanowire FET stacks 1196. A nanowire FET stack area may be defined by isolation trench columns and isolation trench rows. For example, a particular nanowire FET stack area (e.g., a nanowire FET stack) may be defined by the isolation trench columns 1164 and 1166 and the isolation trench rows 1174 and 1176. The plurality of nanowire FET stacks may be arranged in a grid.

In a particular aspect, the isolation trenches 1152 are formed by using a series of selective etch steps to etch through each of the dummy layers and into the substrate 1102. For example, a pattern resist layer or hardmask may be formed over the first source region dummy layer 1122 (or over a particular isolation layer of the isolation layers 1112 on or above the first source region dummy layer 1122) and used to selectively etch the dummy layers to form openings corresponding to the isolation trenches 1152. After the openings are formed, one or more materials may be deposited to form the isolation trenches 1152. For example, SiOC may be deposited in the openings. After depositing the one or more materials to form the isolation trenches 1152, excess material may be removed using a planarization process, such as CMP.

Figure 12:
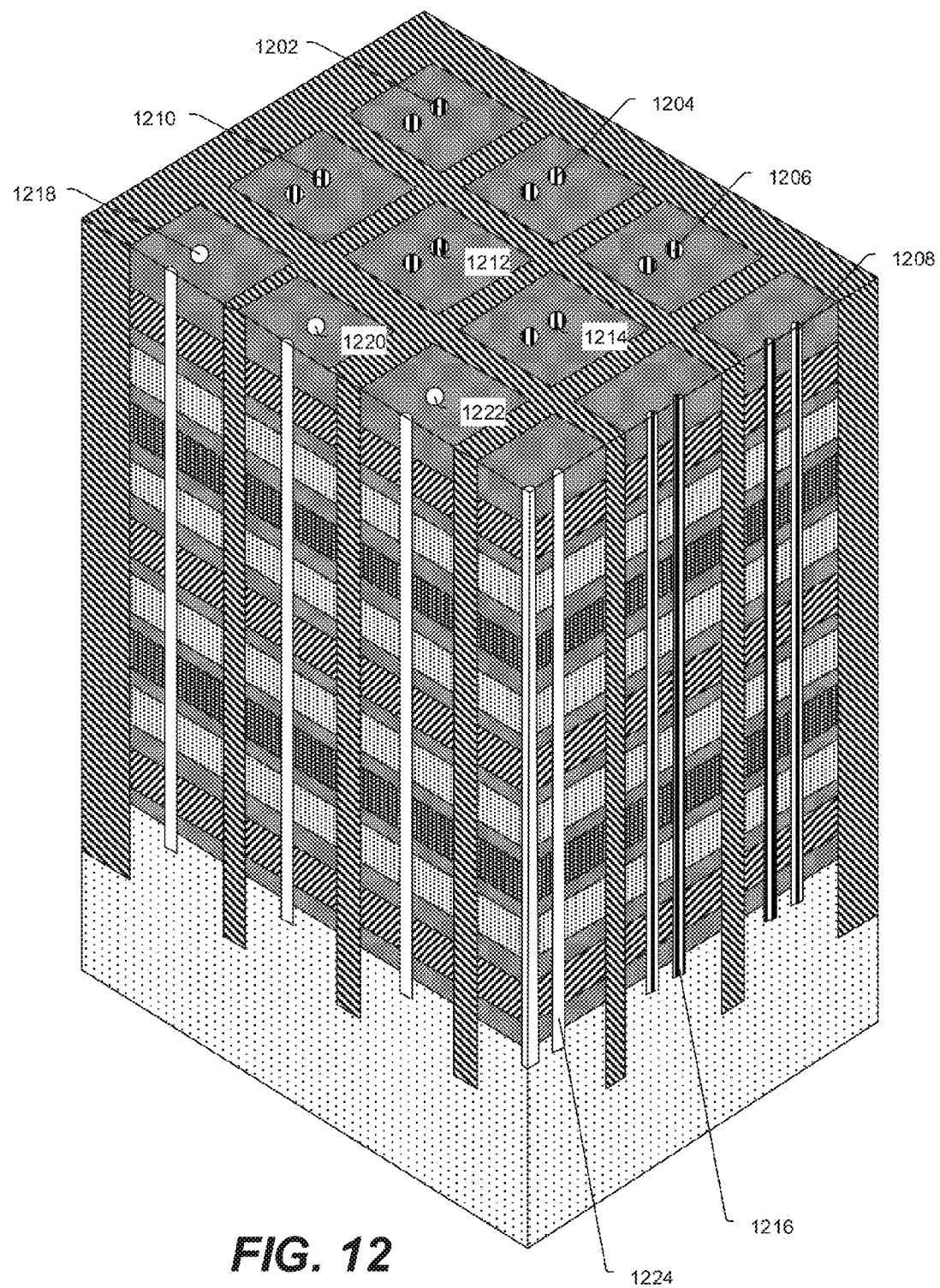
FIG. 12 is a diagram illustrating a second manufacturing stage of another process of manufacturing multiple nanowire FET stacks according to another particular aspect of the disclosure.

FIG. 12 is a diagram illustrating a second manufacturing stage of another process of manufacturing multiple nanowire FET stacks according to another particular aspect of the disclosure. The second manufacturing stage illustrated in FIG. 12 may be subsequent to the first manufacturing stage of FIG. 11.

In the second manufacturing stage of FIG. 12, pairs of nanowires 1202-1224 may be formed within each of the nanowire FET stack. For example in FIG. 12, a first pair of nanowires 1202 is formed in a first nanowire FET stack, a second pair of nanowires 1204 is formed in a second nanowire FET stack, a third pair nanowires 1206 is formed in a third nanowire FET stack, and a fourth pair of nanowires 1208 is formed in a fourth nanowire FET stack. Pairs of nanowires 1210-1224 may be similarly formed in other nanowire FET stacks.

In the particular implementation illustrated in FIG. 12, the pairs of nanowires 1202-1216 are of a first type, and the pairs of nanowires 1218-1224 are of a second type. For example, the pairs of nanowires 1202-1216 may be P-type (e.g., may include a P-type dopant), and the pairs of nanowires 1218-1224 may be N-type (e.g., may include an N-type dopant). In some implementations, P-type nanowires may be formed from a first material and N-type nanowires may be formed from a second material. Although FIG. 12 shows pairs of nanowires formed in each nanowire FET stack, in other implementations, more than two nanowires may be formed in each nanowire FET stack. Additionally, although FIG. 12 illustrates a specific arrangement of P-type and N-type nanowires, in other implementations, the arrangement of nanowires may differ, such as all of one type of nanowire may be formed or a different distribution of types of nanowires may be formed depending on the design of a particular integrated circuit.

To form each of the pairs of nanowires 1202-1224, a series of selective etches may be performed to provide openings in the layer stack for deposition of nanowire material. After the openings are formed, a set of one or more materials may be deposited (or epitaxially grown) in the openings to form the nanowires. When different types of nanowires are formed, as illustrated in FIG. 12, a first set of nanowires (e.g., the pairs of nanowires 1202-1216) may be formed using a pattern resist layer or hardmask. Subsequently, the first set of nanowires may be protected while a second set of nanowires (e.g., the pairs of nanowires 1218-1224) is formed using another patterned resist layer or hard mask.

Figure 13:
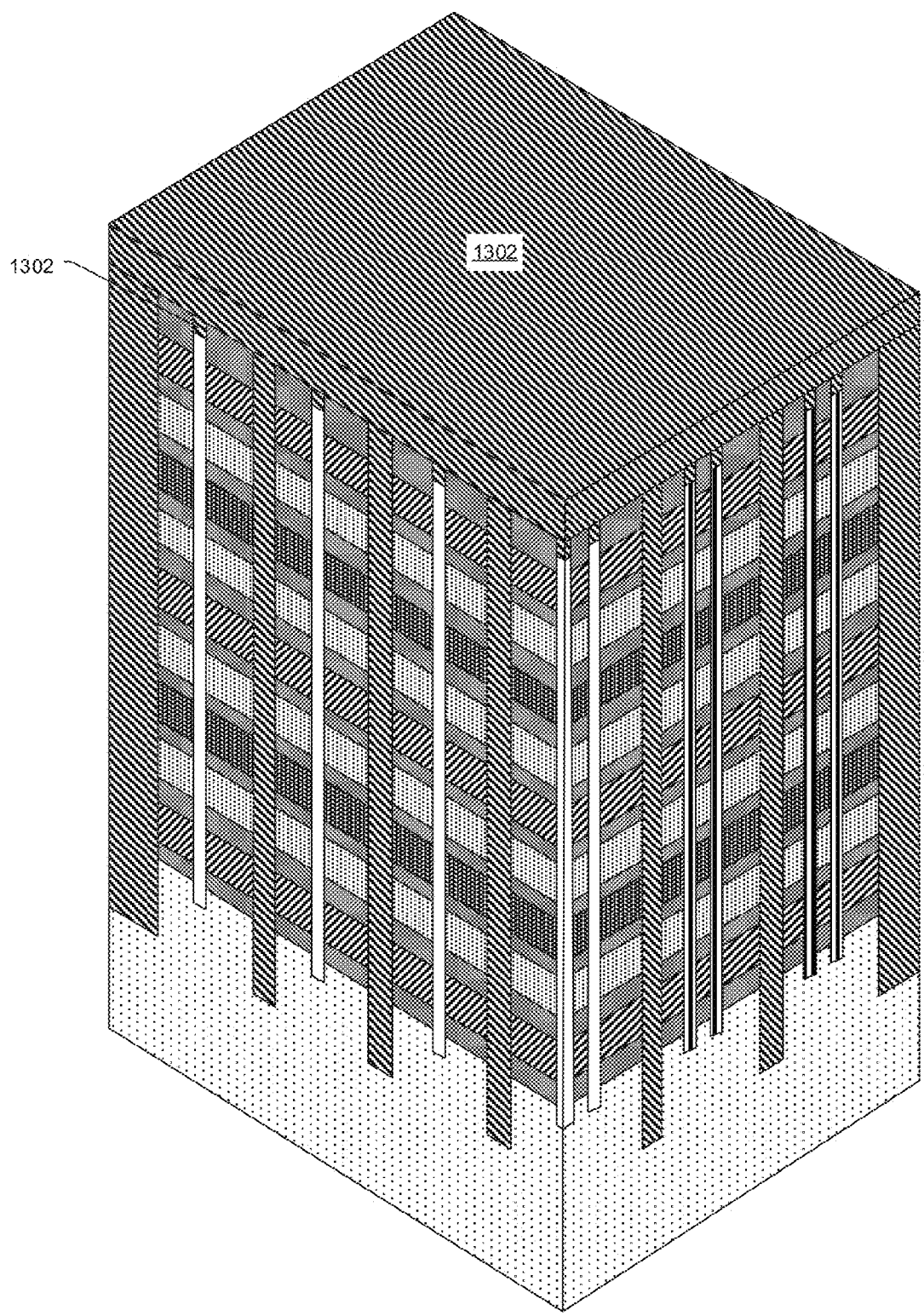
FIG. 13 is a diagram illustrating a third manufacturing stage of another process of manufacturing multiple nanowire FET stacks according to another particular aspect of the disclosure.

FIG. 13 is a diagram illustrating a third manufacturing stage of another process of manufacturing multiple nanowire FET stacks according to another particular aspect of the disclosure. The third manufacturing stage illustrated in FIG. 13 may be subsequent to the second manufacturing stage of FIG. 12.

In the third manufacturing stage of FIG. 13, the pairs of nanowires 1202-1224 may be recessed by etching and an isolation layer 1302 may be deposited after the nanowires are etched. For example in FIG. 13, the pairs of nanowires 1202-1224 may be etched using a chemical etching process to remove a portion of the pairs of nanowires 1202-1224 (e.g., the pairs of nanowires 1202-1224 may be recessed into one of the isolation layers 1112). One or more materials may be deposited on top of the exposed portions of the nanowires to fill in recesses left by the etching process and to form the isolation layer 1302. Additionally, the one or more materials may be deposited on top of the isolation layers 1112, the isolation trenches 1152, or a combination thereof, to form the isolation layer 1302. As a particular, non-limiting example, SiOC may be deposited to form the isolation layer 1302.

Figure 14:
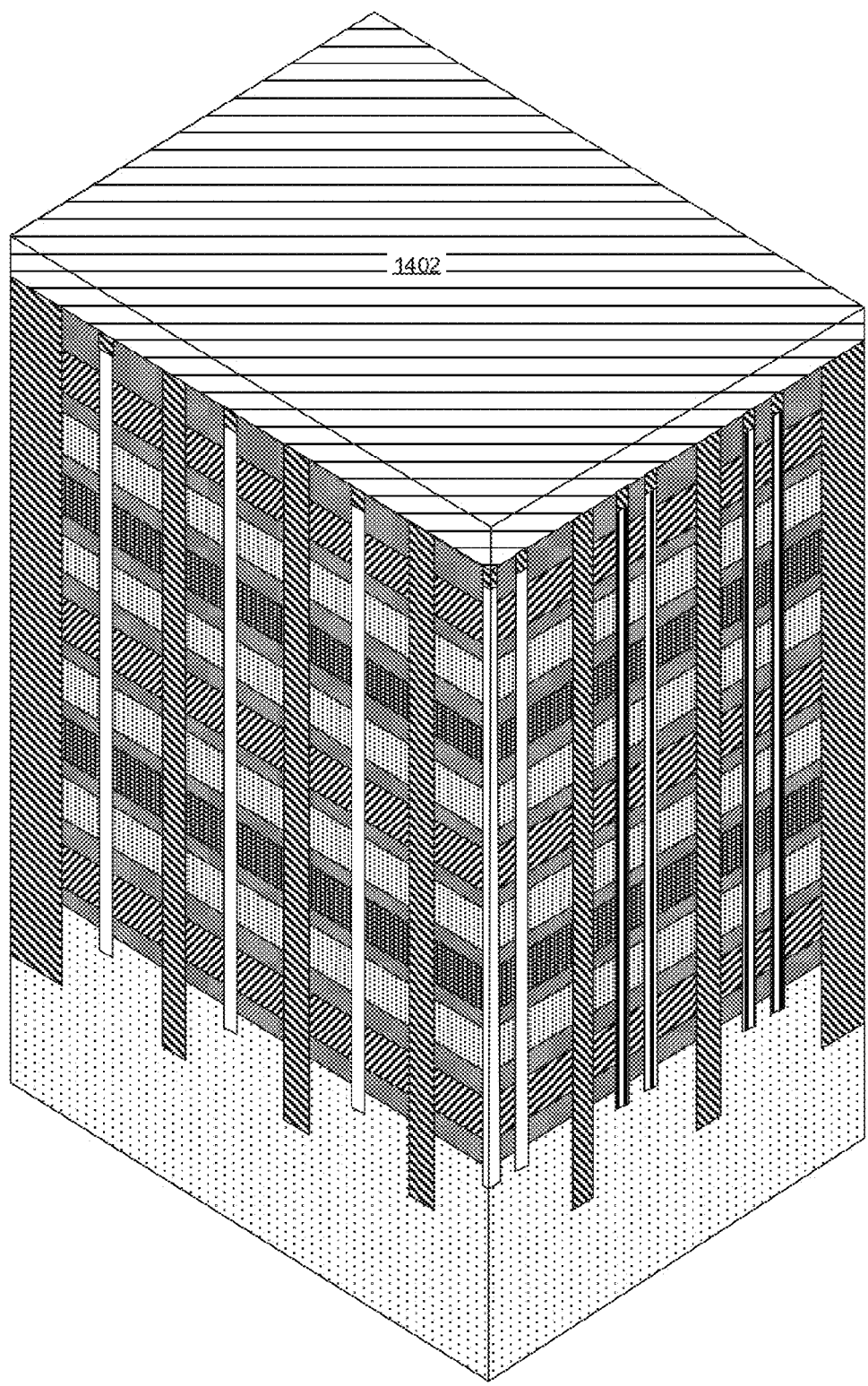
FIG. 14 is a diagram illustrating a fourth manufacturing stage of another process of manufacturing multiple nanowire FET stacks according to another particular aspect of the disclosure.

FIG. 14 is a diagram illustrating a fourth manufacturing stage of another process of manufacturing multiple nanowire FET stacks according to another particular aspect of the disclosure. The fourth manufacturing stage illustrated in FIG. 14 may be subsequent to the third manufacturing stage of FIG. 13.

In the fourth manufacturing stage of FIG. 14, the isolation layer 1302 may be planarized and an etch stop layer 1402 may be deposited. For example, one or more CMP processes may be performed to planarize (e.g., remove a portion of) the isolation layer 1302. After performance of the one or more CMP processes, an etch stop layer 1402 may be deposited on top of another portion (e.g., a remaining portion) of the isolation layer 1302, the isolation layers 1112, the isolation trenches 1152, or a combination thereof. In some implementations, the etch stop layer 1402 may include or correspond to a low-K etch stop layer. The low-K etch stop layer may include silicon carbon nitride (SiCN), as an illustrative, non-limiting example.

Figure 15:
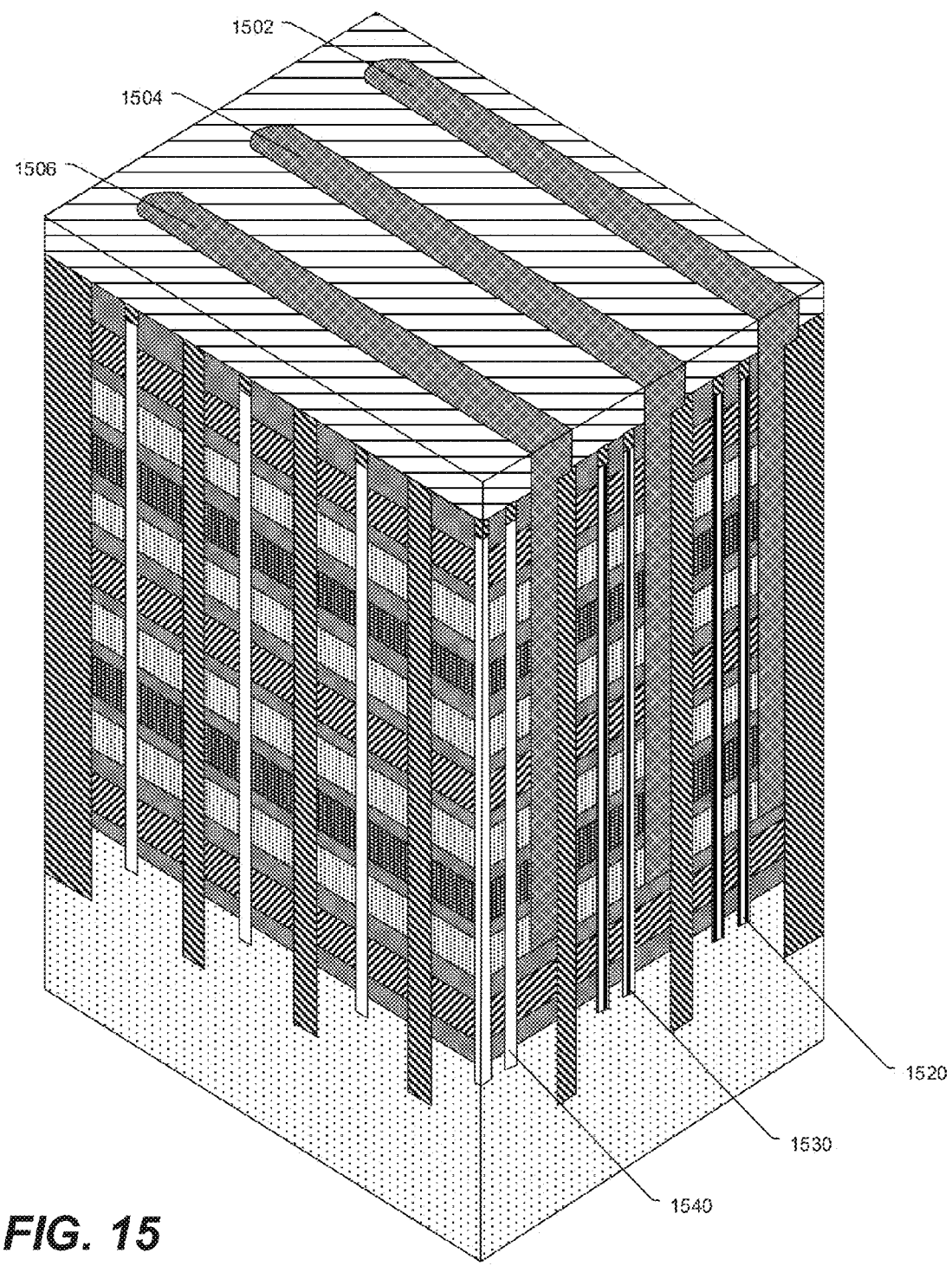
FIG. 15 is a diagram illustrating a fifth manufacturing stage of another process of manufacturing multiple nanowire FET stacks according to another particular aspect of the disclosure.

FIG. 15 is a diagram illustrating a fifth manufacturing stage of another process of manufacturing multiple nanowire FET stacks according to another particular aspect of the disclosure. The fifth manufacturing stage illustrated in FIG. 15 may be subsequent to the fourth manufacturing stage of FIG. 14.

In the fifth manufacturing stage of FIG. 15, gate access ways may be formed in the layer stack. For example, gate access ways 1502, 1504, and 1506 may be formed using a series of selective etches. To illustrate, a first patterned resist layer or hardmask may be formed to guide a set of selective etch processes to form openings in the layer stack corresponding to the gate access ways 1502, 1504, and 1506. Subsequently, one or more first fill materials may be deposited to fill the openings, forming the gate access ways 1502, 1504, and 1506 as illustrated in FIG. 15. The gate access ways 1502, 1504, and 1506 may include or correspond to the gate access ways 704, 710, and 716 of FIG. 7.

The first fill materials may be selected to have high etch selectivity relative to the dummy layers, relative to other fill materials, or both. For example, the gate access ways may be filled with SiN, SiON, SiOCN, or SiC to provide sufficient etch selectivity relative to the dummy layers.

When an integrated circuit includes nanowire FETs with an N-type nanowire (N-type nanowire FETs) and nanowire FETs with a P-type nanowire (P-type nanowire FETs), different gate access ways may be formed for the different nanowire FET types. For example, a first type of gate access way may be formed for the N-type nanowire FETs and a second (different) type of gate access way may be formed for the P-type nanowire FETs. To illustrate, in FIG. 15, nanowires of a first row of nanowire pairs 1520 and nanowires of a second row of nanowire pairs 1530 (e.g., nanowires 1202-1216) are P-type nanowires. Thus, the gate access ways 1502 and 1504 (e.g., PMOS gate access ways) may be formed concurrently and each may be filled with the same fill material. However, nanowires of a third row of nanowire pairs 1540 are N-type nanowires. Accordingly, the gate access way 1506 (e.g., NMOS gate access way) may be formed separately from the gate access ways 1502 and 1504 (e.g., using a different patterned photoresist layer or hardmask) and the gate access way 1506 may be filled with a different fill material that has high etch selectivity relative to the fill material of the PMOS gate access ways 1502 and 1504.

Figure 16:
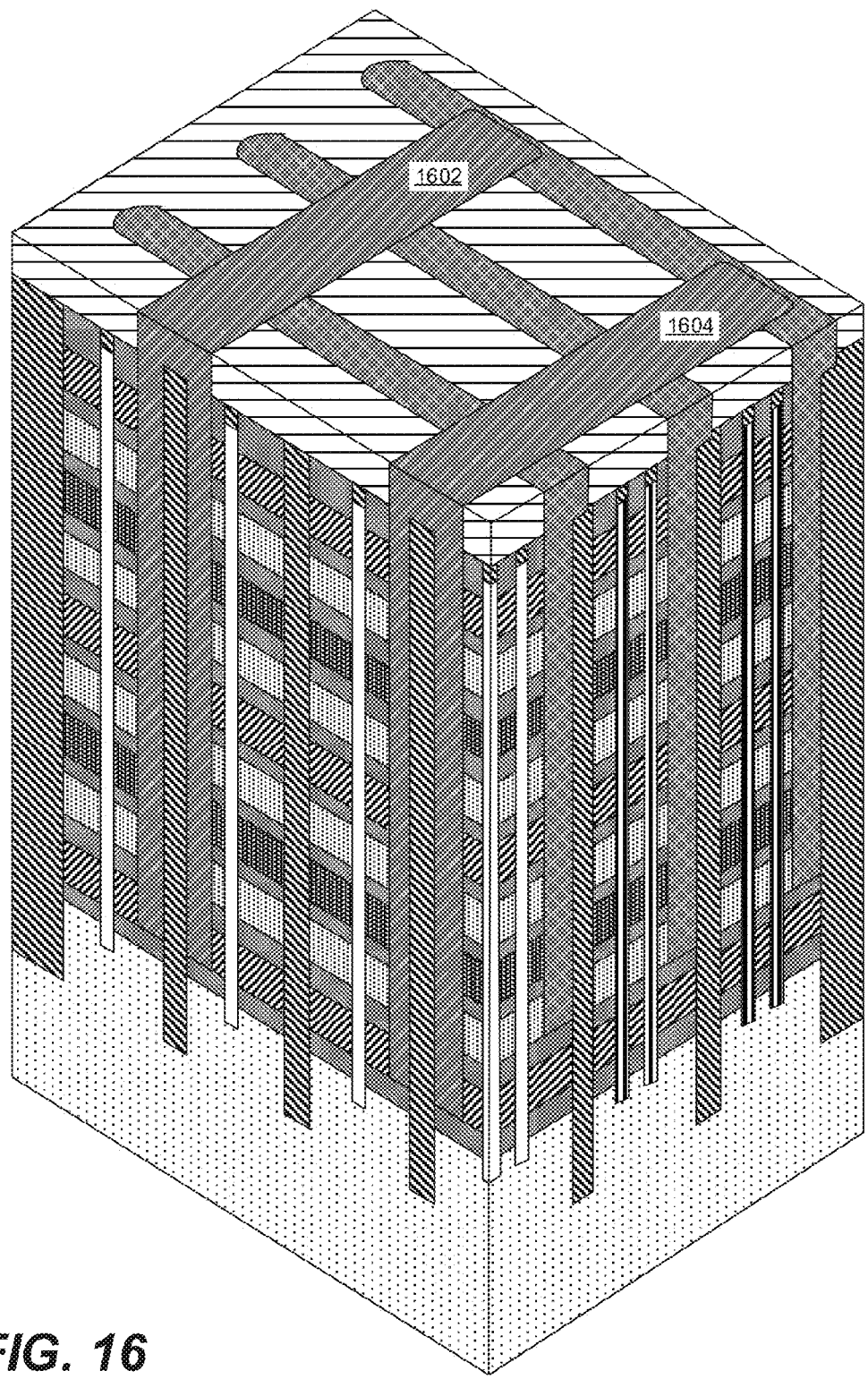
FIG. 16 is a diagram illustrating a sixth manufacturing stage of another process of manufacturing multiple nanowire FET stacks according to another particular aspect of the disclosure.

FIG. 16 is a diagram illustrating a sixth manufacturing stage of another process of manufacturing multiple nanowire FET stacks according to another particular aspect of the disclosure. The sixth manufacturing stage illustrated in FIG. 16 may be subsequent to the fifth manufacturing stage of FIG. 15.

In the sixth manufacturing stage of FIG. 16, source access ways may be formed in the layer stack. For example, source access ways 1602 and 1604 may be formed using a second series of selective etches. To illustrate, a second patterned resist layer or hardmask may be formed to guide a second set of selective etch processes to form openings in the layer stack corresponding to the source access ways 1602 and 1604. Subsequently, one or more second fill materials may be deposited to fill the openings, forming the source access ways 1602 and 1604 as illustrated in FIG. 16. The source access ways 1602 and 1604 may include or correspond to source access ways 702, 712, and 714 of FIG. 7.

The second fill materials may be the same as or different from the first fill materials. The second fill materials may be selected to have high etch selectivity relative to the dummy layers, relative to other fill materials, or both. For example, the gate access ways may be filled with SiN, SiON, SiOCN, or SiC to provide sufficient etch selectivity relative to the dummy layers.

Figure 17:
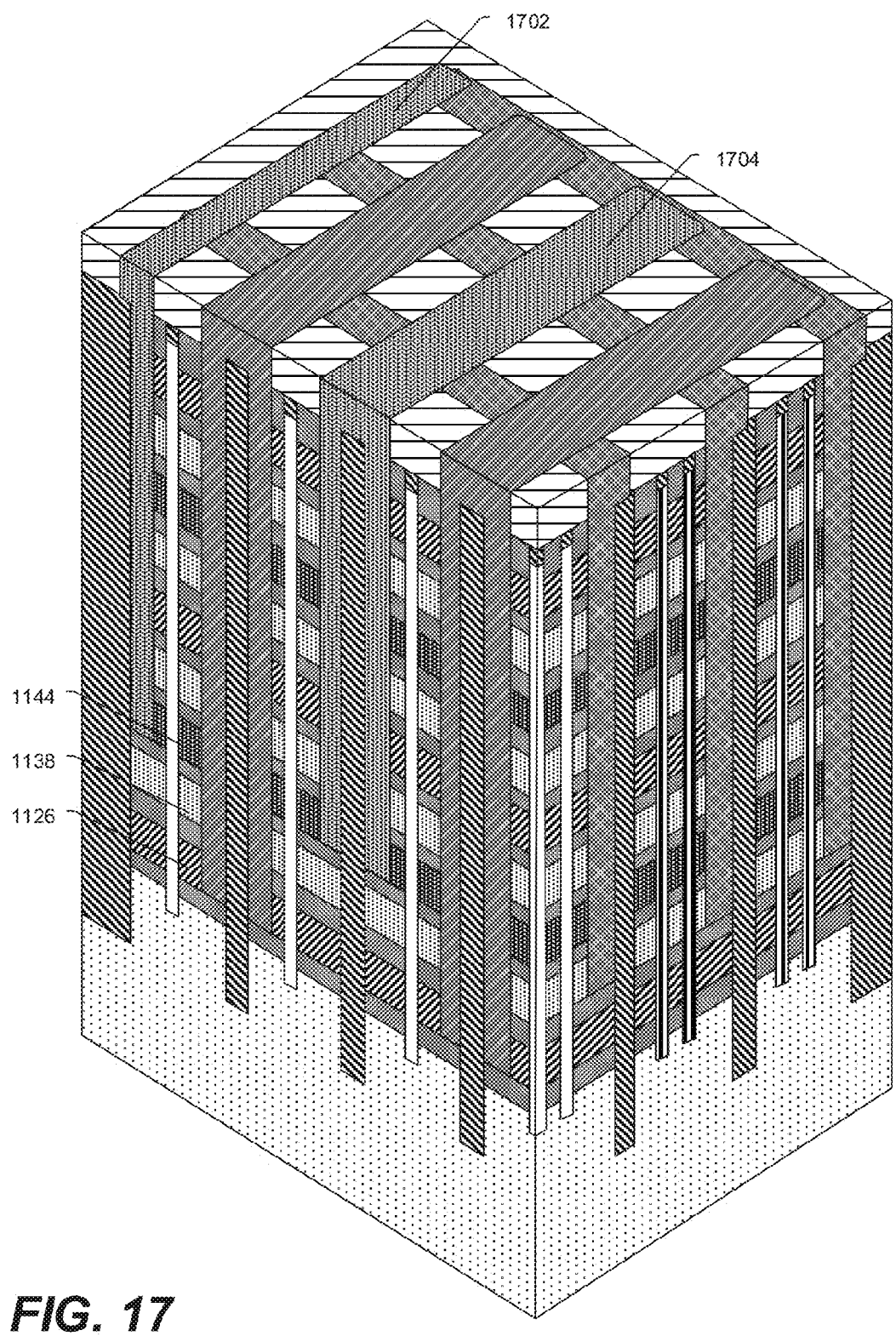
FIG. 17 is a diagram illustrating a seventh manufacturing stage of another process of manufacturing multiple nanowire FET stacks according to another particular aspect of the disclosure.

FIG. 17 is a diagram illustrating a seventh manufacturing stage of another process of manufacturing multiple nanowire FET stacks according to another particular aspect of the disclosure. The seventh manufacturing stage illustrated in FIG. 17 may be subsequent to the sixth manufacturing stage of FIG. 16.

In the seventh manufacturing stage of FIG. 17, drain access ways may be formed in the layer stack. For example, drain access ways 1702 and 1704 may be formed using a third series of selective etches. To illustrate, a third patterned resist layer or hardmask may be formed to guide a third set of selective etch processes to form openings in the layer stack corresponding to the drain access ways 1702 and 1704. Subsequently, one or more third fill materials may be deposited to fill the openings, forming the drain access ways 1702 and 1704 as illustrated in FIG. 17. The drain access ways 1702 and 1704 may include or correspond to drain access ways 706, 708, and 718 of FIG. 7.

The materials used to fill the access ways (e.g., the first fill materials, the second fill materials, and the third fill materials) may be selected to have high etch selectivity relative to one another, relative to the dummy layers, or both. For example, the access ways may be filled with SiN, SiON, SiOCN, or SiC to provide sufficient etch selectivity relative to the dummy layers.

In other implementations, the source access ways, gate access ways, and drain access ways may be formed in a different order. Each access way extends to or into a dummy layer of a type corresponding to the type of the access way. For example, in FIG. 17, the source access ways 1602 and 1604 extend to or into the source region dummy layer 1126; the gate access ways 1502, 1504, and 1506 extend to or into the gate region dummy layer 1138; and the drain access ways 1702 and 1704 extend to or into the drain region dummy layer 1144.

In FIGS. 11-22, the process is illustrated as forming four nanowire FETs per nanowire FET stack; however, as previously explained, the process can be used to form different numbers of nanowire FETs in different nanowire FET stacks. If a particular nanowire FET stack of the integrated circuit of FIG. 17 were to be formed with fewer nanowire FETs than another nanowire FET stack of the integrated circuit, the access ways of the two nanowire FET stacks would be formed to access different dummy layers, as described with reference to FIGS. 29-43.

Figure 18:
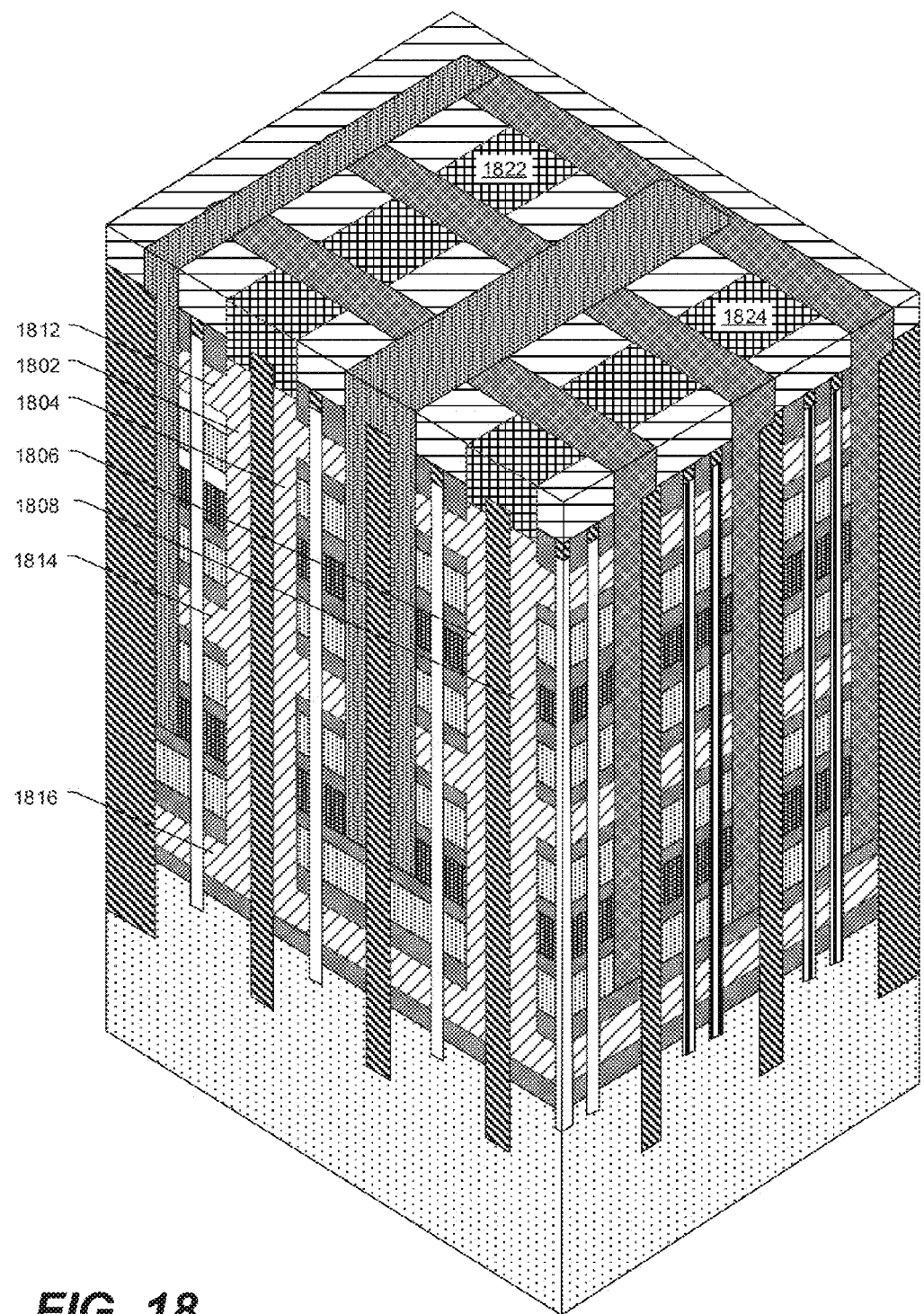
FIG. 18 is a diagram illustrating an eighth manufacturing stage of another process of manufacturing multiple nanowire FET stacks according to another particular aspect of the disclosure.

FIG. 18 is a diagram illustrating an eighth manufacturing stage of another process of manufacturing multiple nanowire FET stacks according to another particular aspect of the disclosure. The eighth manufacturing stage illustrated in FIG. 18 may be subsequent to the seventh manufacturing stage of FIG. 17.

In the eighth manufacturing stage of FIG. 18, source regions and source lines may be formed. For example, the source access ways 1602 and 1604 may be opened using an etch process. After the source access ways 1602 and 1604 are opened, the source region dummy layers 1122, 1124, and 1126 are exposed and may be etched. For example, a lateral (e.g., non-directional) etch process using chemistry that has high etch selectivity for material of the source region dummy layers 1122, 1124, and 1126 relative to materials of the gate region dummy layers 1132, 1134, 1136, and 1138, the drain region dummy layers 1142 and 1144, the pairs of nanowires 1202-1224, the isolation trenches 1152, and the isolation layers 1112 may be used to selectively etch the source region dummy layers 1122, 1124, and 1126. Etching the source region dummy layers 1122, 1124, and 1126 may expose portions of the pairs of nanowires 1202-1216 corresponding to the source regions. Additionally, surfaces of isolation layers 1112 adjacent to the source regions may be exposed.

After etching the source region dummy layers 1122, 1124, and 1126, source regions and source lines may be formed by depositing one or more materials. For example, an ALD process may be used to selectively form a monolayer on exposed surfaces as an isolation layer so that subsequently deposited metal layers (e.g., a Ti layer) are not shorted to other metal layers. In a particular implementation, the ALD process may deposit SiO, SiN, SiON, SiOCN, or another isolation material. Additionally or in the alternative, Ti may be deposited for form a layer on the exposed surfaces, and W may be deposited to fill the remaining space. The Ti and W deposition processes fill the regions previously occupied by the source region dummy layers 1122, 1124, and 1126 and the source access ways 1602 and 1604, thereby forming source regions 1812, 1814, and 1816 and source lines 1802, 1804, 1806, and 1808. The source regions 1812, 1814, and 1816 may include or correspond to the source regions 812, 816, and 820 of FIG. 8. The source lines 1802, 1804, 1806, and 1808 may include or correspond to the source lines 802, 804, and 806 of FIG. 8.

Additionally, after forming the source regions 1812, 1814, and 1816 and the source lines 1802, 1804, 1806, and 1808, source caps may be formed by depositing one or more materials. For example, a dielectric material may be deposited on exposed portions of the source lines 1802, 1804, 1806, and 1808 to form source caps 1822 and 1824. The source caps 1822 and 1824 may protect (e.g., insulate) the source lines 1802, 1804, 1806, and 1808 and the source regions 1812, 1814, and 1816.

Figure 19:
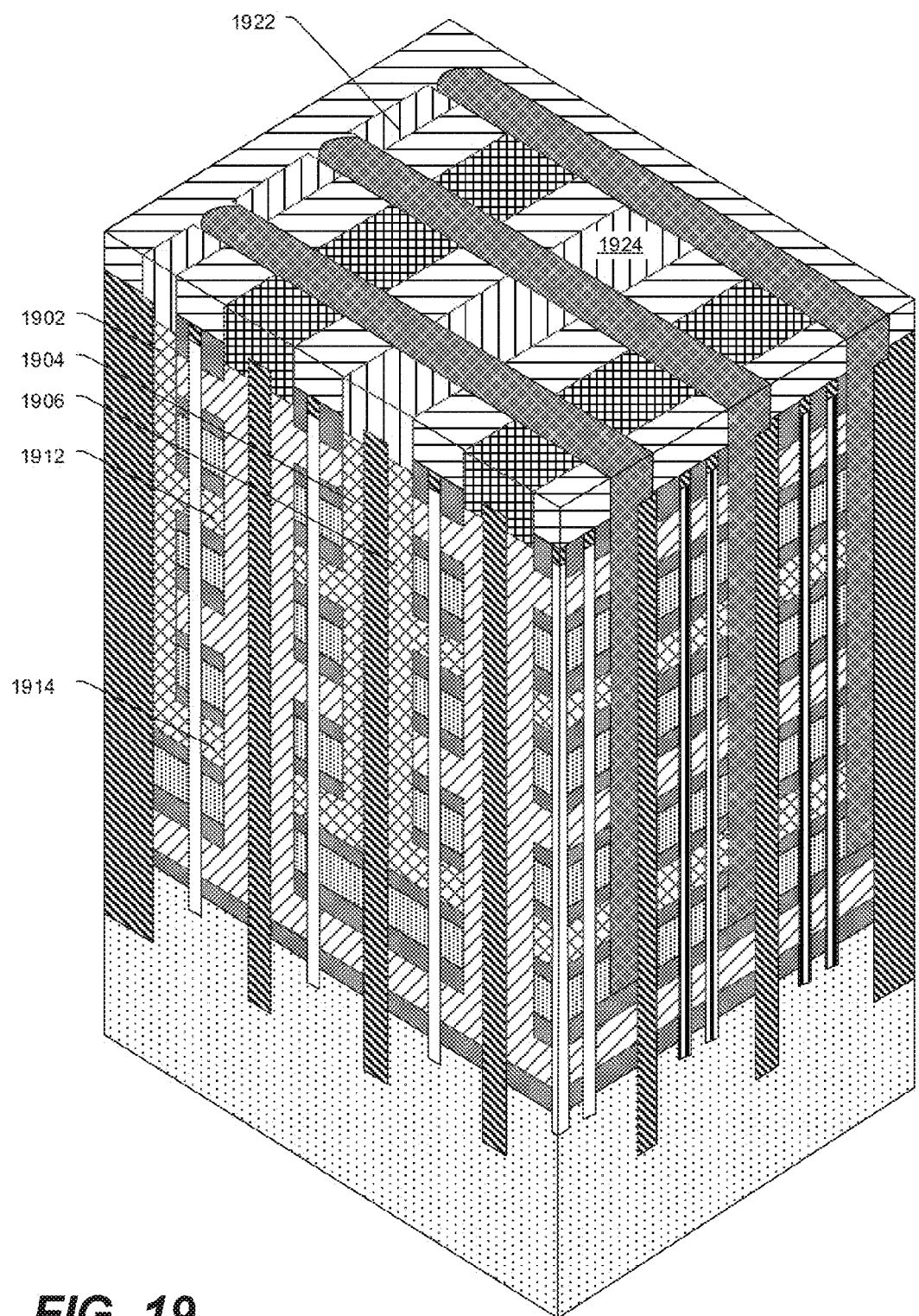
FIG. 19 is a diagram illustrating a ninth manufacturing stage of another process of manufacturing multiple nanowire FET stacks according to another particular aspect of the disclosure.

FIG. 19 is a diagram illustrating a ninth manufacturing stage of another process of manufacturing multiple nanowire FET stacks according to another particular aspect of the disclosure. The ninth manufacturing stage illustrated in FIG. 19 may be subsequent to the eighth manufacturing stage of FIG. 18.

In the ninth manufacturing stage of FIG. 19, drain regions and drain lines may be formed. For example, the drain access ways 1702 and 1704 may be opened using an etch process. After the drain access ways 1702 and 1704 are opened, the drain region dummy layers 1142 and 1144 are exposed and may be etched. For example, a lateral (e.g., non-directional) etch process using chemistry that has high etch selectivity for material of the drain region dummy layers 1142 and 1144 relative to materials of the gate region dummy layers 1132, 1134, 1136, and 1138, the source regions 1812, 1814, and 1816, the pairs of nanowires 1202-1224, the isolation trenches 1152, and the isolation layers 1112 may be used to selectively etch the drain region dummy layers 1142 and 1144. Etching the drain region dummy layers may expose portions of the pairs of nanowires 1202-1224 corresponding to the drain regions. Additionally, surfaces of isolation layers 1112 adjacent to the drain regions may be exposed.

After etching the drain region dummy layers 1142 and 1144, drain regions and drain lines may be formed by depositing one or more materials. For example, an ALD process may be used to selectively form a monolayer on exposed surfaces as an isolation layer so that subsequently deposited metal layers (e.g., a Ti layer) are not shorted to other metal layers. In a particular implementation, the ALD process may deposit SiO, SiN, SiON, SiOCN, or another isolation material. Additionally or in the alternative, Ti may be deposited for form a layer on the exposed surfaces, and W may be deposited to fill the remaining space. The Ti and W deposition processes fill the regions previously occupied by the drain region dummy layers 1142 and 1144 and the drain access ways 1702 and 1704, thereby forming drain regions 1912 and 1914 and drain lines 1902, 1904, and 1906. The drain regions 1912 and 1914 may include or correspond to the drain regions 914 and 918 of FIG. 9. The drain lines 1902, 1904, and 1906 may include or correspond to the drain lines 902, 904, and 906 of FIG. 9.

Additionally, after forming the drain regions 1912 and 1914 and the drain lines 1902, 1904, and 1906, drain caps may be formed by depositing one or more materials. For example, a dielectric material may be deposited on exposed portions of the drain lines 1902, 1904, and 1906 to form drain caps 1922 and 1924. The drain caps 1922 and 1924 may protect (e.g., insulate) the drain lines 1902, 1904, and 1906 and the drain regions 1912 and 1914.

Figure 20:
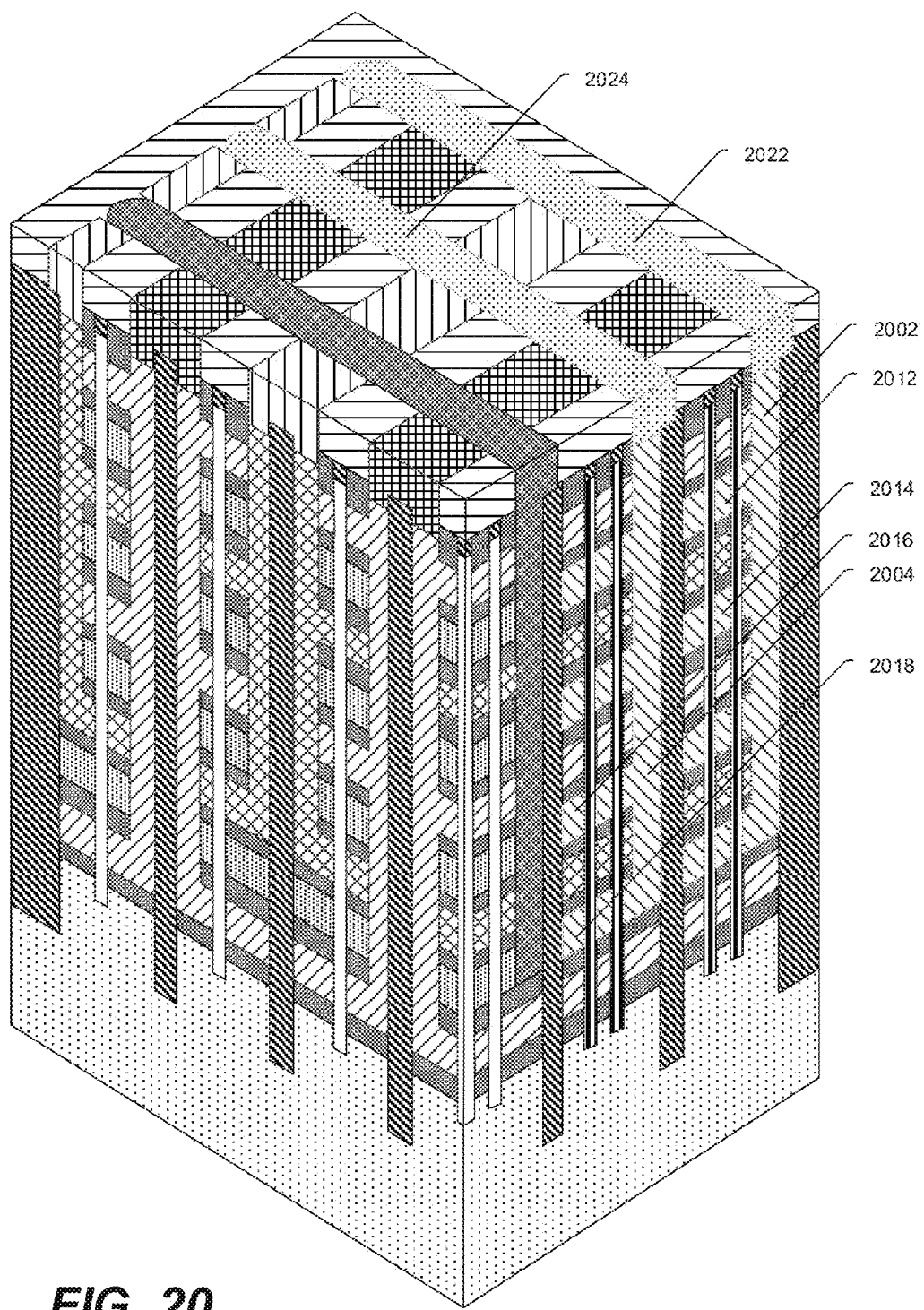
FIG. 20 is a diagram illustrating a tenth manufacturing stage of another process of manufacturing multiple nanowire FET stacks according to another particular aspect of the disclosure.

FIG. 20 is a diagram illustrating a tenth manufacturing stage of another process of manufacturing multiple nanowire FET stacks according to another particular aspect of the disclosure. The tenth manufacturing stage illustrated in FIG. 20 may be subsequent to the ninth manufacturing stage of FIG. 19.

In the tenth manufacturing stage of FIG. 20, PMOS gate regions and PMOS gate lines may be formed for nanowire FETs with a P-type nanowire. For example, the PMOS gate access ways 1502 and 1504 may be opened using an etch process. After the PMOS gate access ways 1502 and 1504 are opened, portions (e.g., PMOS portions) of the gate region dummy layers 1132, 1134, 1136, and 1138 are exposed and may be etched. For example, a lateral (e.g., non-directional) etch process using chemistry that has high etch selectivity for material of the gate region dummy layers 1132, 1134, 1136, and 1138 relative to materials of the source regions 1812, 1814, and 1816, the drain regions 1912 and 1914, the pairs of nanowires 1202-1224, the isolation trenches 1152, and the isolation layers 1112 may be used to selectively etch the portions of the gate region dummy layers 1132, 1134, 1136, and 1138. Etching the portions of the gate region dummy layers 1132, 1134, 1136, and 1138 may expose portions of the pairs of nanowires 1202-1216 corresponding to the PMOS gate regions. Additionally, surfaces of isolation layers 1112 adjacent to the PMOS gate regions may be exposed.

After etching the portions of the gate region dummy layers 1132, 1134, 1136, and 1138, PMOS gate regions and PMOS gate lines may be formed by depositing one or more materials. Different materials may be used to form NMOS gate regions for nanowire FETs with an N-type nanowire as compared to materials used to form PMOS gate regions for nanowire FETs with a P-type nanowire. Accordingly, some gate access ways may be protected (e.g., using a hardmask) while others are opened. For example, the PMOS gate access ways 1502 and 1504 may be opened while the NMOS gate access way 1506 is protected with a hardmask. This enables etching gate region dummy layers in the first row of nanowire FET stacks 1182 and the second row of nanowire FET stacks 1184, without etching the gate region dummy layers in the third row of nanowire FET stacks 1186. Formation of PMOS gate regions and gate lines for nanowire FETs with P-type nanowires may include depositing a first set of one or more materials after etching the gate region dummy layers in areas associated with those nanowire FETs. Formation of NMOS gate regions and gate lines for nanowire FETs with N-type nanowires may include depositing a second set of one or more materials after etching the gate region dummy layers in areas associated with those nanowire FETs, as described with reference to FIG. 21. The first set of one or more materials may be different from the second set of one or more materials. Alternatively, the first set of one or more materials may be the same as the second set of one or more materials.

For example, for nanowire FETs with P-type nanowires (such as the pairs of nanowires 1202-1216), after opening the PMOS gate access ways 1502 and 1504 and etching the gate region dummy layers 1132, 1134, 1136, and 1138 in the first row of nanowire FET stacks 1182 and the second row of nanowire FET stacks 1184, an ALD process may be used to selectively form a monolayer on exposed surfaces as an isolation layer so that subsequently deposited metal layers (e.g., a Ti layer) are not shorted to other metal layers. In a particular implementation, the ALD process may deposit SiO, SiN, SiON, SiOCN, or another isolation material. Additionally or in the alternative, interface layers may be formed on exposed nanowire surfaces. To illustrate, the interface layers may include an oxide (e.g., SiO) formed using a thermal oxidation process, an ALD oxidation process, or a chemical oxidation process.

After the interface layers are formed, HfO2 may be deposited to form a layer on the exposed surfaces. A layer of TiN may be deposited over the HfO2 layer, and W may be deposited to fill the remaining space. The deposition processes may fill the regions previously occupied by the PMOS gate access ways 1502 and 1504 and the portions of the gate region dummy layers 1132, 1134, 1136, and 1138 in the first row of nanowire FET stacks 1182 and the second row of nanowire FET stacks 1184, thereby forming PMOS gate lines 2002 and 2004 and PMOS gate regions 2012, 2014, 2016, and 2018.

Additionally, after forming the PMOS gate regions 2012, 2014, 2016, and 2018 and the PMOS gate lines 2002 and 2004, PMOS gate caps may be formed by depositing one or more materials. For example, a dielectric material may be deposited on exposed portions of the PMOS gate lines 2002 and 2004 to form PMOS gate caps 2022 and 2024. The PMOS gate caps 2022 and 2024 may protect the PMOS gate lines 2002 and 2004 and the PMOS gate regions 2012, 2014, 2016, and 2018.

Figure 21:
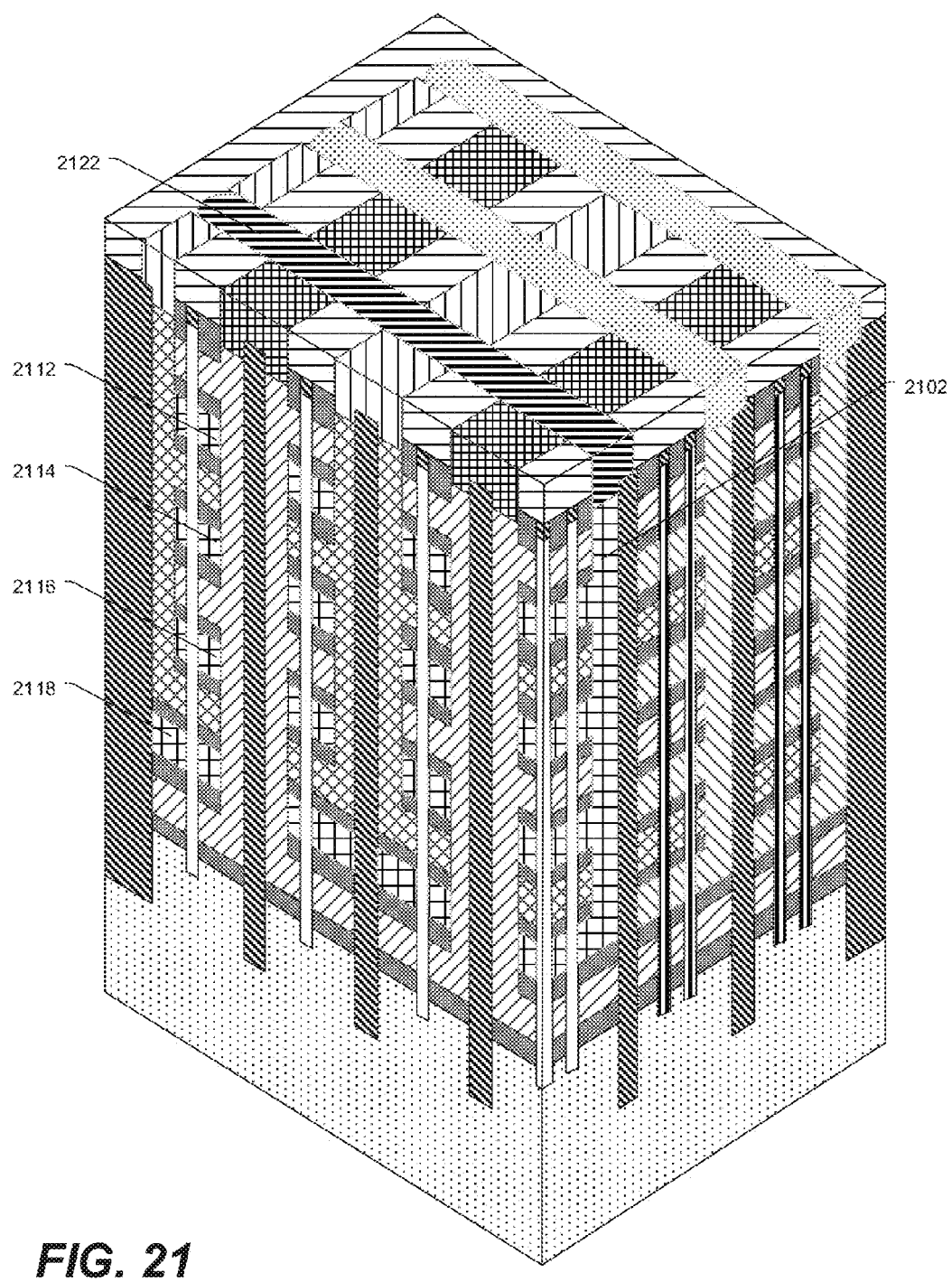
FIG. 21 is a diagram illustrating an eleventh manufacturing stage of another process of manufacturing multiple nanowire FET stacks according to another particular aspect of the disclosure.

FIG. 21 is a diagram illustrating an eleventh manufacturing stage of another process of manufacturing multiple nanowire FET stacks according to another particular aspect of the disclosure. The eleventh manufacturing stage illustrated in FIG. 21 may be subsequent to the tenth manufacturing stage of FIG. 20.

In the eleventh manufacturing stage of FIG. 21, NMOS gate regions and NMOS gate lines may be formed for nanowire FETs with an N-type nanowire. For example, the NMOS gate access way 1506 may be opened using an etch process. After the NMOS gate access way 1506 is opened, portions (e.g., NMOS portions) of the gate region dummy layers 1132, 1134, 1136, and 1138 are exposed and may be etched. For example, a lateral (e.g., non-directional) etch process using chemistry that has high etch selectivity for material of the gate region dummy layers 1132, 1134, 1136, and 1138 relative to materials of the source regions 1812, 1814, and 1816, the drain regions 1912 and 1914, the pairs of nanowires 1218-1224, the isolation trenches 1152, and the isolation layers 1112 may be used to selectively etch the portions of the gate region dummy layers 1132, 1134, 1136, and 1138. Etching the portions of the gate region dummy layers 1132, 1134, 1136, and 1138 may expose portions of the pairs of nanowires 1218-1224 corresponding to the NMOS gate regions. Additionally, surfaces of isolation layers 1112 adjacent to the NMOS gate regions may be exposed.

After etching the portions of the gate region dummy layers 1132, 1134, 1136, and 1138, NMOS gate regions and NMOS gate lines may be formed by depositing one or more materials (e.g., the second set of one or more materials). Different materials may be used to form the NMOS gate regions for nanowire FETs with an N-type nanowire as compared to materials used to form the PMOS gate regions for nanowire FETs with a P-type nanowire. Thus, some gate access ways (or the formed gate lines, gate regions, and gate caps) may be protected (e.g., using a hardmask) while others are opened. For example, the PMOS gate access ways 1502 and 1504 (or the PMOS gate lines 2002 and 2004 and the PMOS gate caps 2022 and 2024) may be protected with a hardmask while the NMOS gate access way 1506 is opened (e.g., etched). This enables etching gate region dummy layers in the third row of nanowire FET stacks 1186, without etching the gate region dummy layers (or the formed gate lines, gate regions, and gate caps) in the first row of nanowire FET stacks 1182 and the second row of nanowire FET stacks 1184. Formation of NMOS gate regions and NMOS gate lines for nanowire FETs with N-type nanowires may include depositing the second set of one or more materials after etching the gate region dummy layers in areas associated with those nanowire FETs.

For example, for nanowire FETs with N-type nanowires (such as the nanowires 1218-1224), after opening the NMOS gate access way 1506 and etching the gate region dummy layers in the third row of nanowire FET stacks 1186, an ALD process may be used to selectively form a monolayer on exposed surfaces as an isolation layer so that subsequently deposited metal layers (e.g., a Ti layer) are not shorted to other metal layers. In a particular implementation, the ALD process may deposit SiO, SiN, SiON, SiOCN, or another isolation material. Additionally or in the alternative, interface layers may be formed on exposed nanowire surfaces. The interface layers may include an oxide (e.g., SiO) formed using a thermal oxidation process, an ALD oxidation process, or a chemical oxidation process.

After the interface layers are formed, HfO2 may be deposited to form a layer on the exposed surfaces. A layer of TiAl may be deposited over the HfO2 layer, a layer of TiN may be deposited over the TiAl layer, and W may be deposited to fill the remaining space. The deposition processes may fill the region previously occupied by the NMOS gate access way 1506, and may fill the regions previously occupied by the portions of the gate region dummy layers 1132, 1134, 1136, and 1138 in the third row of nanowire FET stacks 1186, thereby forming NMOS gate line 2102 and NMOS gate regions 2112, 2114, 2116, and 2118.

Additionally, after forming the NMOS gate regions 2112, 2114, 2116, and 2118 and the NMOS gate line 2102, NMOS gate caps may be formed by depositing one or more materials. For example, a dielectric material may be deposited on an exposed portion of the NMOS gate line 2102 to form an NMOS gate cap 2122. The NMOS gate cap 2122 may protect the NMOS gate line 2102 and the NMOS gate regions 2112, 2114, 2116, and 2118.

Figure 22:
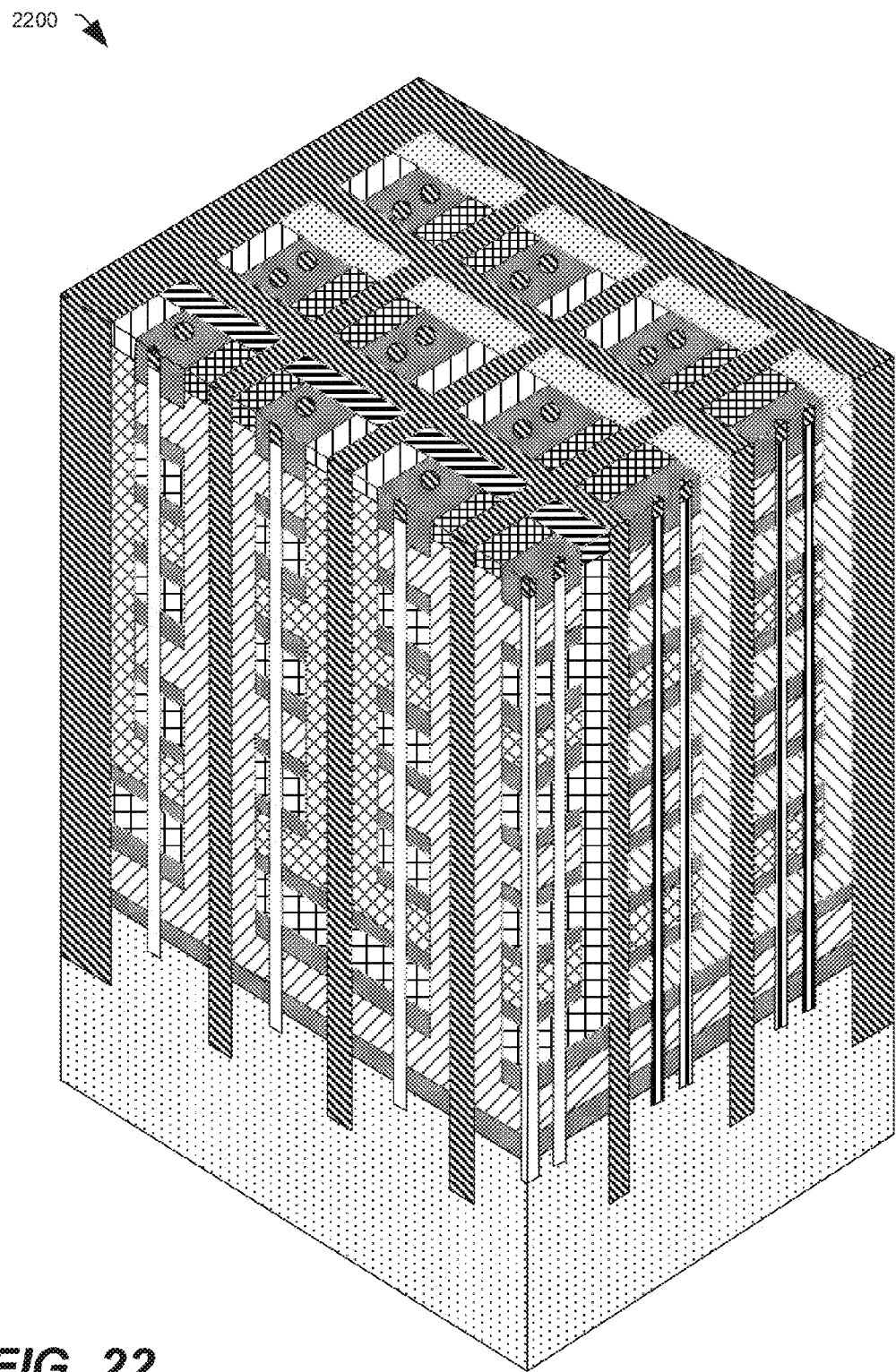
FIG. 22 is a diagram illustrating a twelfth manufacturing stage of another process of manufacturing multiple nanowire FET stacks according to another particular aspect of the disclosure.

FIG. 22 is a diagram illustrating a twelfth manufacturing stage of another process of manufacturing nanowire FET according to another particular aspect of the disclosure. The twelfth manufacturing stage illustrated in FIG. 22 may be subsequent to the eleventh manufacturing stage of FIG. 21.

After forming the gate regions and gate lines, the etch stop layer 1402, a portion of the isolation layer 1302, a portion of the isolation trenches 1154, a portion of the isolation layers 1112, a portion of the dielectric caps (e.g., the source caps 1822 and 1824, the drain caps 1922 and 1924, the PMOS gate caps 2022 and 2024, and the NMOS gate cap 2122), or a combination thereof, may be removed using one or more planarization processes, such as one or more CMP processes. For example, a first CMP process may remove a portion of the dielectric cap and a second CMP process may remove the etch stop layer 1402. A remaining portion or portions of the dielectric caps may insulate the structures (e.g., sources, gates, and drains) from being exposed. For example, the remaining portions of the dielectric caps may insulate the source lines 1802, 1804, 1806, and 1808 and the source regions 1812, 1814, and 1816. Performing the one or more planarization processes may produce an integrated circuit 2200.

After the one or more planarization process, the integrated circuit 2200, as illustrated in FIG. 22, may correspond to the integrated circuit 200 of FIG. 2, the integrated circuit 1000 of FIG. 10, or both, with more detail illustrated in FIG. 22 than in FIG. 2 or 10. Accordingly, the alternative implementations described with reference to FIGS. 2-10 also apply to the manufacturing process described with reference to FIGS. 11-22.

Figure 23:
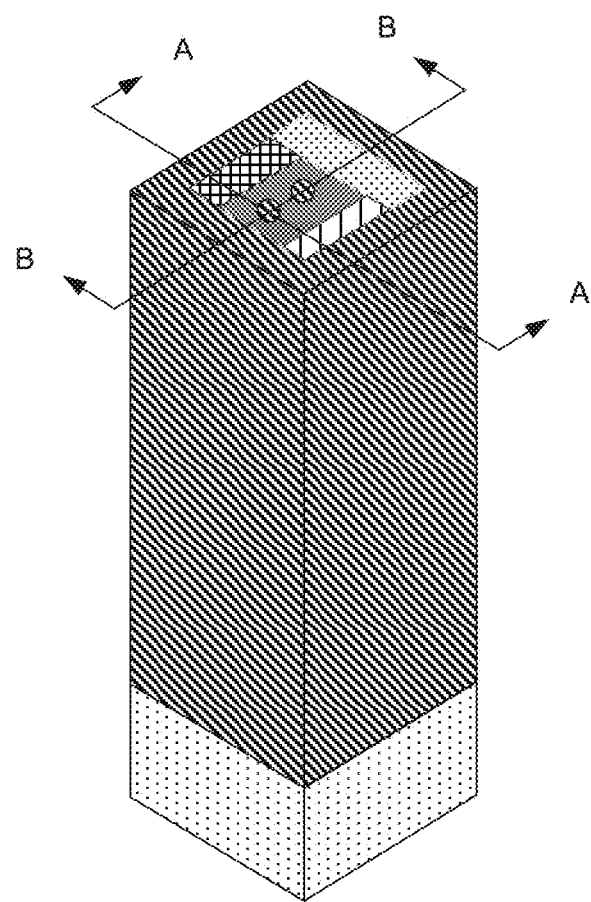
FIG. 23 is a diagram illustrating a particular N-type nanowire FET stack.
Figure 24:
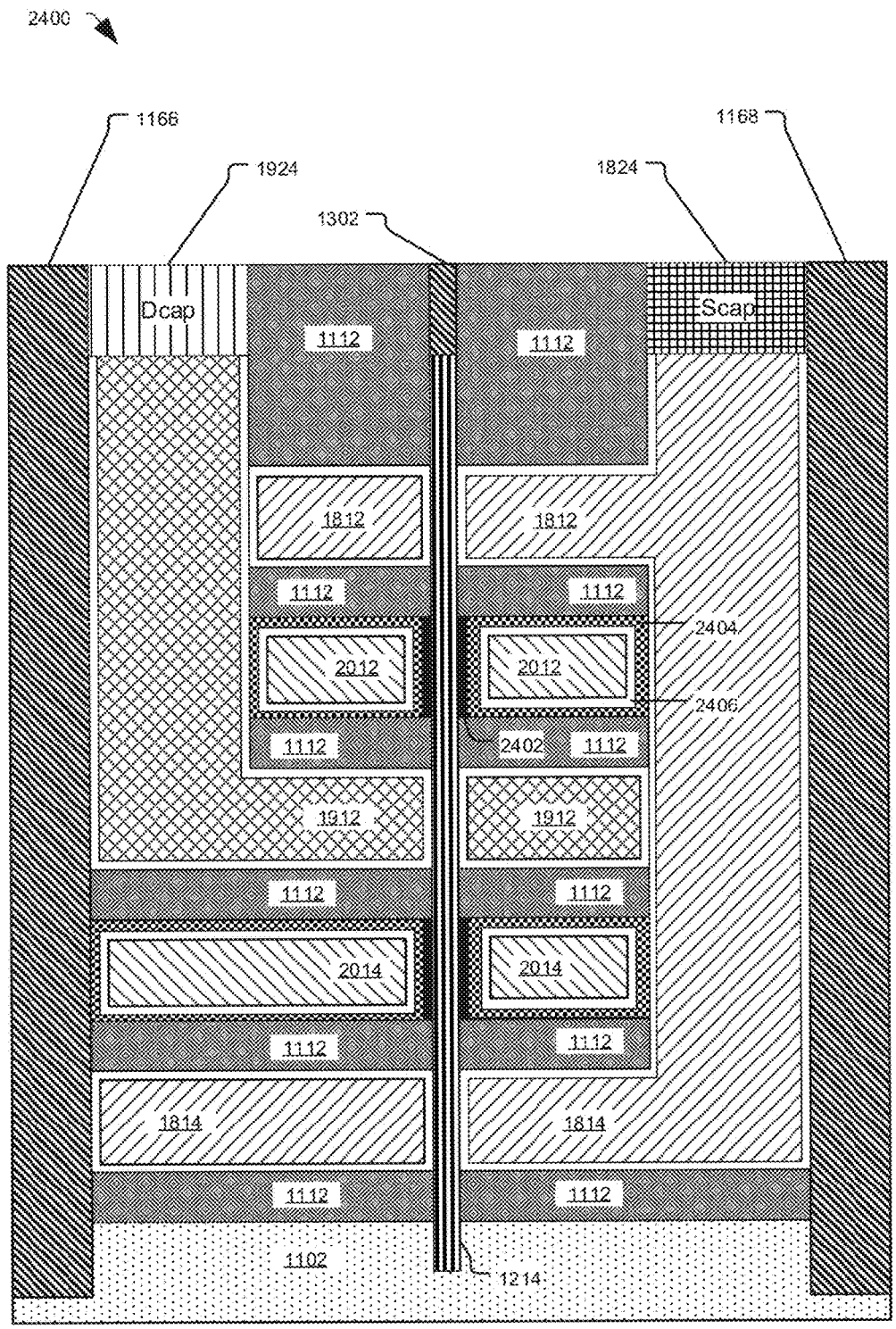
FIG. 24 is a diagram illustrating a first cross section of the particular N-type nanowire FET stack.
Figure 25:
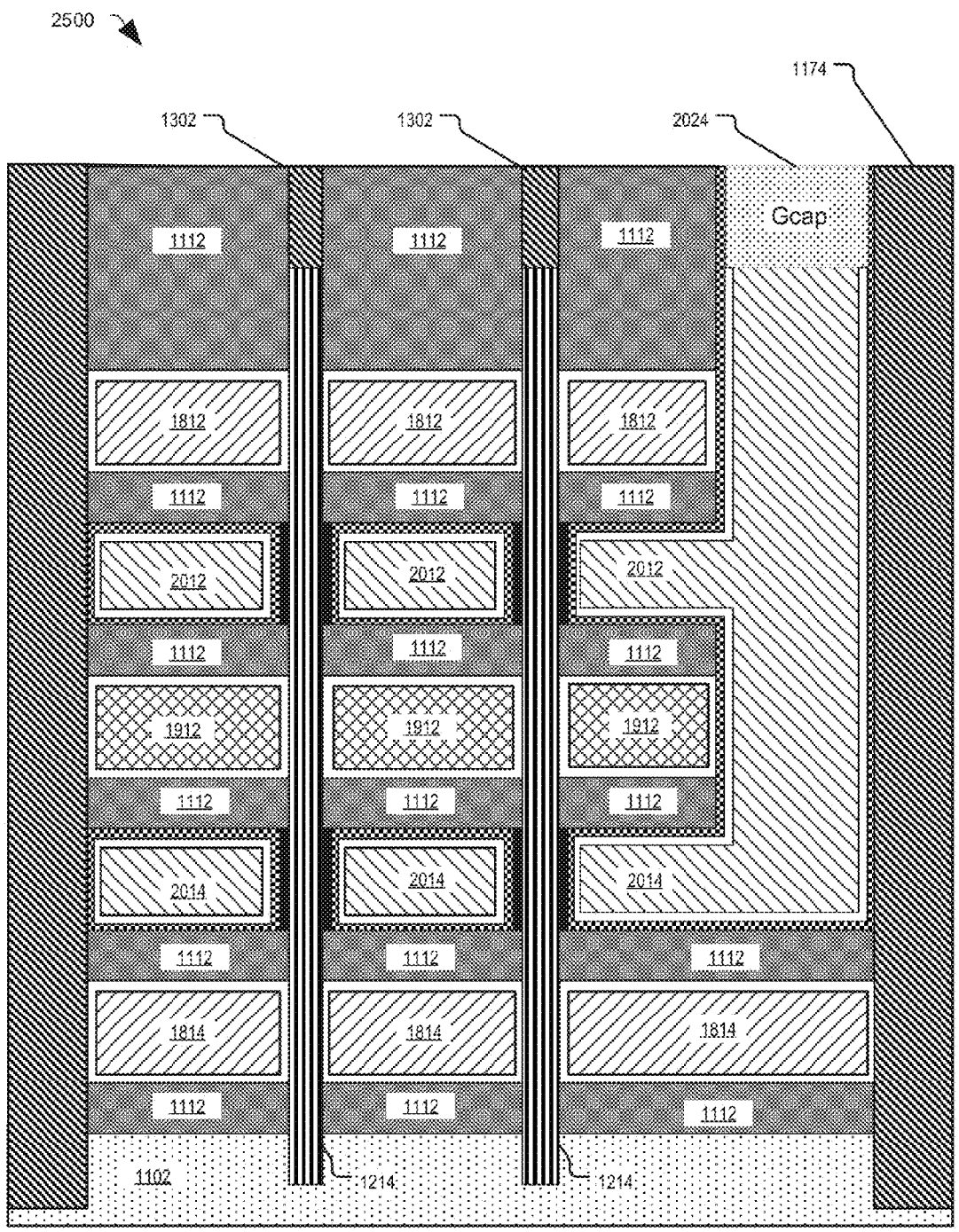
FIG. 25 is a diagram illustrating a second cross section of the particular N-type nanowire FET stack.
Figure 26:
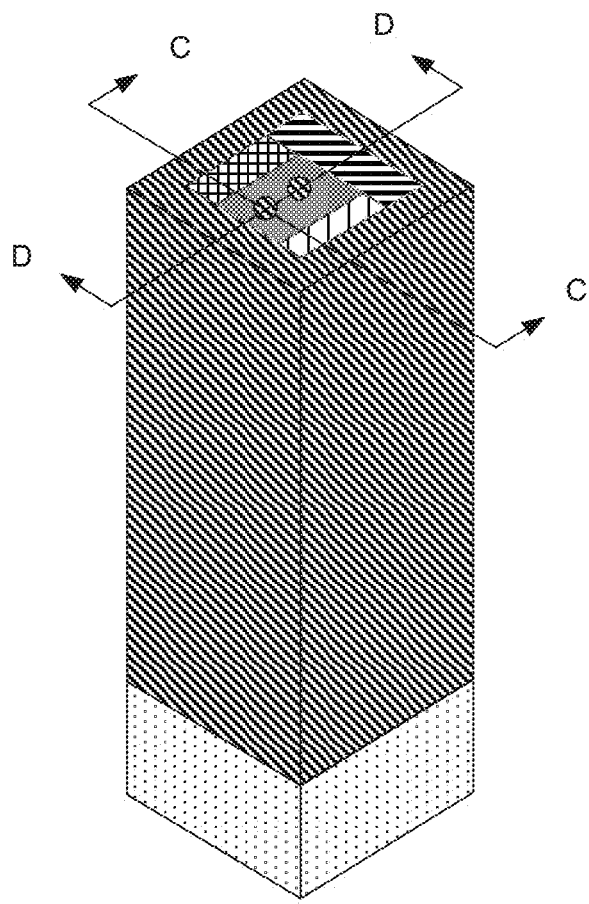
FIG. 26 is a diagram illustrating a particular P-type nanowire FET stack.
Figure 27:
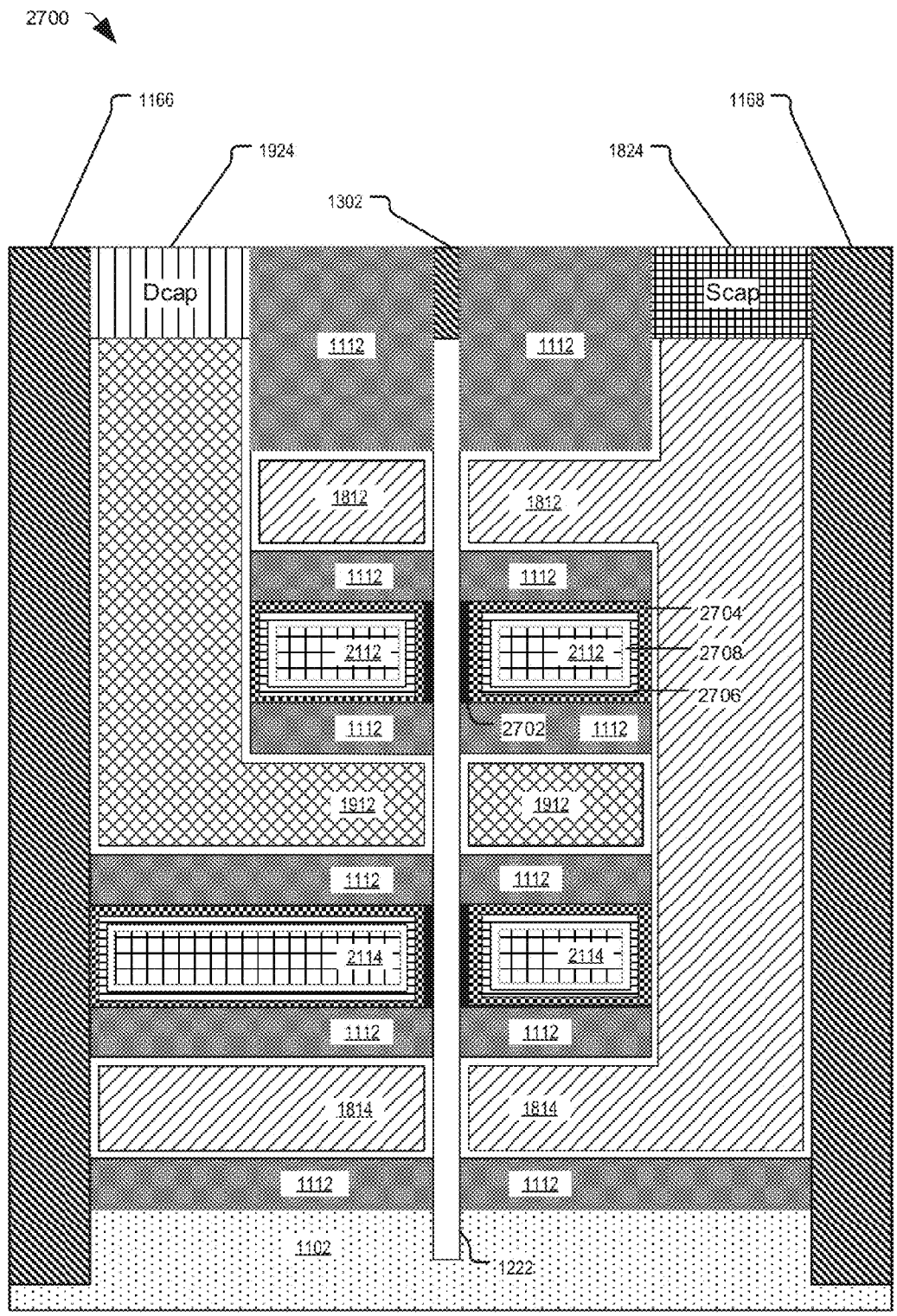
FIG. 27 is a diagram illustrating a first cross section of the particular P-type nanowire FET stack.
Figure 28:
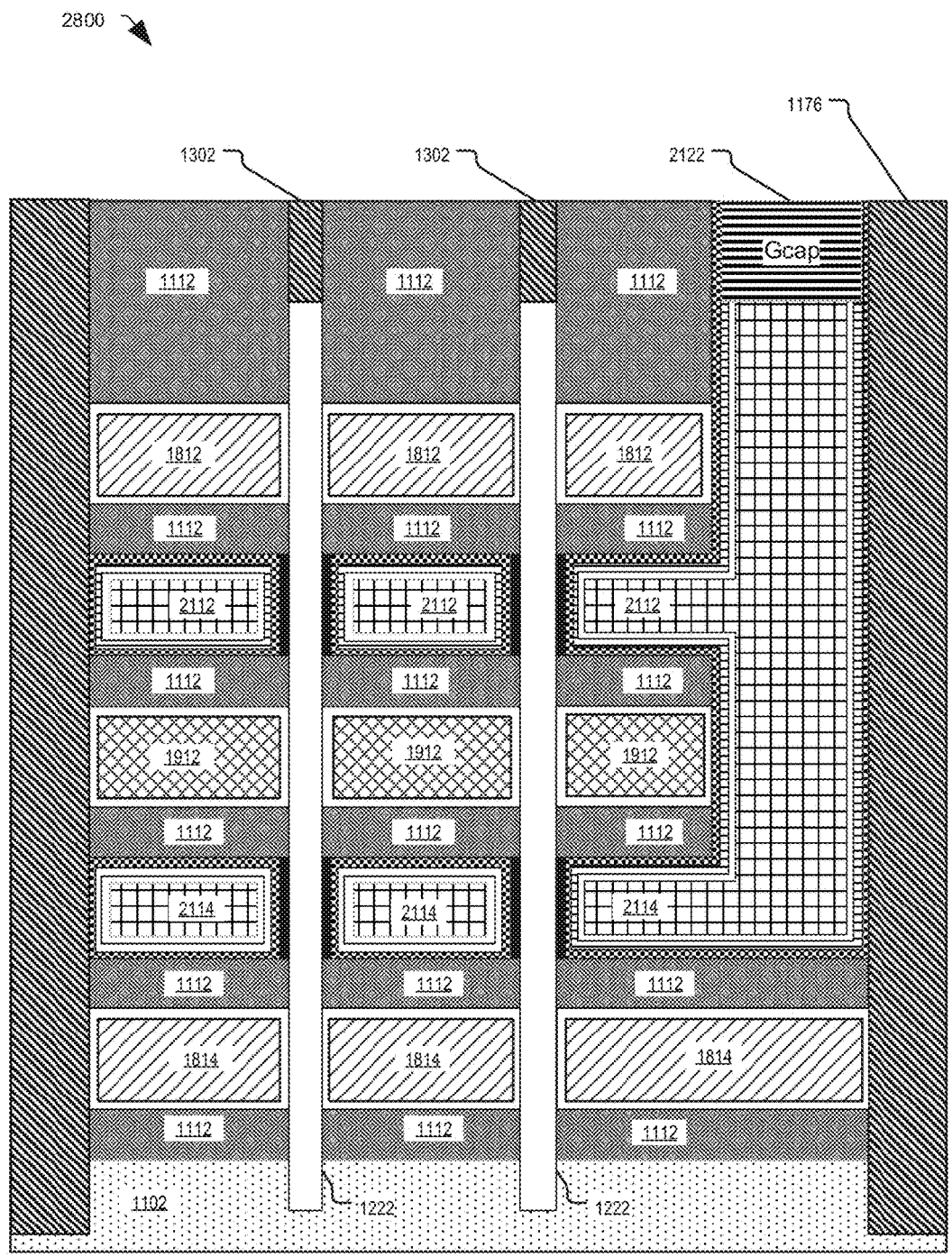
FIG. 28 is a diagram illustrating a second cross section of the particular P-type nanowire FET stack.

FIGS. 23-28 illustrate particular nanowire FET stacks. FIGS. 23-25 illustrate a particular P-type nanowire FET stack. FIGS. 26-28 illustrate a particular N-type nanowire FET stack.

FIG. 23 is a diagram illustrating a particular P-type nanowire FET stack 2300. The particular P-type nanowire FET stack 2300 may include or correspond to a nanowire FET stack in the second row of nanowire FET stacks 1184 and the third column of nanowire FET stacks 1196 as illustrated in FIG. 22. A cross section of the particular P-type nanowire FET stack 2300 along the axis AA is illustrated in FIG. 24, and a cross section along the axis BB is illustrated in FIG. 25.

FIG. 24 is a diagram illustrating a first cross section 2400 of the particular P-type nanowire FET stack 2300 of FIG. 23 along the axis AA. The first cross section 2400 has been simplified to illustrate a nanowire FET stack with two nanowire FETs, as opposed to four nanowire FETs in FIG. 22. The first cross section 2400 illustrates the source and drain regions and the source and drain access lines. The first cross section 2400 illustrates the first set of one or more materials used to fill in the dummy gate regions. For example, after the gate access ways and dummy gate regions are etched, an ALD process may be used to selectively form a monolayer on exposed surfaces as an isolation layer, as described with reference to FIG. 20. One or more interface layers 2402 may be formed on exposed nanowire surfaces, as described with reference to FIG. 20. After the one or more interface layers 2402 are formed, HfO2 may be deposited to form a first layer 2404 on the exposed surfaces. A second layer 2406 of TiN may be deposited over the first layer 2404 of HfO2, and W may be deposited to fill the remaining space, as described with reference to FIG. 20.

FIG. 25 is a diagram illustrating a second cross section 2500 of the particular P-type nanowire FET stack 2300 of FIG. 23 along the axis BB. The second cross section 2500 has been simplified to illustrate a nanowire FET stack with two nanowire FETs, as opposed to four nanowire FETs in FIG. 22. The second cross section 2500 illustrates the gate regions and the gate access lines. The second cross section 2500 also illustrates the first set of one or more materials used to fill in the dummy gate regions.

FIG. 26 is a diagram illustrating a particular N-type nanowire FET stack 2600. The particular N-type nanowire FET stack 2600 may include or correspond to a nanowire FET stack in the third row of nanowire FET stacks 1186 and the third column of nanowire FET stacks 1196 as illustrated in FIG. 22. A cross section of the particular N-type nanowire FET stack 2600 along the axis CC is illustrated in FIG. 27, and a cross section along the axis DD is illustrated in FIG. 28.

FIG. 27 is a diagram illustrating a first cross section 2700 of the particular N-type nanowire FET stack 2600 of FIG. 26 along the axis CC. The first cross section 2700 has been simplified to illustrate a nanowire FET stack with two nanowire FETs, as opposed to four nanowire FETs in FIG. 22. The first cross section 2700 illustrates the source and drain regions and the source and drain access lines. The first cross section 2700 illustrates the second set of one or more materials used to fill in the dummy gate regions. For example, after the gate access ways and dummy gate regions are etched, an ALD process may be used to selectively form a monolayer on exposed surfaces as an isolation layer, as described with reference to FIG. 21. One or more interface layers 2702 may be formed on exposed nanowire surfaces, as described with reference to FIG. 21. After the one or more interface layers 2702 are formed, HfO2 may be deposited to form a first layer 2704 on the exposed surfaces. A second layer 2706 of TiAl may be deposited over the first layer 2704, a third layer 2708 of TiN may be deposited over the second layer 2706, and W may be deposited to fill the remaining space, as described with reference to FIG. 21.

FIG. 28 is a diagram illustrating a second cross section 2800 of the particular N-type nanowire FET stack. The second cross section 2800 has been simplified to illustrate a nanowire FET stack with two nanowire FETs, as opposed to four nanowire FETs in FIG. 22. The second cross section 2800 illustrates the gate regions and the gate access lines. The second cross section 2800 also illustrates the first set of one or more materials used to fill in the dummy gate regions.

FIGS. 29-43 illustrate various manufacturing stages during a process of forming an integrated circuit that includes one or more variable strength nanowire FET stacks. For example, the process may be used to form a single nanowire FET stack, such as one of the nanowire FET stacks 100, 120, 140 of FIGS. 1A, 1B and 1C, respectively. As another example, the process may be used to concurrently form multiple nanowire stacks of varying strengths (e.g., variable strength nanowire FET stacks). To illustrate, the process may be used to form the integrated circuit 200 of FIG. 2 or the integrated circuit 300 of FIG. 3.

Figure 29:
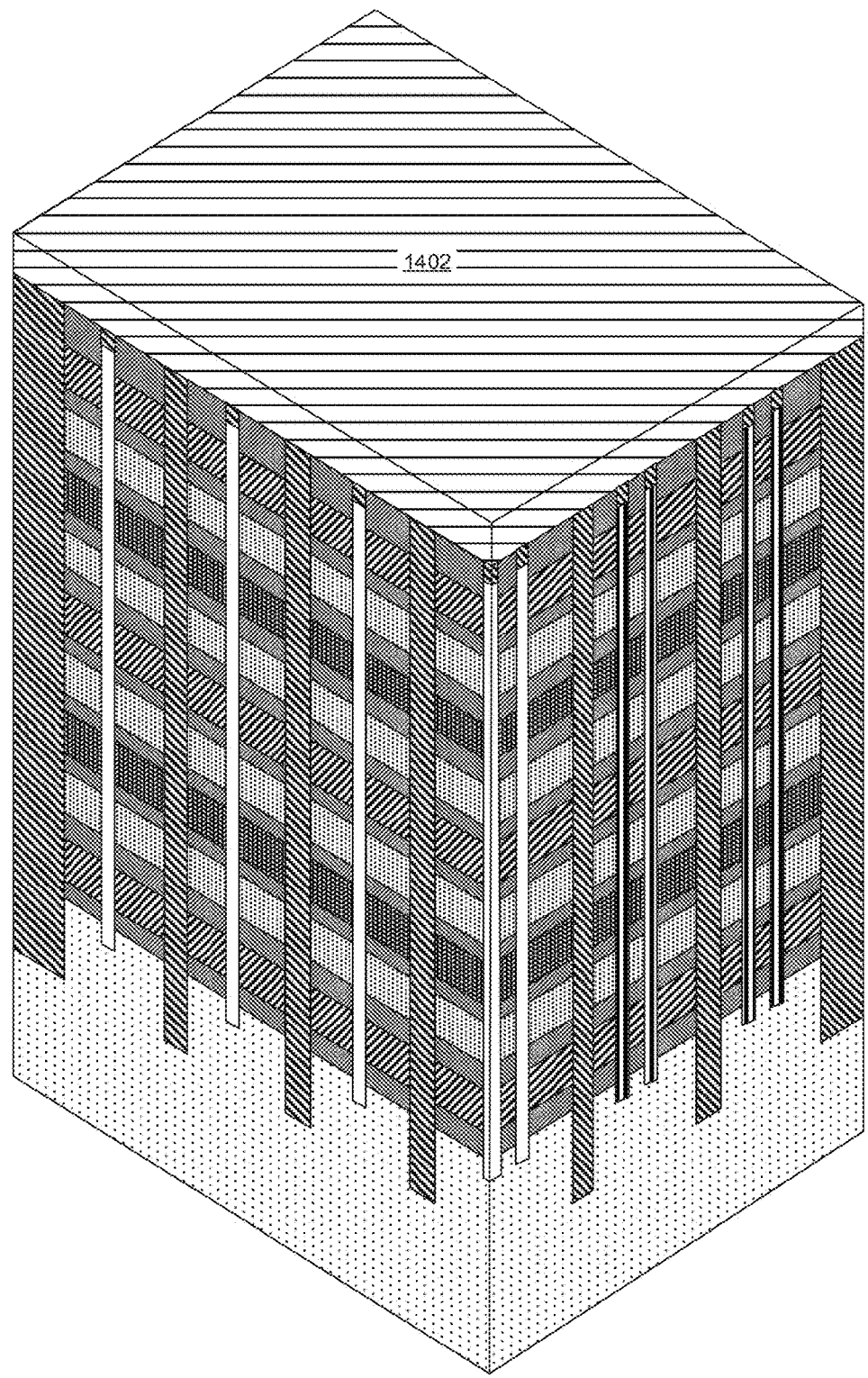
FIG. 29 is a diagram illustrating a first manufacturing stage of a process of manufacturing multiple variable strength nanowire FET stacks according to a particular aspect of the disclosure.

FIG. 29 is a diagram illustrating a first manufacturing stage of a process of manufacturing multiple variable strength nanowire FET stacks according to a particular aspect of the disclosure. In the first manufacturing stage, the etch stop layer 1402 is deposited on the layer stack with recessed nanowires. The first manufacturing stage may correspond to the third manufacturing stage illustrated in FIG. 14, such that the semiconductor device illustrated in FIG. 29 includes the layers described with reference to FIGS. 11-14. Steps corresponding to the manufacturing stages illustrated in FIGS. 11-13 may be performed prior to the first manufacturing stage illustrated in FIG. 29.

Figure 30:
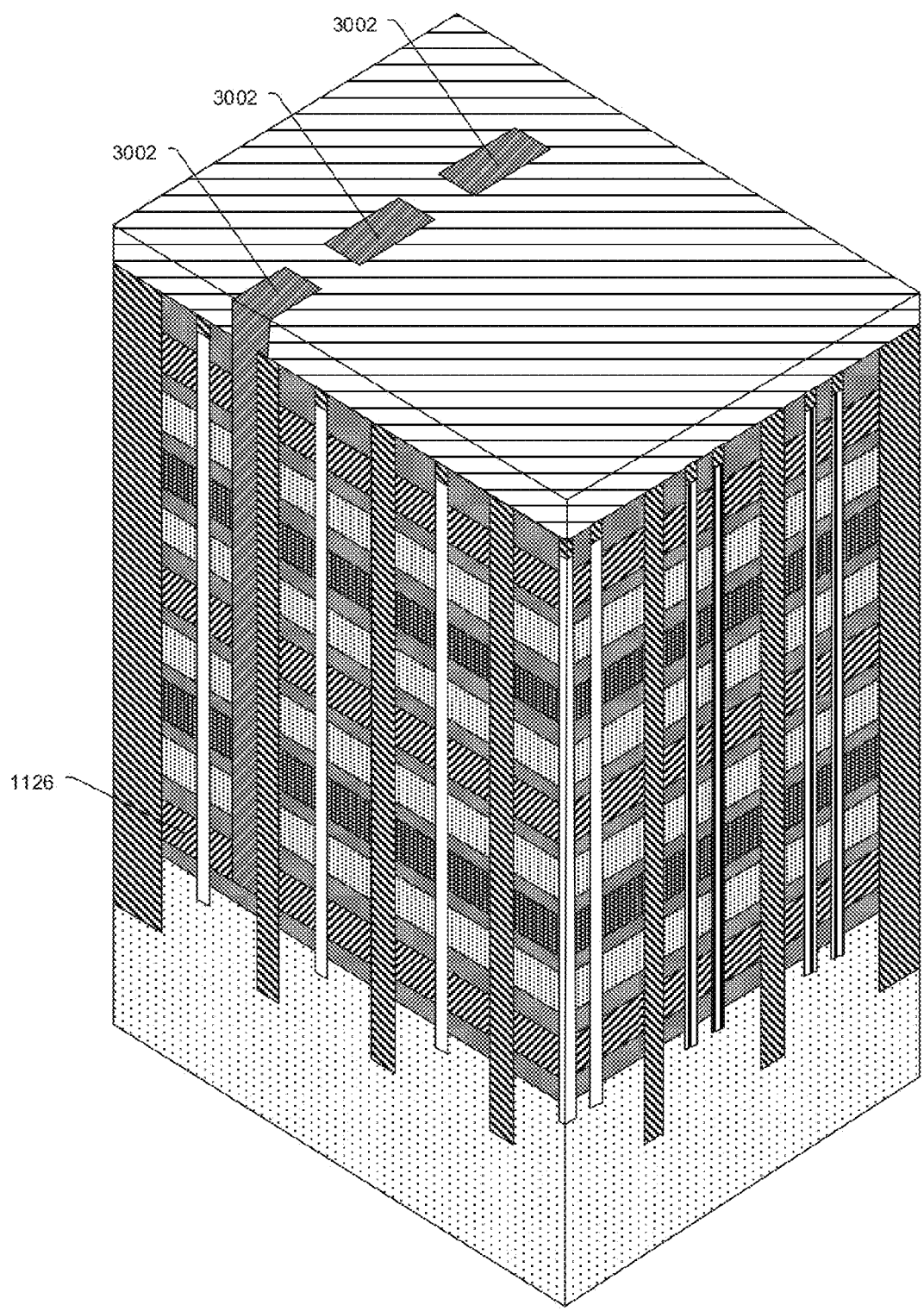
FIG. 30 is a diagram illustrating a second manufacturing stage of a process of manufacturing multiple variable strength nanowire FET stacks according to a particular aspect of the disclosure.

FIG. 30 is a diagram illustrating a second manufacturing stage of a process of manufacturing multiple variable strength nanowire FET stacks according to a particular aspect of the disclosure. The second manufacturing stage illustrated in FIG. 30 may be subsequent to the first manufacturing stage of FIG. 29.

In the second manufacturing stage of FIG. 30, first source access ways 3002 may be formed in the layer stack. For example, the first source access ways 3002 may be formed using a first series of selective etches. To illustrate, a first patterned resist layer or hardmask may be formed to guide a first set of selective etch processes to form openings in the layer stack corresponding to the first source access ways 3002. The first set of selective etch processes may extend to or into the third source region dummy layer 1126. Subsequently, one or more first fill materials may be deposited to fill the openings, forming the first source access ways 3002 as illustrated in FIG. 30. The first fill materials may be selected to have high etch selectivity relative to the dummy layers, relative to other fill materials, or both. The first source access ways 3002 may extend to or into the third source region dummy layer 1126. The first source access ways 3002 may include or correspond to the source access ways 702, 712, and 714 of FIG. 7, the source access ways 1602 and 1604 of FIG. 16, or a combination thereof.

Figure 31:
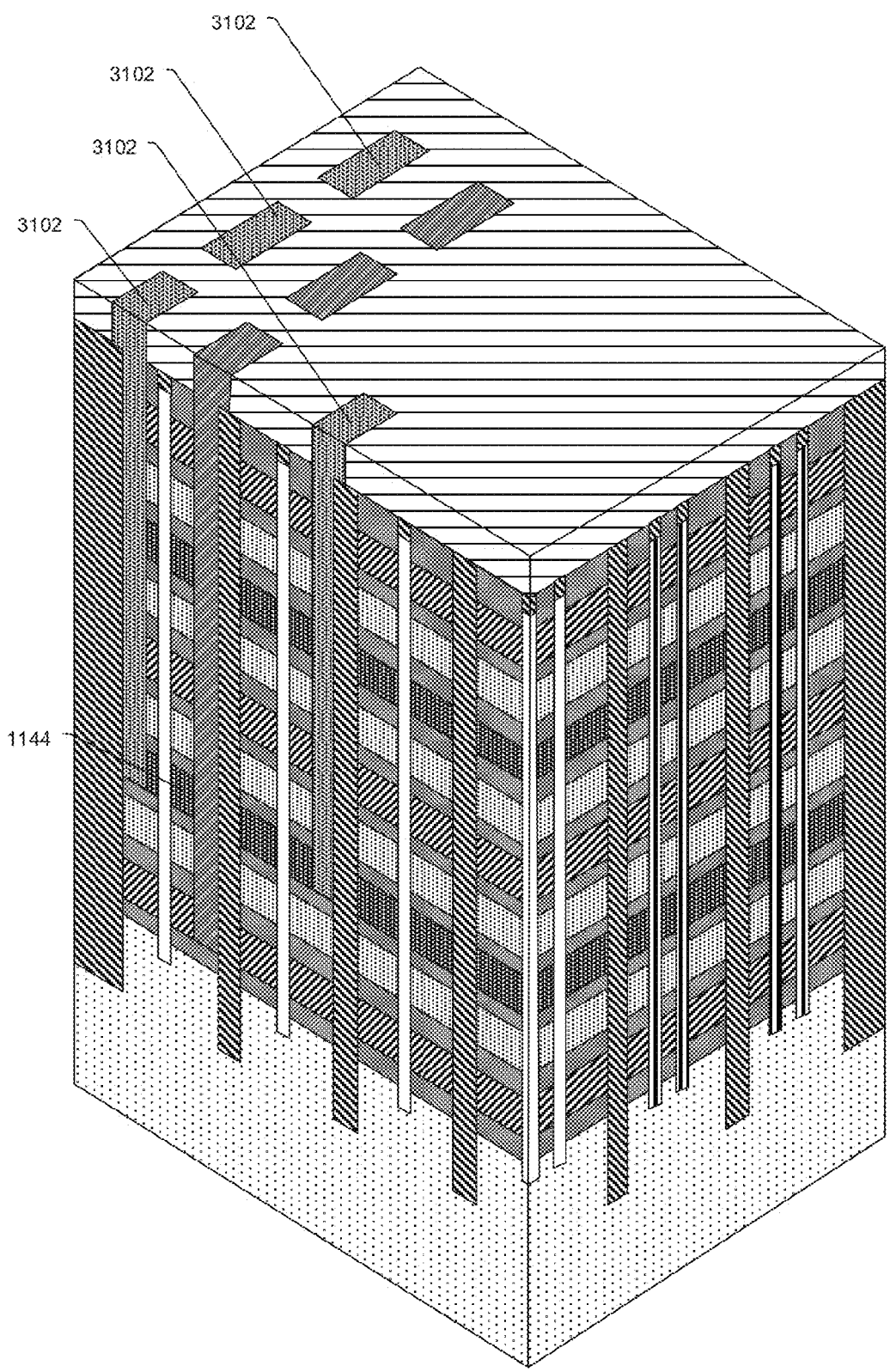
FIG. 31 is a diagram illustrating a third manufacturing stage of a process of manufacturing multiple variable strength nanowire FET stacks according to a particular aspect of the disclosure.

FIG. 31 is a diagram illustrating a third manufacturing stage of a process of manufacturing multiple variable strength nanowire FET stacks according to a particular aspect of the disclosure. The third manufacturing stage illustrated in FIG. 31 may be subsequent to the second manufacturing stage of FIG. 30.

In the third manufacturing stage of FIG. 31, first drain access ways 3102 may be formed in the layer stack. For example, the first drain access ways 3102 may be formed using a second series of selective etches. To illustrate, a second patterned resist layer or hardmask may be formed to guide a second set of selective etch processes to form openings in the layer stack corresponding to the first drain access ways 3102. The second set of selective etch processes may extend to or into the second drain region dummy layer 1144. Subsequently, one or more second fill materials may be deposited to fill the openings, forming the first drain access ways 3102 as illustrated in FIG. 31. The second fill materials may be selected to have high etch selectivity relative to the dummy layers, relative to other fill materials, or both. The first drain access ways 3102 may extend to or into the second drain region dummy layer 1144. The first drain access ways 3102 may include or correspond to the drain access ways 706, 708, and 718 of FIG. 7, the drain access ways 1702 and 1704 of FIG. 17, or a combination thereof.

Figure 32:
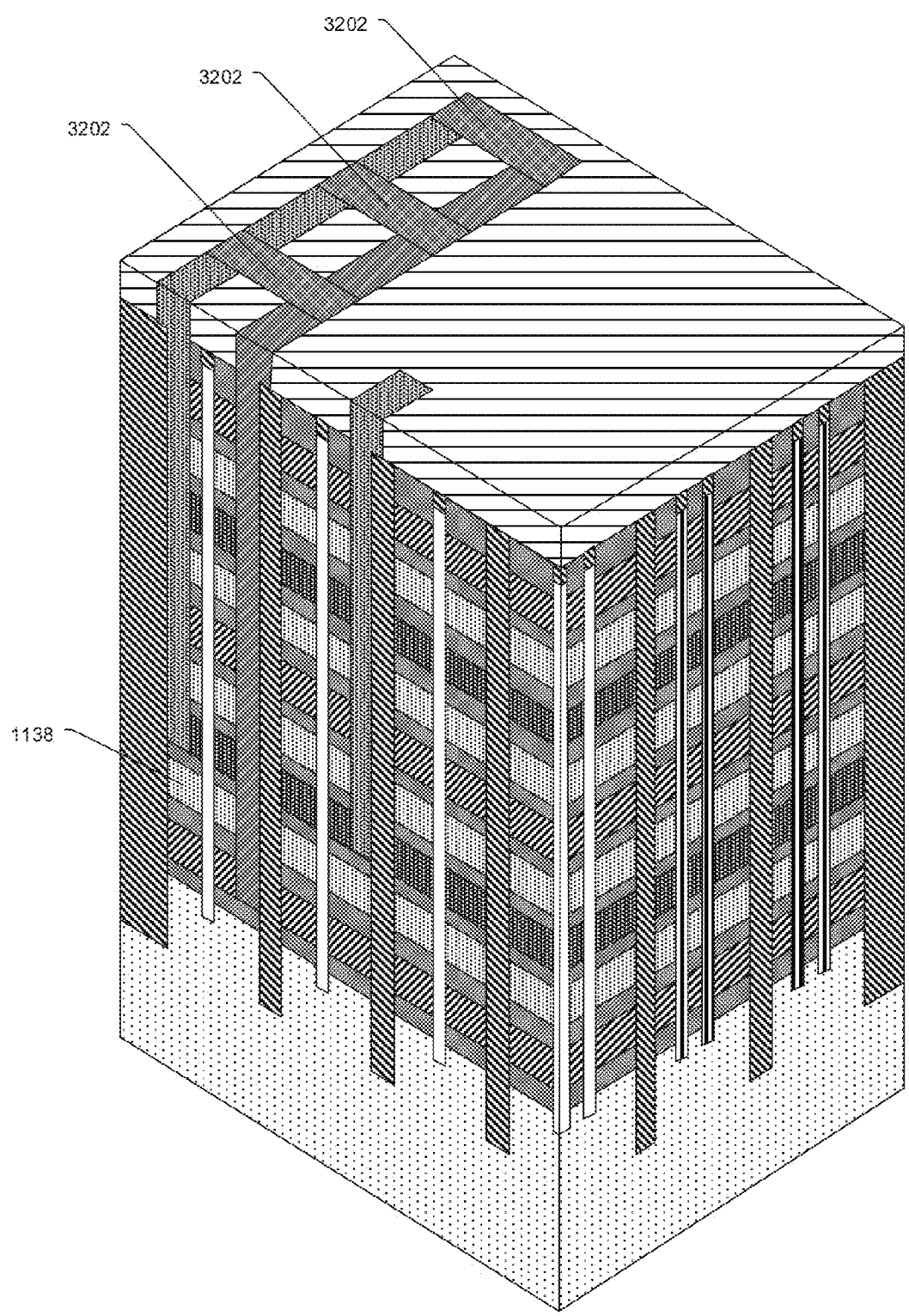
FIG. 32 is a diagram illustrating a fourth manufacturing stage of a process of manufacturing multiple variable strength nanowire FET stacks according to a particular aspect of the disclosure.

FIG. 32 is a diagram illustrating a fourth manufacturing stage of a process of manufacturing multiple variable strength nanowire FET stacks according to a particular aspect of the disclosure. The fourth manufacturing stage illustrated in FIG. 32 may be subsequent to the third manufacturing stage of FIG. 31.

In the fourth manufacturing stage of FIG. 32, first gate access ways 3202 may be formed in the layer stack. For example, the first gate access ways 3202 may be formed using a third series of selective etches. To illustrate, a third patterned resist layer or hardmask may be formed to guide a third set of selective etch processes to form openings in the layer stack corresponding to the first gate access ways 3202. The third set of selective etch processes may extend to or into the fourth gate region dummy layer 1138. Subsequently, one or more third fill materials may be deposited to fill the openings, forming the first gate access ways 3202 as illustrated in FIG. 32. The third fill materials may be selected to have high etch selectivity relative to the dummy layers, relative to other fill materials, or both. The first gate access ways 3202 may extend to or into the fourth gate region dummy layer 1138. The first gate access ways 3202 may include or correspond to the gate access ways 704, 710, and 716 of FIG. 7, the gate access ways 1502, 1504, and 1506 of FIG. 15, or a combination thereof.

Figure 33:
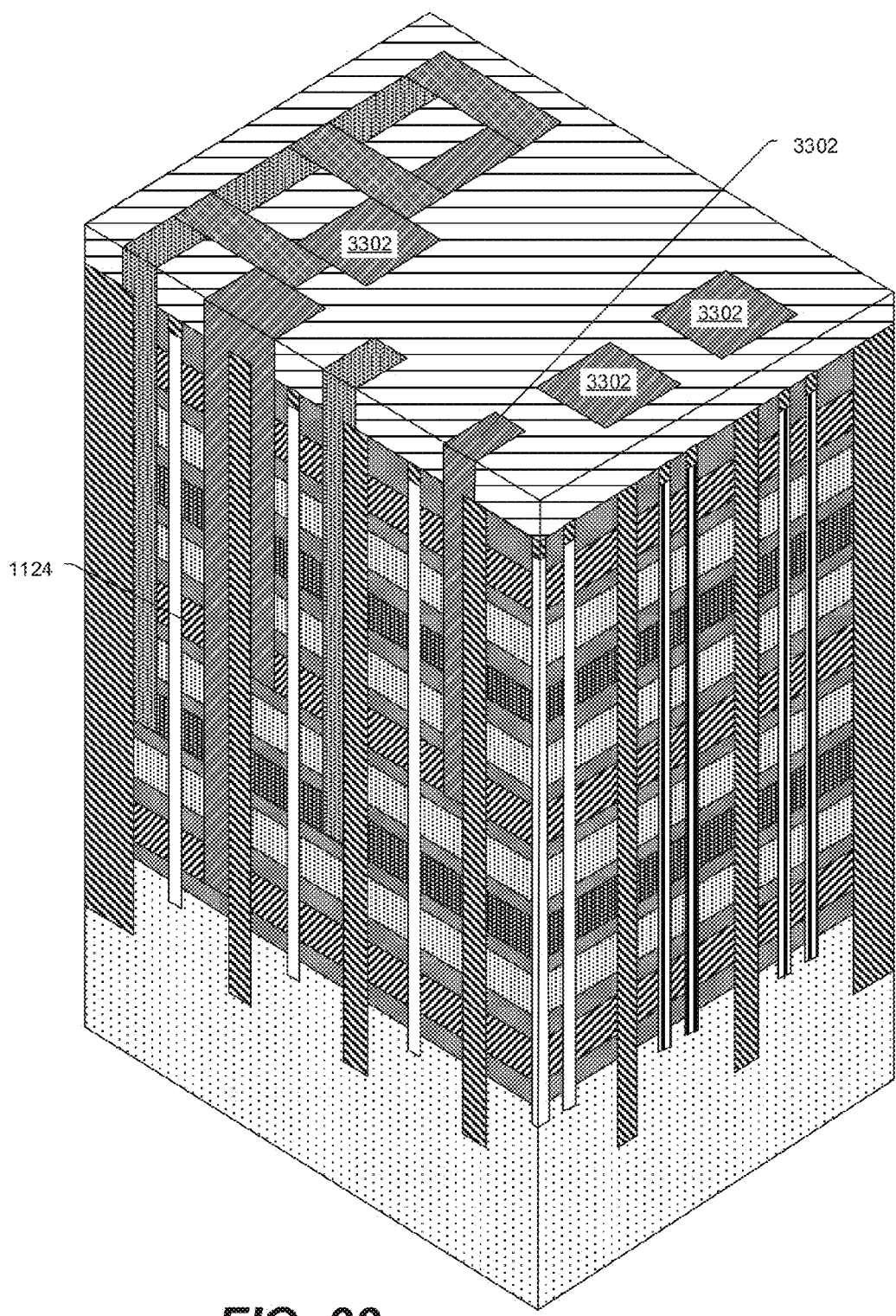
FIG. 33 is a diagram illustrating a fifth manufacturing stage of a process of manufacturing multiple variable strength nanowire FET stacks according to a particular aspect of the disclosure.

FIG. 33 is a diagram illustrating a fifth manufacturing stage of a process of manufacturing multiple variable strength nanowire FET stacks according to a particular aspect of the disclosure. The fifth manufacturing stage illustrated in FIG. 33 may be subsequent to the fourth manufacturing stage of FIG. 32.

In the fifth manufacturing stage of FIG. 33, second source access ways 3302 may be formed in the layer stack. For example, the second source access ways 3302 may be formed using a fourth series of selective etches. To illustrate, a fourth patterned resist layer or hardmask may be formed to guide a fourth set of selective etch processes to form openings in the layer stack corresponding to the second source access ways 3302. The fourth set of selective etch processes may extend to or into the second source region dummy layer 1124. Subsequently, one or more fourth fill materials may be deposited to fill the openings, forming the second source access ways 3302 as illustrated in FIG. 33. The fourth fill materials may be selected to have high etch selectivity relative to the dummy layers, relative to other fill materials, or both. The second source access ways 3302 may extend to or into the second source region dummy layer 1124. The second source access ways 3302 may include or correspond to the source access ways 702, 712, and 714 of FIG. 7, the source access ways 1602 and 1604 of FIG. 16, or a combination thereof.

Figure 34:
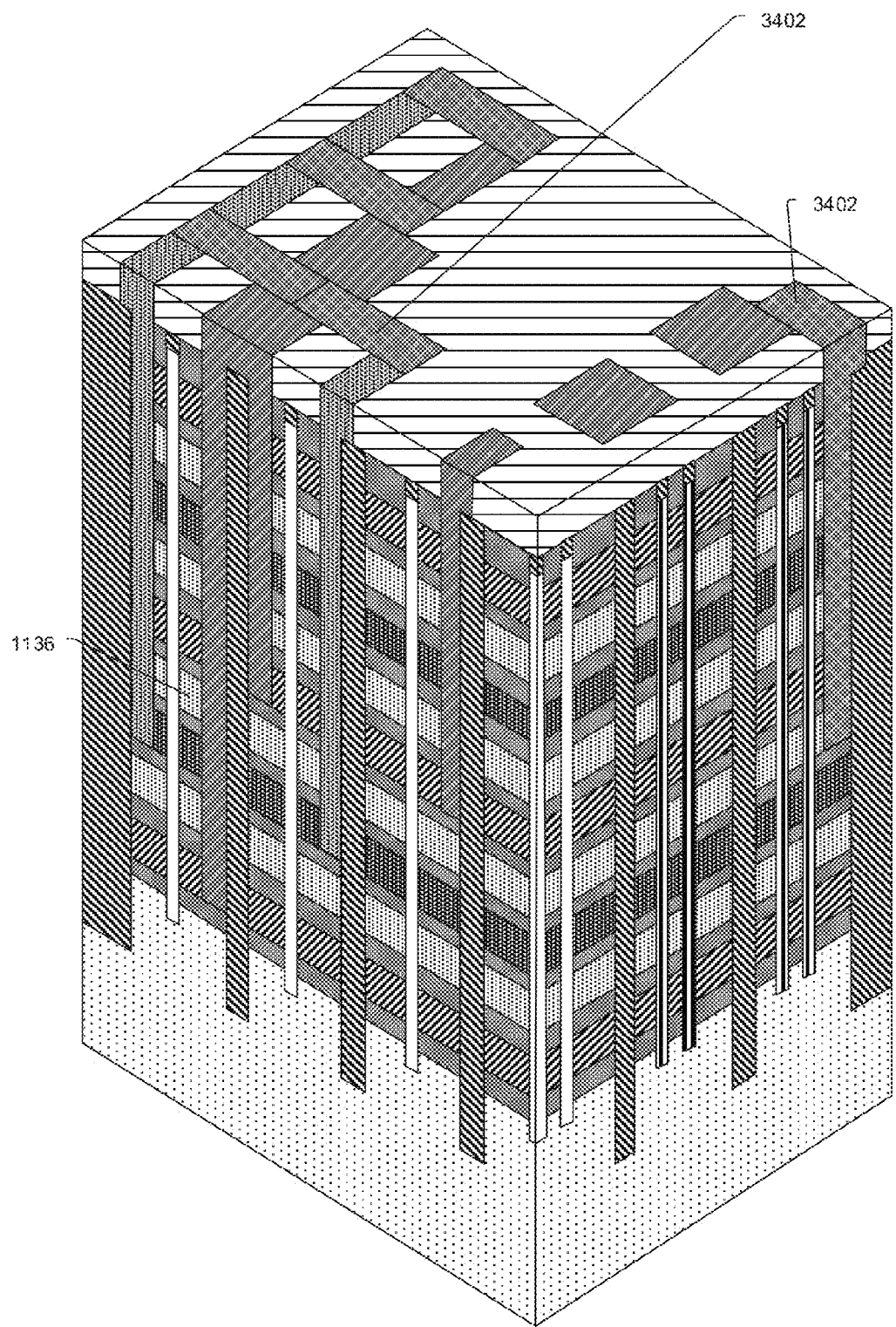
FIG. 34 is a diagram illustrating a sixth manufacturing stage of a process of manufacturing multiple variable strength nanowire FET stacks according to a particular aspect of the disclosure.

FIG. 34 is a diagram illustrating a sixth manufacturing stage of a process of manufacturing multiple variable strength nanowire FET stacks according to a particular aspect of the disclosure. The sixth manufacturing stage illustrated in FIG. 34 may be subsequent to the fifth manufacturing stage of FIG. 33.

In the sixth manufacturing stage of FIG. 34, second gate access ways 3402 may be formed in the layer stack. For example, the second gate access ways 3402 may be formed using a fifth series of selective etches. To illustrate, a fifth patterned resist layer or hardmask may be formed to guide a fifth set of selective etch processes to form openings in the layer stack corresponding to the second gate access ways 3402. The fifth set of selective etch processes may extend to or into the third gate region dummy layer 1136. Subsequently, one or more fifth fill materials may be deposited to fill the openings, forming the second gate access ways 3402 as illustrated in FIG. 34. The fifth fill materials may be selected to have high etch selectivity relative to the dummy layers, relative to other fill materials, or both. The second gate access ways 3402 may extend to or into the third gate region dummy layer 1136. The second gate access ways 3402 may include or correspond to the gate access ways 704, 710, and 716 of FIG. 7, the gate access ways 1502, 1504, and 1506 of FIG. 15, or a combination thereof.

Figure 35:
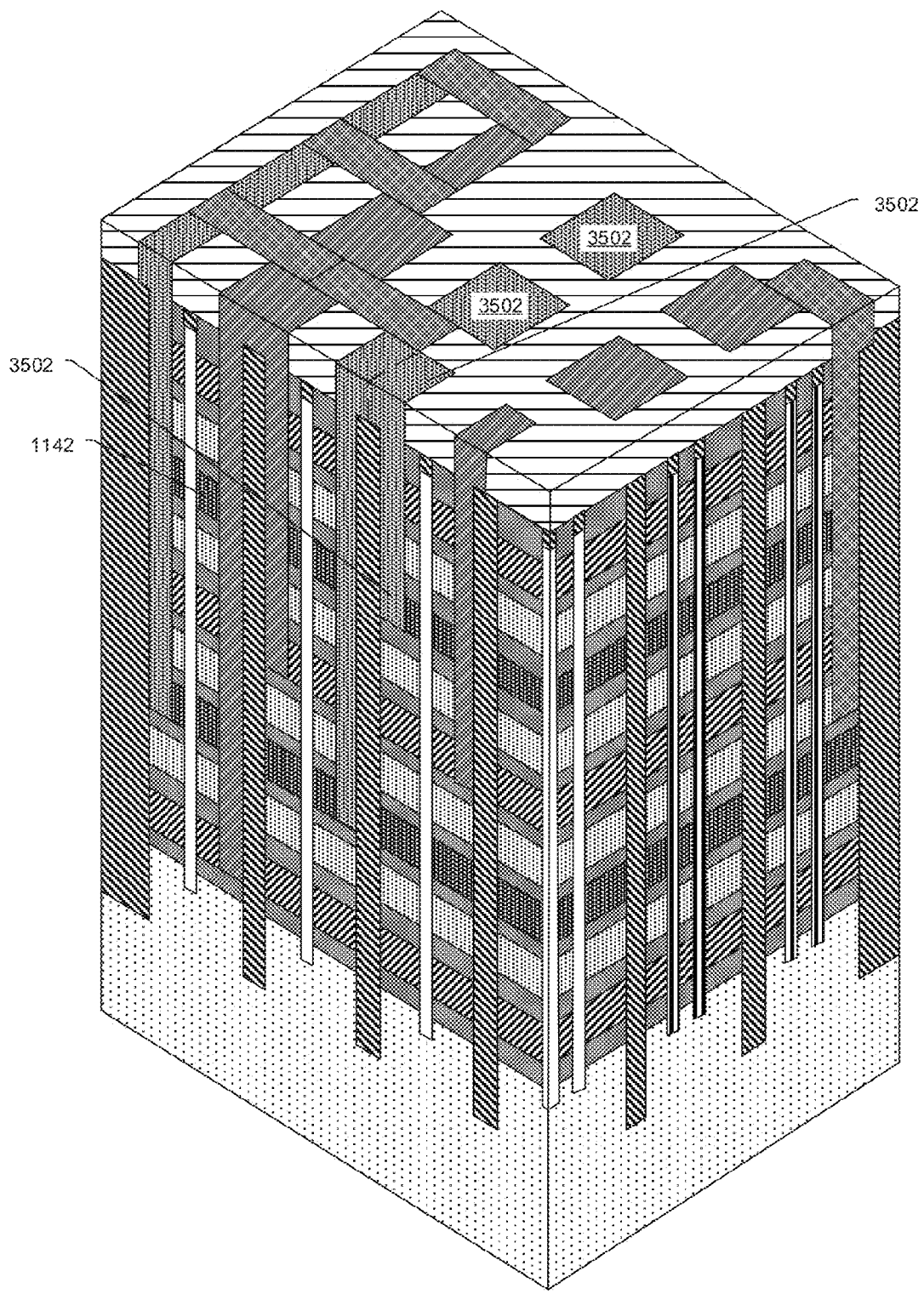
FIG. 35 is a diagram illustrating a seventh manufacturing stage of a process of manufacturing multiple variable strength nanowire FET stacks according to a particular aspect of the disclosure.

FIG. 35 is a diagram illustrating a seventh manufacturing stage of a process of manufacturing multiple variable strength nanowire FET stacks according to a particular aspect of the disclosure. The seventh manufacturing stage illustrated in FIG. 35 may be subsequent to the sixth manufacturing stage of FIG. 34.

In the seventh manufacturing stage of FIG. 35, second drain access ways 3502 may be formed in the layer stack. For example, the second drain access ways 3502 may be formed using a sixth series of selective etches. To illustrate, a sixth patterned resist layer or hardmask may be formed to guide a sixth set of selective etch processes to form openings in the layer stack corresponding to the second drain access ways 3502. The sixth set of selective etch processes may extend to or into the first drain region dummy layer 1142. Subsequently, one or more sixth fill materials may be deposited to fill the openings, forming the second drain access ways 3502 as illustrated in FIG. 35. The sixth fill materials may be selected to have high etch selectivity relative to the dummy layers, relative to other fill materials, or both. The second drain access ways 3502 may extend to or into the first drain region dummy layer 1142. The second drain access ways 3502 may include or correspond to the drain access ways 706, 708, and 718 of FIG. 7, the drain access ways 1702 and 1704 of FIG. 17, or a combination thereof.

Figure 36:
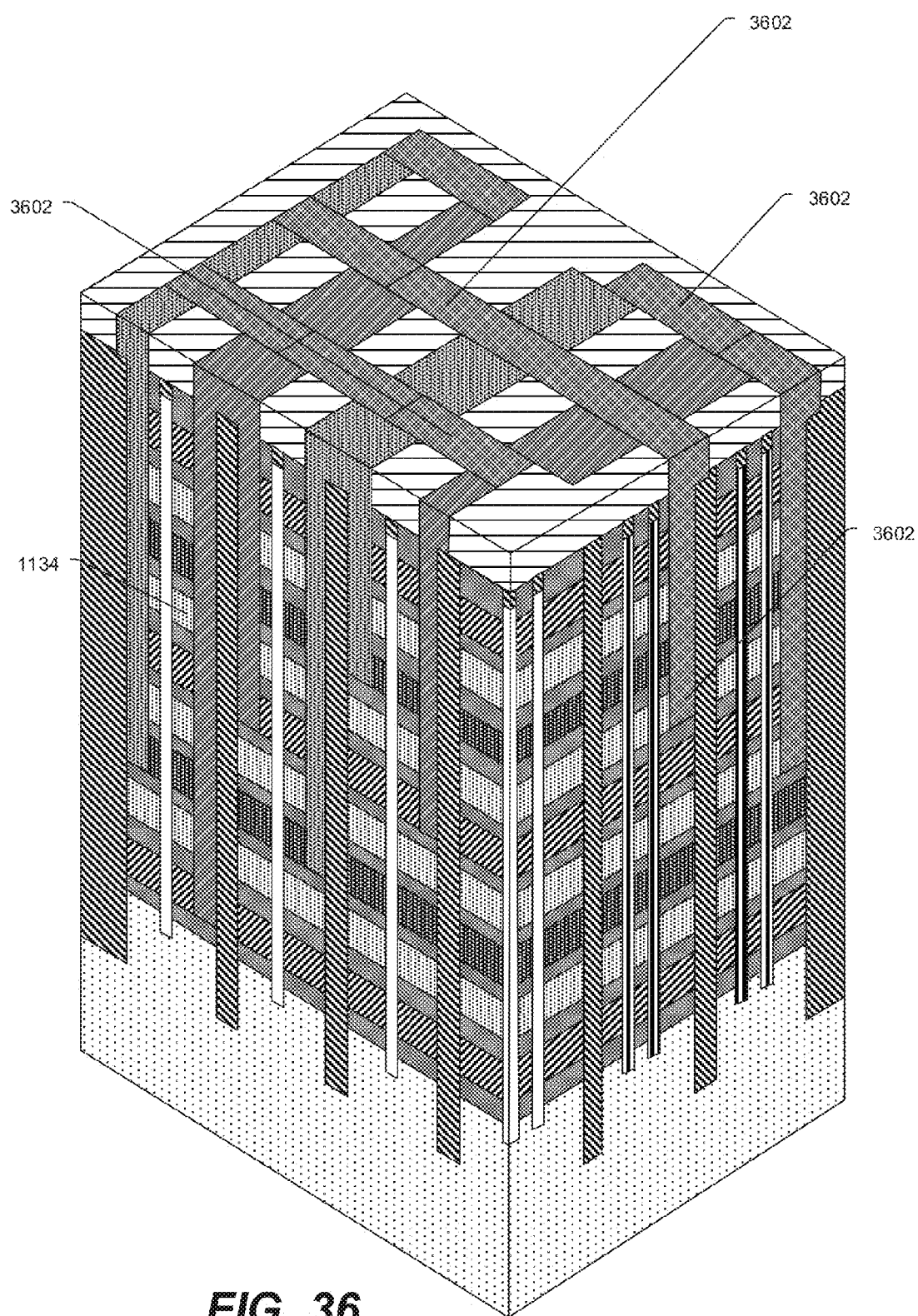
FIG. 36 is a diagram illustrating an eighth manufacturing stage of a process of manufacturing multiple variable strength nanowire FET stacks according to a particular aspect of the disclosure.

FIG. 36 is a diagram illustrating an eighth manufacturing stage of a process of manufacturing multiple variable strength nanowire FET stacks according to a particular aspect of the disclosure. The eighth manufacturing stage illustrated in FIG. 36 may be subsequent to the seventh manufacturing stage of FIG. 35.

In the eighth manufacturing stage of FIG. 36, third gate access ways 3602 may be formed in the layer stack. For example, the third gate access ways 3602 may be formed using a seventh series of selective etches. To illustrate, a seventh patterned resist layer or hardmask may be formed to guide a seventh set of selective etch processes to form openings in the layer stack corresponding to the third gate access ways 3602. The seventh set of selective etch processes may extend to or into the second gate region dummy layer 1134. Subsequently, one or more seventh fill materials may be deposited to fill the openings, forming the third gate access ways 3602 as illustrated in FIG. 36. The seventh fill materials may be selected to have high etch selectivity relative to the dummy layers, relative to other fill materials, or both. The third gate access ways 3602 may extend to or into the second gate region dummy layer 1134. The third gate access ways 3602 may include or correspond to the gate access ways 704, 710, and 716 of FIG. 7, the gate access ways 1502, 1504, and 1506 of FIG. 15, or a combination thereof.

Figure 37:
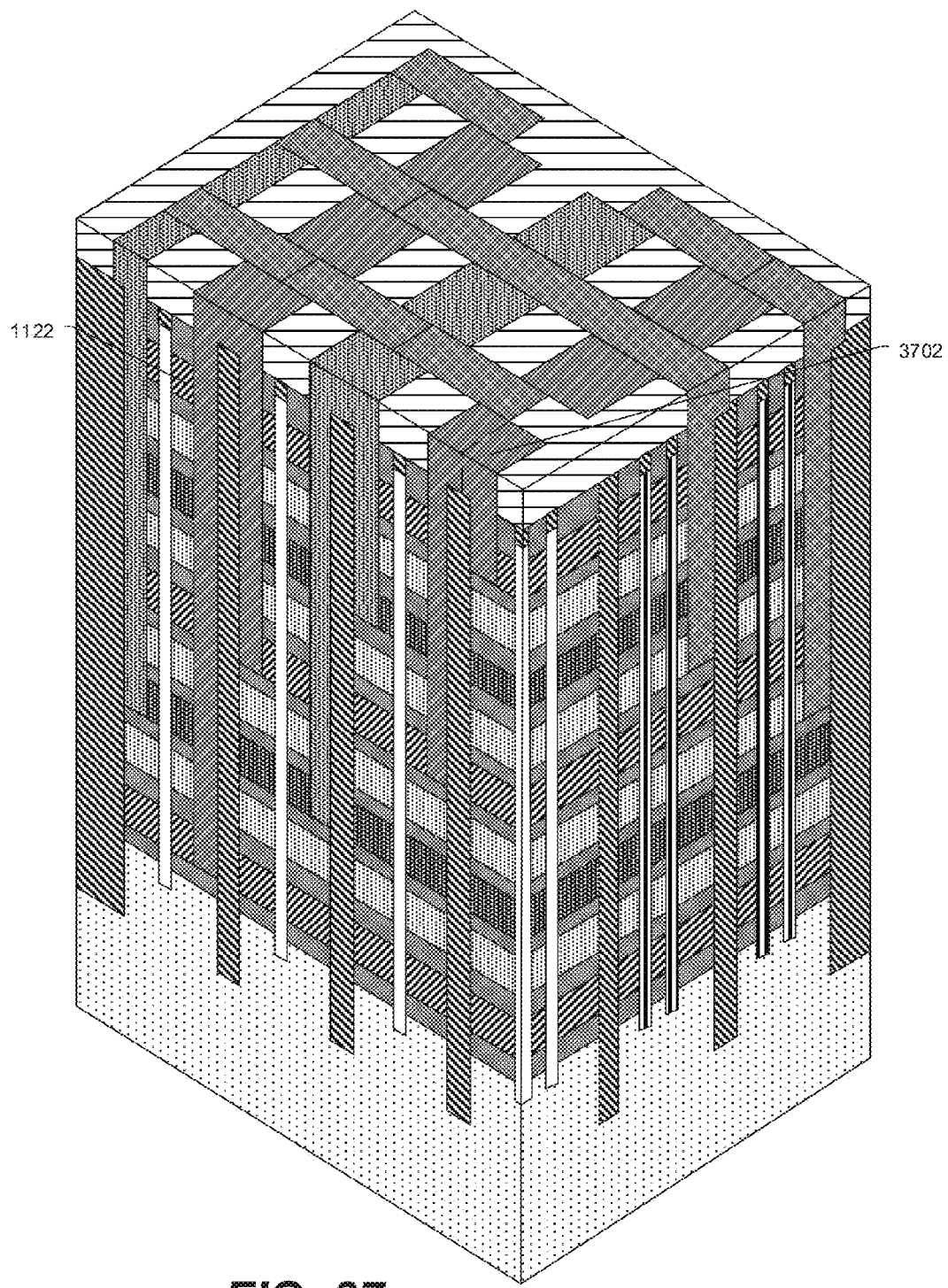
FIG. 37 is a diagram illustrating a ninth manufacturing stage of a process of manufacturing multiple variable strength nanowire FET stacks according to a particular aspect of the disclosure.

FIG. 37 is a diagram illustrating a ninth manufacturing stage of a process of manufacturing multiple variable strength nanowire FET stacks according to a particular aspect of the disclosure. The ninth manufacturing stage illustrated in FIG. 37 may be subsequent to the eighth manufacturing stage of FIG. 36.

In the ninth manufacturing stage of FIG. 37, third source access ways 3702 may be formed in the layer stack. For example, the third source access ways 3702 may be formed using an eighth series of selective etches. To illustrate, an eighth patterned resist layer or hardmask may be formed to guide an eighth set of selective etch processes to form openings in the layer stack corresponding to the third source access ways 3702. The eighth set of selective etch processes may extend to or into the first source region dummy layer 1122. Subsequently, one or more eighth fill materials may be deposited to fill the openings, forming the third source access ways 3702 as illustrated in FIG. 37. The eighth fill materials may be selected to have high etch selectivity relative to the dummy layers, relative to other fill materials, or both. The third source access ways 3702 may extend to or into the first source region dummy layer 1122. The third source access ways 3702 may include or correspond to the source access ways 702, 712, and 714 of FIG. 7, the source access ways 1602 and 1604 of FIG. 16, or a combination thereof.

Figure 38:
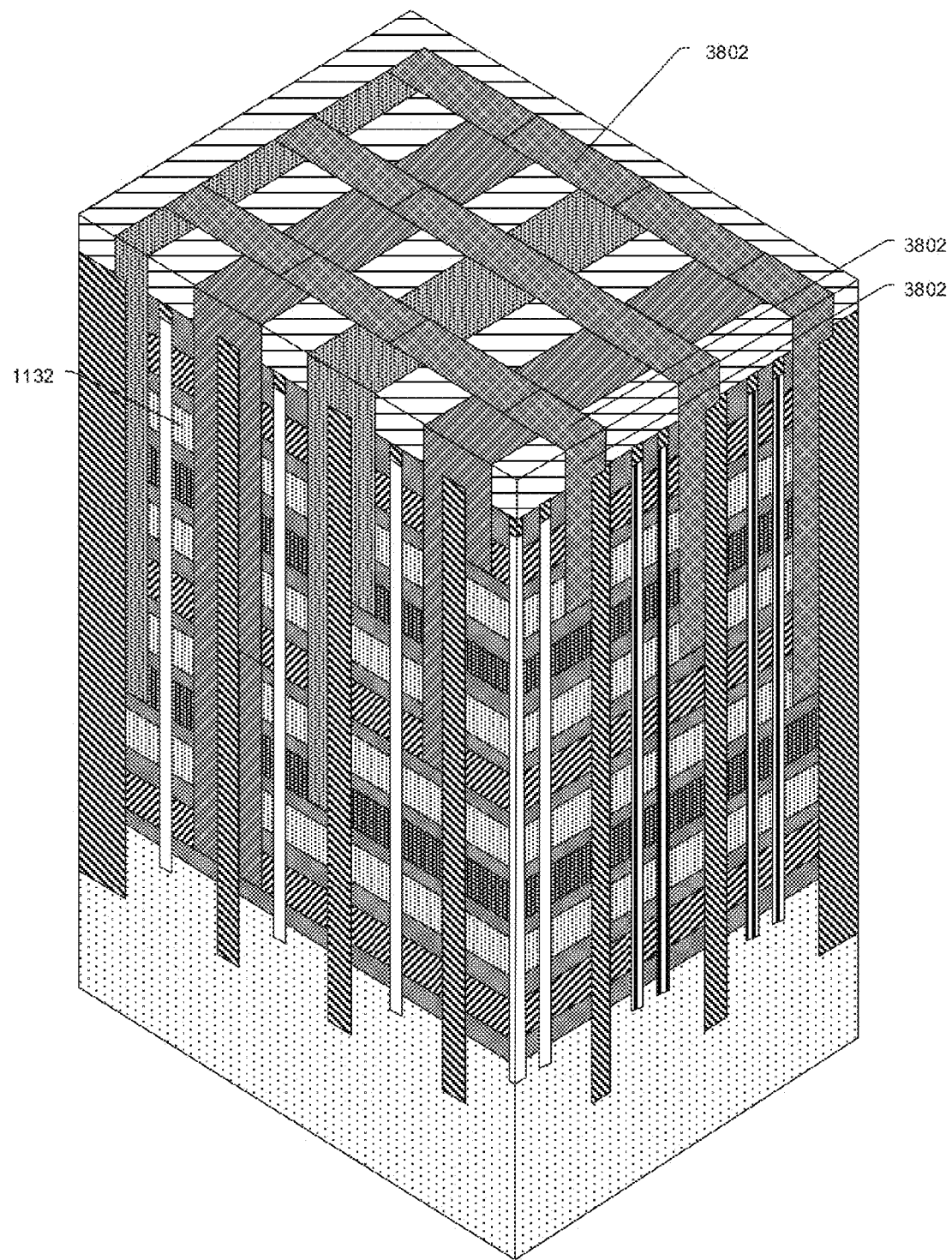
FIG. 38 is a diagram illustrating a tenth manufacturing stage of a process of manufacturing multiple variable strength nanowire FET stacks according to a particular aspect of the disclosure.

FIG. 38 is a diagram illustrating a tenth manufacturing stage of a process of manufacturing multiple variable strength nanowire FET stacks according to a particular aspect of the disclosure. The tenth manufacturing stage illustrated in FIG. 38 may be subsequent to the ninth manufacturing stage of FIG. 37.

In the tenth manufacturing stage of FIG. 38, fourth gate access ways 3802 may be formed in the layer stack. For example, the fourth gate access ways 3802 may be formed using a ninth series of selective etches. To illustrate, a ninth patterned resist layer or hardmask may be formed to guide a ninth set of selective etch processes to form openings in the layer stack corresponding to the fourth gate access ways 3802. The ninth set of selective etch processes may extend to or into the first gate region dummy layer 1132. Subsequently, one or more ninth fill materials may be deposited to fill the openings, forming the fourth gate access ways 3802 as illustrated in FIG. 38. The ninth fill materials may be selected to have high etch selectivity relative to the dummy layers, relative to other fill materials, or both. The fourth gate access ways 3802 may extend to or into the first gate region dummy layer 1132. The fourth gate access ways 3802 may include or correspond to the gate access ways 704, 710, and 716 of FIG. 7, the gate access ways 1502, 1504, and 1506 of FIG. 15, or a combination thereof.

The manufacturing stages of FIGS. 30-38 may include or correspond to the manufacturing stages of FIGS. 15-17. For example, the manufacturing stages of FIGS. 32, 34, 36, and 38 may correspond to the manufacturing stage of FIG. 15. The manufacturing stages of FIGS. 30, 33, and 37 may correspond to the manufacturing stage of FIG. 16. The manufacturing stages of FIGS. 31 and 35 may correspond to the manufacturing stages of FIG. 17. However, the manufacturing stages in FIGS. 30-38 are used to form access ways having varied lengths. In other implementations, the source access ways, gate access ways, and drain access ways may be formed in a different order.

Figure 39:
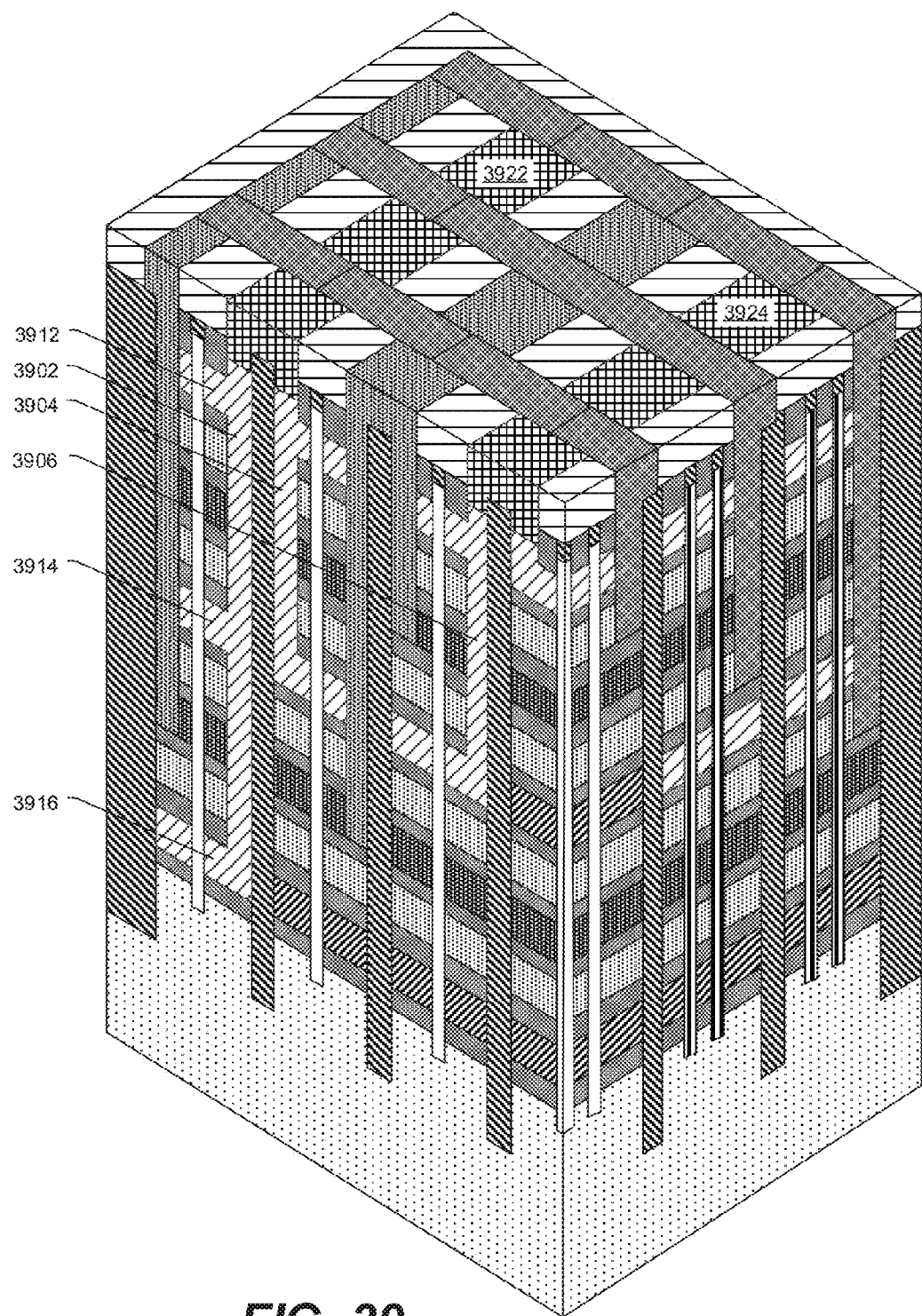
FIG. 39 is a diagram illustrating an eleventh manufacturing stage of a process of manufacturing multiple variable strength nanowire FET stacks according to a particular aspect of the disclosure.

FIG. 39 is a diagram illustrating an eleventh manufacturing stage of a process of manufacturing multiple variable strength nanowire FET stacks according to a particular aspect of the disclosure. The eleventh manufacturing stage illustrated in FIG. 39 may be subsequent to the tenth manufacturing stage of FIG. 38. The eleventh manufacturing stage of FIG. 39 may include or correspond to the eighth manufacturing stage of FIG. 18.

In the eleventh manufacturing stage of FIG. 39, source regions and source lines may be formed. For example, the source access ways 3002, 3302, and 3702 may be opened using an etch process. After the source access ways 3002, 3302, and 3702 are opened, the source region dummy layers 1122, 1124, and 1126 are exposed and may be etched. For example, a lateral (e.g., non-directional) etch process using chemistry that has high etch selectivity for material of the source region dummy layers 1122, 1124, and 1126 relative to materials of the gate region dummy layers 1132, 1134, 1136, and 1138, the drain region dummy layers 1142 and 1144, the pairs of nanowires 1202-1224, the isolation trenches 1152, and the isolation layers 1112 may be used to selectively etch the source region dummy layers 1122, 1124, and 1126. Etching the source region dummy layers 1122, 1124, and 1126 may expose portions of the pairs of nanowires 1202-1216 corresponding to the source regions. Additionally, surfaces of isolation layers 1112 adjacent to the source regions may be exposed.

After etching the source region dummy layers 1122, 1124, and 1126, source regions and source lines may be formed by depositing one or more materials. For example, an ALD process may be used to selectively form a monolayer on exposed surfaces as an isolation layer so that subsequently deposited metal layers (e.g., a Ti layer) are not shorted to other metal layers. In a particular implementation, the ALD process may deposit SiO, SiN, SiON, SiOCN, or another isolation material.

Additionally or in the alternative, Ti may be deposited for form a layer on the exposed surfaces, and W may be deposited to fill the remaining space. The Ti and W deposition processes fill the regions previously occupied by the source region dummy layers 1122, 1124, and 1126 and the source access ways 3002, 3302, and 3702, thereby forming source regions 3912, 3914, and 3916 and source lines 3902, 3904, 3906, and 3908. The source regions 3912, 3914, and 3916 may include or correspond to the source regions 812, 816, and 820 of FIG. 8, the source regions 1812, 1814, and 1816 of FIG. 18, or a combination thereof. The source lines 3902, 3904, 3906, and 3908 may include or correspond to the source lines 802, 804, and 806 of FIG. 8, the source lines 1802, 1804, 1806, and 1808 of FIG. 18, or a combination thereof.

Additionally, after forming the source regions 3912, 3914, and 3916 and the source lines 3902, 3904, 3906, and 3908, source caps 3922 and 3924 may be formed by depositing one or more materials. For example, a dielectric material may be deposited on an exposed portion of the source lines 3902, 3904, 3906, and 3908 to form the source caps 3922 and 3924. The source caps 3922 and 3924 may protect (e.g., insulate) the source lines 3902, 3904, 3906, and 3908 and the source regions 3912, 3914, and 3916.

Figure 40:
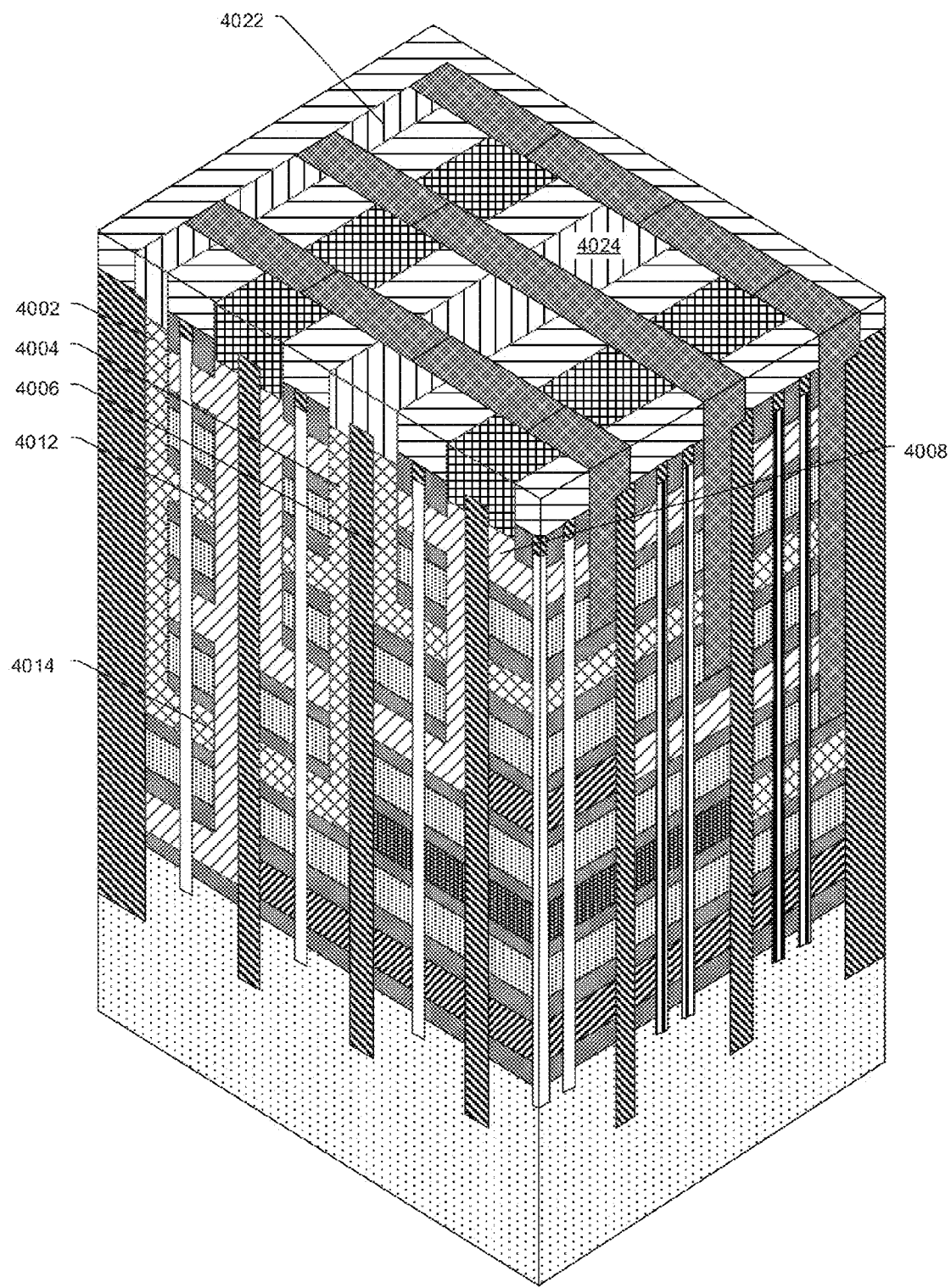
FIG. 40 is a diagram illustrating a twelfth manufacturing stage of a process of manufacturing multiple variable strength nanowire FET stacks according to a particular aspect of the disclosure.

FIG. 40 is a diagram illustrating a twelfth manufacturing stage of a process of manufacturing multiple variable strength nanowire FET stacks according to a particular aspect of the disclosure. The twelfth manufacturing stage illustrated in FIG. 40 may be subsequent to the eleventh manufacturing stage of FIG. 39. The twelfth manufacturing stage of FIG. 40 may include or correspond to the ninth manufacturing stage of FIG. 19.

In the twelfth manufacturing stage of FIG. 40, drain regions and drain lines may be formed. For example, the drain access ways 3102 and 3502 may be opened using an etch process. After the drain access ways 3102 and 3502 are opened, drain region dummy layers 1142 and 1144 are exposed and may be etched. For example, a lateral (e.g., non-directional) etch process using chemistry that has high etch selectivity for material of the drain region dummy layers 1142 and 1144 relative to materials of the gate region dummy layers 1132, 1134, 1136, and 1138, the source regions 3912, 3914, and 3916, the pairs of nanowires 1202-1224, the isolation trenches 1152, and the isolation layers 1112 may be used to selectively etch the drain region dummy layers 1142 and 1144. Etching the drain region dummy layers may expose portions of the pairs of nanowires 1202-1224 corresponding to the drain regions. Additionally, surfaces of isolation layers 1112 adjacent to the drain regions may be exposed.

After etching the drain region dummy layers 1142 and 1144, drain regions and drain lines may be formed by depositing one or more materials. For example, an ALD process may be used to selectively form a monolayer on exposed surfaces as an isolation layer so that subsequently deposited metal layers (e.g., a Ti layer) are not shorted to other metal layers. In a particular implementation, the ALD process may deposit SiO, SiN, SiON, SiOCN, or another isolation material. Additionally or in the alternative, Ti may be deposited for form a layer on the exposed surfaces, and W may be deposited to fill the remaining space. The Ti and W deposition processes fill the regions previously occupied by the drain region dummy layers 1142 and 1144 and the drain access ways 3102 and 3502, thereby forming drain regions 4012 and 4014 and drain lines 4002, 4004, and 4006. The drain regions 4012 and 4014 may include or correspond to the drain regions 914 and 918 of FIG. 9, the drain regions 1912 and 1914 of FIG. 19, or a combination thereof. The drain lines 4002, 4004, and 4006 may include or correspond to the drain lines 902, 904, and 906 of FIG. 9, the drain lines 1902, 1904, and 1906 of FIG. 19, or a combination thereof.

Additionally, after forming the drain regions 4012 and 4014 and the drain lines 4002, 4004, and 4006, drain caps 4022 and 4024 may be formed by depositing one or more materials. For example, a dielectric material may be deposited on an exposed portion of the drain lines 4002, 4004, and 4006 to form the drain caps 4022 and 4024. The drain caps 4022 and 4024 may protect (e.g., insulate) the drain lines 4002, 4004, and 4006 and the drain regions 4012 and 4014.

Figure 41:
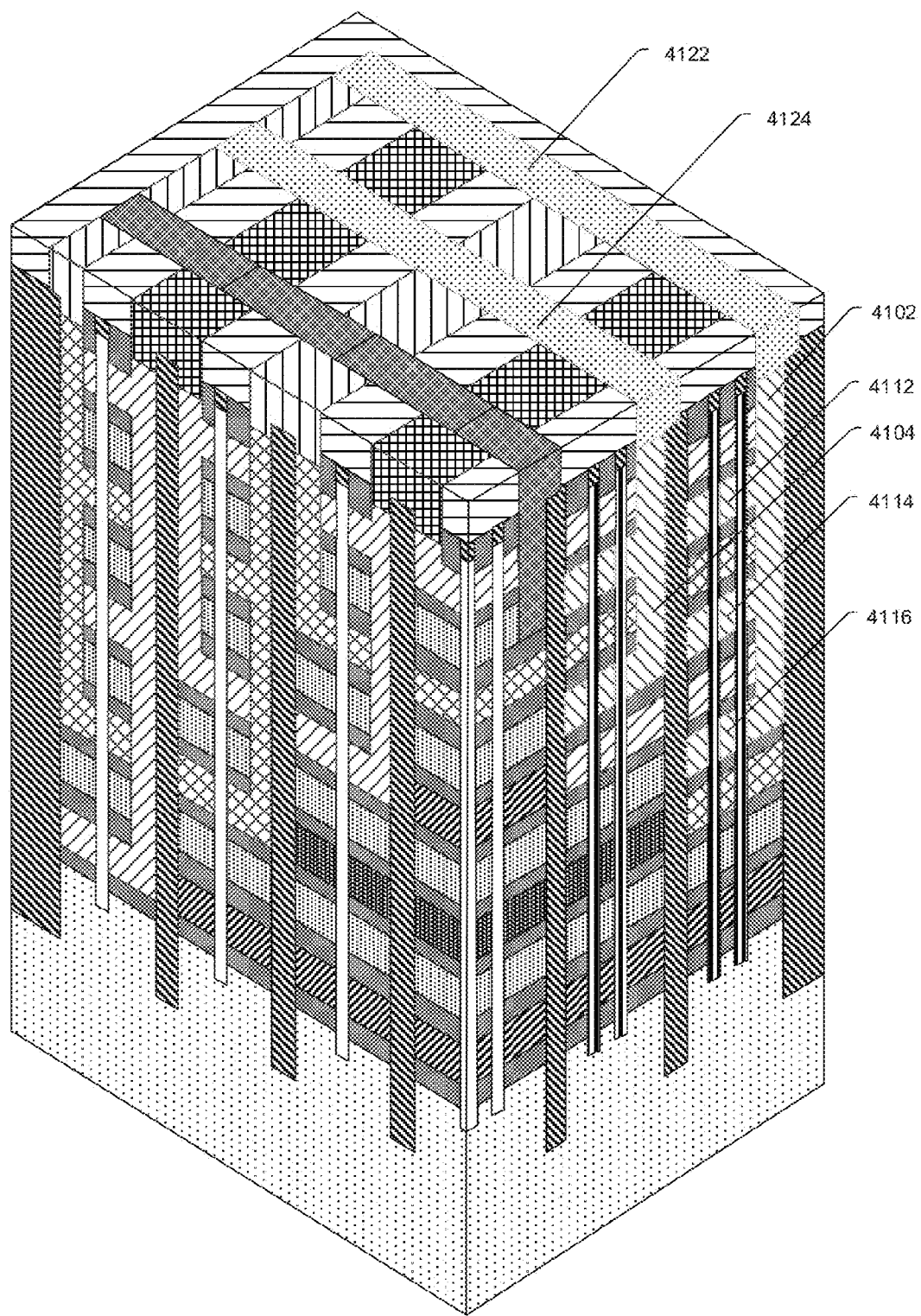
FIG. 41 is a diagram illustrating a thirteenth manufacturing stage of a process of manufacturing multiple variable strength nanowire FET stacks according to a particular aspect of the disclosure.

FIG. 41 is a diagram illustrating a thirteenth manufacturing stage of a process of manufacturing multiple variable strength nanowire FET stacks according to a particular aspect of the disclosure. The thirteenth manufacturing stage illustrated in FIG. 41 may be subsequent to the twelfth manufacturing stage of FIG. 40. The thirteenth manufacturing stage of FIG. 41 may include or correspond to the tenth manufacturing stage of FIG. 20.

In the thirteenth manufacturing stage of FIG. 41, PMOS gate regions and PMOS gate lines may be formed for nanowire FETs with a P-type nanowire. For example, portions (e.g., PMOS gate access ways) of the gate access ways 3202, 3402, 3602, and 3802 may be opened using an etch process. After the PMOS gate access ways are opened, portions (e.g., PMOS portions) of the gate region dummy layers 1132, 1134, 1136, and 1138 are exposed and may be etched. For example, a lateral (e.g., non-directional) etch process using chemistry that has high etch selectivity for material of the portions of the gate region dummy layers 1132, 1134, 1136, and 1138 relative to materials of the source regions 3912, 3914, and 3916, the drain regions 4012 and 4014, the pairs of nanowires 1202-1224, the isolation trenches 1152, and the isolation layers 1112 may be used to selectively etch the portions of the gate region dummy layers 1132, 1134, 1136, and 1138. Etching the portions of the gate region dummy layers 1132, 1134, 1136, and 1138 may expose portions of the pairs of nanowires 1202-1216 corresponding to the PMOS gate regions. Additionally, surfaces of isolation layers 1112 adjacent to the PMOS gate regions may be exposed.

After etching the portions of the gate region dummy layers 1132, 1134, 1136, and 1138, PMOS gate regions and PMOS gate lines may be formed by depositing one or more materials. Different materials may be used to form NMOS gate regions for nanowire FETs with an N-type nanowire as compared to materials used to form PMOS gate regions for nanowire FETs with a P-type nanowire. Thus, some gate access ways may be protected (e.g., using a hardmask) while others are opened. For example, the PMOS gate access ways (e.g., a portion of the gate access ways 3202, 3402, 3602, and 3802) may be opened while the NMOS gate access ways (e.g., another portion of the gate access ways 3202, 3402, 3602, and 3802) are protected with a hardmask. This enables etching portions of the gate region dummy layers in the first row of nanowire FET stacks 1182 and the second row of nanowire FET stacks 1184 without etching portions of the gate region dummy layers in the third row of nanowire FET stacks 1186. Formation of PMOS gate regions and gate lines for nanowire FETs with P-type nanowires may include depositing a first set of one or more materials after etching portions of the gate region dummy layers in areas associated with those nanowire FETs. Formation of NMOS gate regions and gate lines for nanowire FETs with N-type nanowires may include depositing a second set of one or more materials after etching portions of the gate region dummy layers in areas associated with those nanowire FETs, as described with reference to FIG. 42. The first set of one or more materials may be different from the second set of one or more materials. Alternatively, the first set of one or more materials may be the same as the second set of one or more materials.

For example, for nanowire FETs with P-type nanowires (such as the pairs of nanowires 1202-1216), after opening the PMOS gate access ways (e.g., portions of the gate access ways 3202, 3402, 3602, and 3802) and etching the portions of the gate region dummy layers 1132, 1134, 1136, and 1138 in the first row of nanowire FET stacks 1182 and the second row of nanowire FET stacks 1184, an ALD process may be used to selectively form a monolayer on exposed surfaces as an isolation layer so that subsequently deposited metal layers (e.g., a Ti layer) are not shorted to other metal layers. In a particular implementation, the ALD process may deposit SiO, SiN, SiON, SiOCN, or another isolation material. Additionally or in the alternative, interface layers may be formed on exposed nanowire surfaces. To illustrate, the interface layers may include an oxide (e.g., SiO) formed using a thermal oxidation process, an ALD oxidation process, or a chemical oxidation process.

After the interface layers are formed, HfO2 may be deposited to form a layer on the exposed surfaces. A layer of TiN may be deposited over the HfO2 layer, and W may be deposited to fill the remaining space. The deposition processes may fill the regions previously occupied by the PMOS gate access ways (e.g., a portion of the gate access ways 3202, 3402, 3602, and 3802) and the portions of the gate region dummy layers 1132, 1134, 1136, and 1138 in the first row of nanowire FET stacks 1182 and the second row of nanowire FET stacks 1184, thereby forming PMOS gate lines 4102 and 4104 and PMOS gate regions 4112, 4114, 4116, and 4118.

Additionally, after forming the PMOS gate regions 4112, 4114, 4116, and 4118 and the PMOS gate lines 4102 and 4104, PMOS gate caps 4122 and 4124 may be formed by depositing one or more materials. For example, a dielectric material may be deposited on an exposed portion of the PMOS gate lines 4102 and 4104 to form the PMOS gate caps 4122 and 4124. The PMOS gate caps 4122 and 4124 may protect (e.g., insulate) the PMOS gate lines 4102 and 4104 and the PMOS gate regions 4112, 4114, 4116, and 4118.

Figure 42:
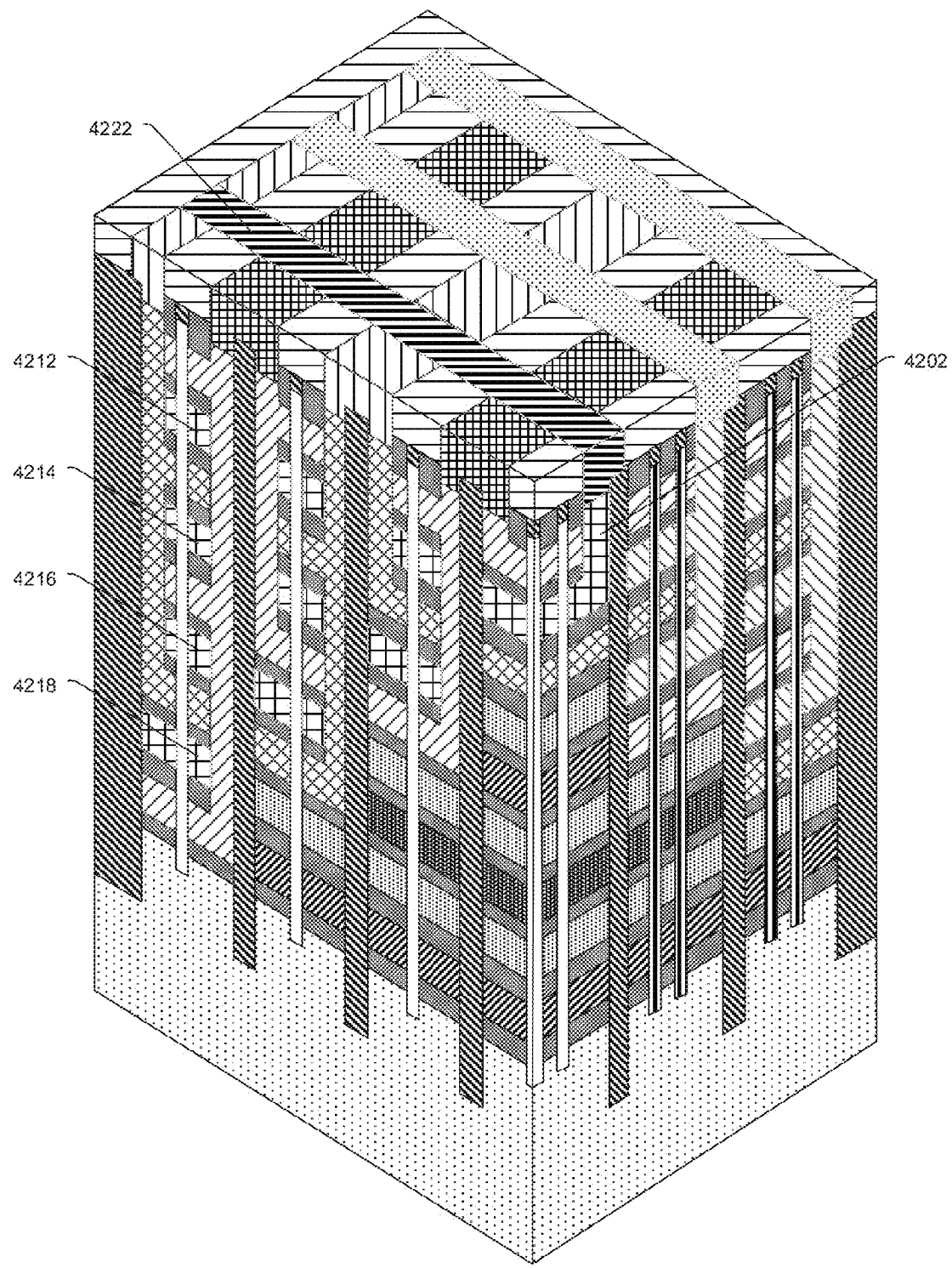
FIG. 42 is a diagram illustrating a fourteenth manufacturing stage of a process of manufacturing multiple variable strength nanowire FET stacks according to a particular aspect of the disclosure.

FIG. 42 is a diagram illustrating a fourteenth manufacturing stage of a process of manufacturing multiple variable strength nanowire FET stacks according to a particular aspect of the disclosure. The fourteenth manufacturing stage illustrated in FIG. 42 may be subsequent to the thirteenth manufacturing stage of FIG. 41. The fourteenth manufacturing stage of FIG. 42 may include or correspond to the eleventh manufacturing stage of FIG. 21.

In the fourteenth manufacturing stage of FIG. 41, NMOS gate regions and NMOS gate lines may be formed for nanowire FETs with an N-type nanowire. For example, portions (e.g., NMOS gate access ways) of the gate access ways 3202, 3402, 3602, and 3802 may be opened using an etch process. After the NMOS gate access ways are opened, portions (e.g., NMOS portions) of the gate region dummy layers 1132, 1134, 1136, and 1138 are exposed and may be etched. For example, a lateral (e.g., non-directional) etch process using chemistry that has high etch selectivity for material of the gate region dummy layers 1132, 1134, 1136, and 1138 relative to materials of the source regions 1812, 1814, and 1816, the drain regions 1912 and 1914, the pairs of nanowires 1218-1224, the isolation trenches 1152, and the isolation layers 1112 may be used to selectively etch the portions of the gate region dummy layers 1132, 1134, 1136, and 1138. Etching the portions of the gate region dummy layers 1132, 1134, 1136, and 1138 may expose portions of the pairs of nanowires 1218-1224 corresponding to the NMOS gate regions. Additionally, surfaces of isolation layers 1112 adjacent to the NMOS gate regions may be exposed.

After etching the portions of the gate region dummy layers 1132, 1134, 1136, and 1138, NMOS gate regions and NMOS gate lines may be formed by depositing one or more materials (e.g., the second set of one or more materials.

Different materials may be used to form the NMOS gate regions for nanowire FETs with an N-type nanowire as compared to materials used to form the PMOS gate regions for nanowire FETs with a P-type nanowire. Accordingly, some gate access ways may be protected (e.g., using a hardmask) while others are opened. For example, the PMOS gate access ways may be protected with a hardmask while the NMOS gate access ways is opened (e.g., etched). This enables etching portions of the gate region dummy layers in the third row of nanowire FET stacks 1186, without etching portions of the gate region dummy layers in the first row of nanowire FET stacks 1182 and the second row of nanowire FET stacks 1184. Formation of NMOS gate regions and NMOS gate lines for nanowire FETs with N-type nanowires may include depositing the second set of one or more materials after etching the portions of the gate region dummy layers in areas associated with those nanowire FETs.

For example, for nanowire FETs with N-type nanowires (such as the nanowires 1218-1224), after opening the NMOS gate access ways and etching the portions of the gate region dummy layers in the third row of nanowire FET stacks 1186, an ALD process may be used to selectively form a monolayer on exposed surfaces as an isolation layer so that subsequently deposited metal layers (e.g., a Ti layer) are not shorted to other metal layers. In a particular implementation, the ALD process may deposit SiO, SiN, SiON, SiOCN, or another isolation material. Additionally or in the alternative, interface layers may be formed on exposed nanowire surfaces. To illustrate, the interface layers may include an oxide (e.g., SiO) formed using a thermal oxidation process, an ALD oxidation process, or a chemical oxidation process.

After the interface layers are formed, HfO2 may be deposited to form a layer on the exposed surfaces. A layer of TiAl may be deposited over the HfO2 layer, a layer of TiN may be deposited over the TiAl layer, and W may be deposited to fill the remaining space. The deposition processes may fill the regions previously occupied by the NMOS gate access ways (e.g., the portions of the gate access ways 3202, 3402, 3602, and 3802 in the third row of nanowire FET stacks 1186) and may fill the region previously occupied by the portions of the gate region dummy layers 1132, 1134, 1136, and 1138 in the third row of nanowire FET stacks 1186, thereby forming NMOS gate line 4202 and NMOS gate regions 4212, 4214, 4216, and 4218.

Additionally, after forming the NMOS gate regions 4212, 4214, 4216, and 4218 and the NMOS gate line 4202, NMOS gate cap 4222 may be formed by depositing one or more materials. For example, a dielectric material may be deposited on an exposed portion of the NMOS gate line 4202 to form the NMOS gate cap 4222. The NMOS gate cap 4222 may protect (e.g., insulate) the NMOS gate line 4202 and the NMOS gate regions 4212, 4214, 4216, and 4218.

Figure 43:
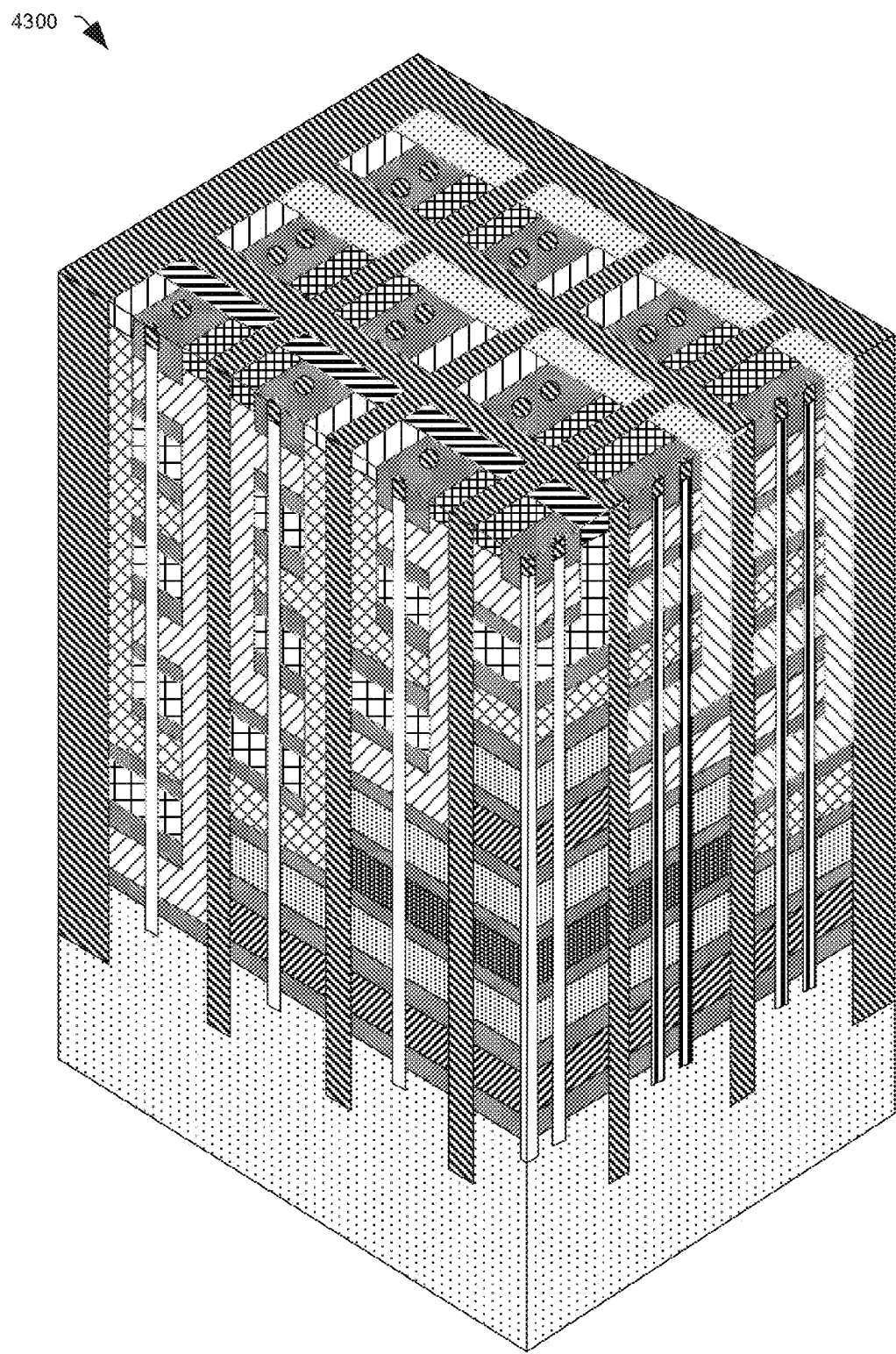
FIG. 43 is a diagram illustrating a fifteenth manufacturing stage of a process of manufacturing multiple variable strength nanowire FET stacks according to a particular aspect of the disclosure.

FIG. 43 is a diagram illustrating a fifteenth manufacturing stage of a process of manufacturing multiple variable strength nanowire FET stacks according to a particular aspect of the disclosure. The fifteenth manufacturing stage illustrated in FIG. 43 may be subsequent to the fourteenth manufacturing stage of FIG. 42. The fifteenth manufacturing stage of FIG. 43 may include or correspond to the twelfth manufacturing stage of FIG. 22.

After forming the gate regions and gate lines, the etch stop layer 1402, a portion of the isolation layer 1302, a portion of the isolation trenches 1154, a portion of the isolation layers 1112, a portion of the dielectric caps (e.g., the source caps 3922 and 3924, the drain caps 4022 and 4024, the PMOS gate caps 4122 and 4124, and the NMOS gate cap 4222), or a combination thereof, may be removed using one or more planarization processes, such as one or more CMP processes. For example, a first CMP process may remove a portion of the dielectric caps and a second CMP process may remove the etch stop layer 1402. A remaining portion or portions of the dielectric caps may insulate the structures (e.g., sources, gates, and drains) from being exposed. For example, the remaining portions of the dielectric caps may insulate the source lines 3902, 3904, 3906, and 3908 and the source regions 3912, 3914, and 3916. Performing the one or more planarization processes may produce an integrated circuit 4300.

After the one or more planarization process, the integrated circuit 4300, as illustrated in FIG. 43, may include or correspond to the integrated circuit 200 of FIG. 2, the integrated circuit 1000 of FIG. 10, the integrated circuit 2200 of FIG. 22, or a combination thereof. Alternative implementations described with reference to FIGS. 2-22 may also apply to the manufacturing process described with reference to FIGS. 29-43.

By etching access ways of different lengths, variable strength nanowire FET stacks may be formed. To illustrate, by etching the first gate access ways 3202 to extend to or into the fourth gate region dummy layer 1138 and etching the fourth gate access ways 3802 to extend to or into the first gate region dummy layer 1132, a first nanowire FET stack in the first column of nanowire FET stacks 1192 may have a greater number of nanowire FETs than a second nanowire FET stack in the fourth column of nanowire FET stacks 1198. A drive strength of each nanowire FET stack may be based on the number of nanowire FETs in the nanowire FET stack. Thus, the first nanowire FET stack may have a greater drive strength than the second nanowire FET stack. In other implementations, nanowire FET stacks may include another number of nanowire FETs (thereby having other drive strengths) based on design specifications.

Figure 44:
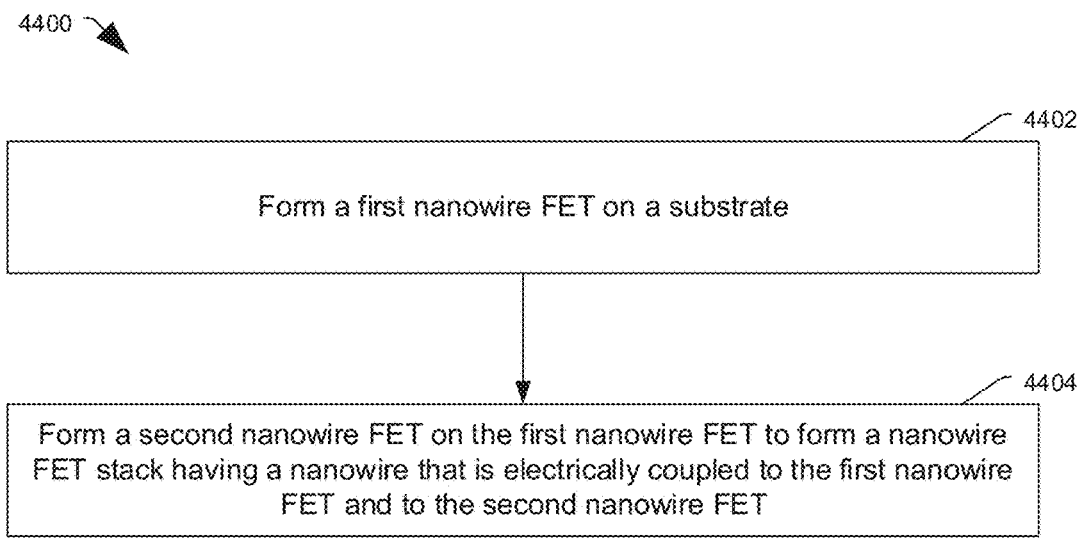
FIG. 44 is a flow chart of a particular illustrative implementation of a method of manufacturing a nanowire FET stack according to a particular aspect of the disclosure.

FIG. 44 is a flow chart of a particular illustrative implementation of a method 4400 of manufacturing a nanowire FET stack according to a particular aspect of the disclosure. The method 4400 may be used to form any one or more of the nanowire FET stacks 100, 120 and 140 of FIGS. 1A, 1B, and 1C, respectively. Additionally or in the alternative, the method 4400 may be used to form one or more of the integrated circuits 200, 300, 1000, 2200, and 4300 of FIGS. 2, 3, 10, 22 and 43, respectively.

The method 4400 includes, at 4402, forming a first nanowire FET on a substrate. The method 4400 includes, at 4404, forming a second nanowire FET on the first nanowire FET to form a nanowire FET stack having a nanowire that is electrically coupled to the first nanowire FET and to the second nanowire FET. For example, the first nanowire FET may include or correspond to the second nanowire FET 115 of FIG. 1A. In this example, the second nanowire FET may include or correspond to the first nanowire FET 114 of FIG. 1A, which is formed on the second nanowire FET 115 forming part of a nanowire FET stack that includes the nanowire 101 coupled to both the first nanowire FET 114 and the second nanowire FET 115. The first and second nanowire FETs may be formed concurrently, such as by using one or more processes described with reference to FIGS. 4-10, FIGS. 11-22, FIGS. 29-43, or a combination thereof. The first nanowire FET and the second nanowire FET form a nanowire FET stack, such as a vertical nanowire FET stack. In this context, vertical refers to extending substantially perpendicular to a surface of the substrate. The substrate may include or correspond to the substrate 202 of FIGS. 4-10, the substrate 1102 of FIGS. 11-22, the substrate 1102 of FIGS. 29-43, or a combination thereof.

Figure 45:
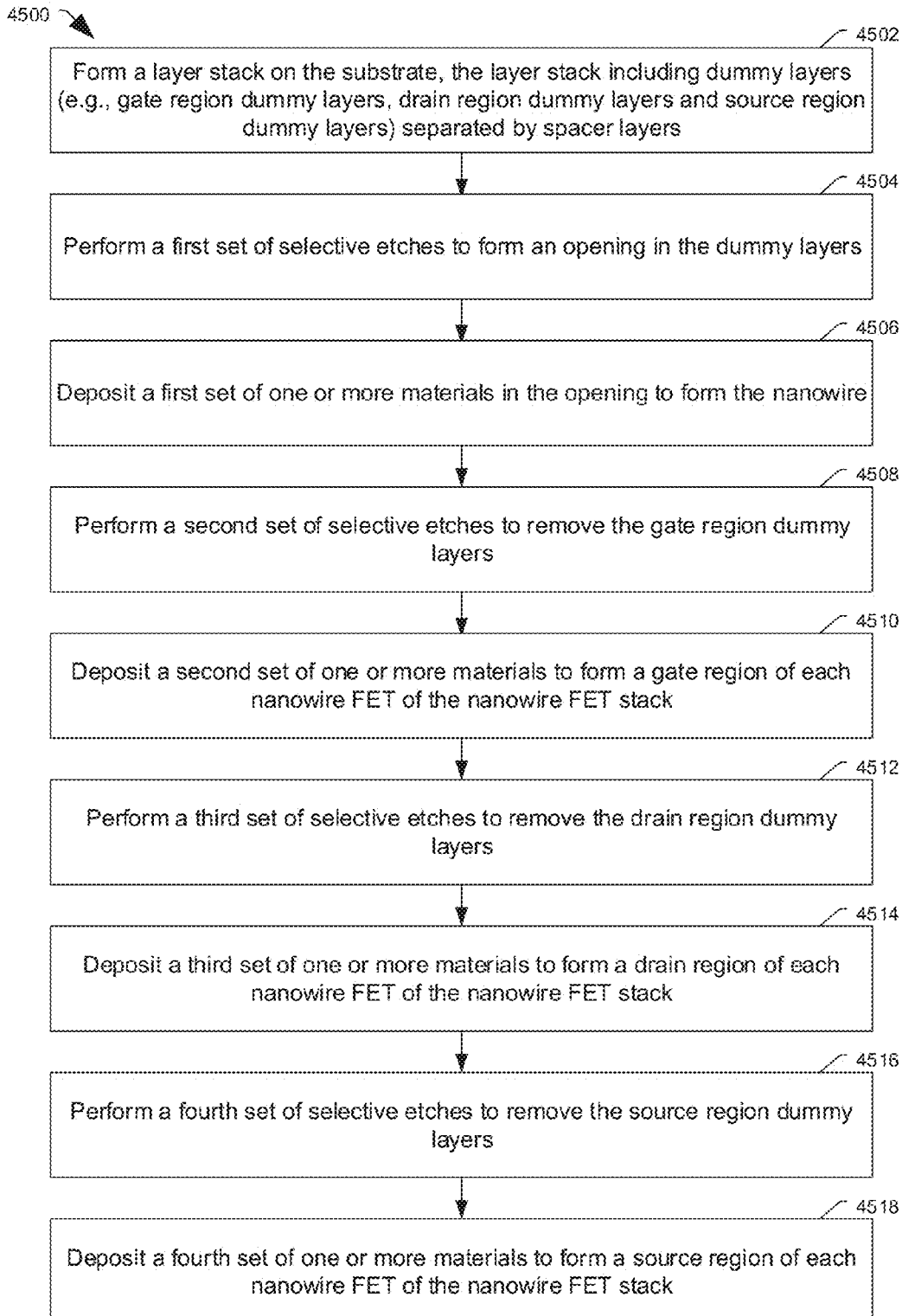
FIG. 45 is a flow chart of a particular illustrative implementation of a method of manufacturing a nanowire FET stack according to a particular aspect of the disclosure.

FIG. 45 is a flow chart of a particular illustrative implementation of a method of manufacturing a nanowire FET stack according to a particular aspect of the disclosure. The method 4500 may be used to form any one or more of the nanowire FET stacks 100, 120 and 140 of FIGS. 1A, 1B, and 1C, respectively. Additionally or in the alternative, the method 4500 may be used to form one or more of the integrated circuits 200, 300, 1000, 2200, and 4300 of FIGS. 2, 3, 10, 22 and 43, respectively.

The method 4500 includes, at 4502, forming a layer stack on a substrate. The layer stack includes dummy layers (e.g., gate region dummy layers, drain region dummy layers, and source region dummy layers) separated by spacer layers (e.g., isolation layers). For example, the layer stack may correspond to one or more of the layer stacks described with reference to FIGS. 4, 11, and 29.

The method 4500 also includes, at 4504, performing a first set of selective etches to form an opening in the dummy layers and, at 4506, depositing a first set of one or more materials in the opening to form the nanowire. For example, the nanowires may correspond to the nanowires 602, 604 and 606 of FIG. 6, the pairs of nanowires 1202-1224 of FIG. 12, or a combination thereof. The method 4500 may also include forming isolation trenches, such as the isolation trenches 502 and 504 of FIG. 5, the isolation trenches 1154 of FIG. 11, or a combination thereof, before forming the nanowires.

The method 4500 includes, at 4508, performing a second set of selective etches to remove the gate region dummy layers and, at 4510, depositing a second set of one or more materials to form a gate region of each nanowire FET of the nanowire FET stack. For example, the gate region may be formed as described with reference to FIGS. 7 and 10, FIGS. 15, 20, and 21, FIGS. 32, 34, 36, 38, 41, and 42, or a combination thereof.

The method 4500 also includes, at 4512, performing a third set of selective etches to remove the drain region dummy layers and, at 4514, depositing a third set of one or more materials to form a drain region of each nanowire FET of the nanowire FET stack. For example, the drain region may be formed as described with reference to FIGS. 7 and 9, FIGS. 17 and 19, FIGS. 31, 35, and 40, or a combination thereof.

The method 4500 also includes, at 4516, performing a fourth set of selective etches to remove the source region dummy layers and, at 4518, depositing a fourth set of one or more materials to form a source region of each nanowire FET of the nanowire FET stack. For example, the source region may be formed as described with reference to FIGS. 7 and 8, FIGS. 16 and 18, FIGS. 30, 33, 37, and 39, or a combination thereof.

Referring to FIG. 46, a block diagram of a particular illustrative implementation of a wireless communication device is depicted and generally designated 4600. The wireless communication device 4600 includes a processor 4610, such as a digital signal processor (DSP), coupled to a memory 4632 (e.g., a random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium). The processor 4610, the memory 4632 or another component of the device 4600 includes an integrated circuit 4664 with at least one vertical nanowire FET stack. For example, the integrated circuit 4664 may include or correspond to the nanowire FET stack 100 of FIG. 1A, the nanowire FET stack 120 of FIG. 1B, the nanowire FET stack 140 of FIG. 1C, the integrated circuit 200 of FIG. 2, the integrated circuit 300 of FIG. 3, another integrated circuit formed by the process described with references to FIGS. 4-10, another integrated circuit formed by the process described with references to FIGS. 11-22, another integrated circuit formed by the process described with references to FIGS. 29-43, or a combination thereof. To illustrate, the integrated circuit 4664 may include or correspond to a portion of processing logic of the processor 4610. In another illustrative example, the integrated circuit 4664 may include or correspond to a portion of memory circuitry or control circuitry of the memory 4632.

FIG. 46 also shows a display controller 4626 that is coupled to the processor 4610 and to a display 4628. A coder/decoder (CODEC) 4634 may also be coupled to the processor 4610. A speaker 4636 and a microphone 4638 may be coupled to the CODEC 4634.

FIG. 46 also indicates that a wireless controller 4640 may be coupled to the processor 4610 and may be further coupled to an antenna 4642. In a particular implementation, the processor 4610, the display controller 4626, the memory 4632, the CODEC 4634, and the wireless controller 4640 are included in a system-in-package or system-on-chip device 4622. In a particular implementation, an input device 4630 and a power supply 4644 are coupled to the system-on-chip device 4622. Moreover, in a particular implementation, as illustrated in FIG. 46, the display 4628, the input device 4630, the speaker 4636, the microphone 4638, the antenna 4642, and the power supply 4644 are external to the system-on-chip device 4622. However, each of the display 4628, the input device 4630, the speaker 4636, the microphone 4638, the antenna 4642, and the power supply 4644 may be coupled to a component of the system-on-chip device 4622, such as an interface or a controller.

In conjunction with the described implementations, a system is disclosed that may include means for means for supporting an integrated circuit, such as the substrate 202 of FIGS. 2-10, the substrate 1102 of FIGS. 11-22, the substrate 1102 of FIGS. 29-43, one or more other devices configured to support an integrated circuit (e.g., a bulk silicon wafer or die), or any combination thereof.

The system may also include first means for providing charge carriers coupled to the means for supporting. For example, the first means for providing charge carriers may include or correspond to one or more of source regions, such as the source region layers 102, 106 and 110 of FIGS. 1A, 1B, and 1C, the source regions 812, 816, and 820 of FIG. 10, the source regions 1812, 1814, and 1816 of FIG. 18, the source regions 3912, 3914, and 3916 of FIG. 39, one or more other devices or circuits configured to provide charge carriers, or any combination thereof. The system also includes means for collecting charge carriers coupled to the means for supporting. For example, the means for collecting charge carriers may correspond to or include one or more of drain regions, such as the drain region layers 104 and 108 of FIGS. 1A, 1B, and 1C, the third drain region layer 124 of FIG. 1B, the drain regions 914 and 918 of FIG. 10, the drain regions 1912 and 1914 of FIG. 19, the drain regions 4012 and 4014 of FIG. 40, one or more other devices or circuits configured to collect charge carriers, or any combination thereof.

The system also includes first means for controlling a conductive channel, such as one or more gate regions. For example, the first means for controlling a conductive channel may include or correspond to the gate region layers 103, 105, 107, and 109 of FIGS. 1A, 1B, and 1C, the gate region 1013, 1015, 1017, and 1019 of FIG. 10, the PMOS gate regions 2012, 2014, 2016, and 2018 of FIG. 20, the NMOS gate regions 2112, 2114, 2116, and 2118 of FIG. 21, the PMOS gate regions 4112, 4114, 4116, and 4118 of FIG. 41, the NMOS gate regions 4212, 4214, 4216, and 4218 of FIG. 42, one or more other devices or circuits configured to controlling a conductive channel, or any combination thereof. The first means for controlling the conductive channel may be positioned between the first means for providing charge carriers and the means for collecting charge carriers.

The system also includes second means for providing charge carriers coupled to the means for supporting. For example, the second means for providing charge carriers may include or correspond to one or more of source regions, such as the source region layers 102, 106 and 110 of FIGS. 1A, 1B, and 1C, the source regions 812, 816, and 820 of FIG. 10, the source regions 1812, 1814, and 1816 of FIG. 18, the source regions 3912, 3914, and 3916 of FIG. 39, one or more other devices or circuits configured to provide charge carriers, or any combination thereof.

The system also includes second means for controlling a conductive channel, such as one or more gate regions. For example, the second means for controlling a conductive channel may include or correspond to the gate region layers 103, 105, 107, and 109 of FIGS. 1A, 1B, and 1C, the gate region 1013, 1015, 1017, and 1019 of FIG. 10, the PMOS gate regions 2012, 2014, 2016, and 2018 of FIG. 20, the NMOS gate regions 2112, 2114, 2116, and 2118 of FIG. 21, the PMOS gate regions 4112, 4114, 4116, and 4118 of FIG. 41, the NMOS gate regions 4212, 4214, 4216, and 4218 of FIG. 42, one or more other devices or circuits configured to controlling a conductive channel, or any combination thereof. The second means for controlling the conductive channel is positioned between the second means for providing charge carriers and the means for collecting charge carriers.

The system also includes means for forming the conductive channel coupled to the first means for providing charge carriers, to the first means for controlling the conductive channel, to the means for collecting charge carriers, to the second means for controlling the conductive channel, and to the second means for providing charge carriers. The means for forming the conductive channel may include or correspond to one or more nanowires, such as the nanowire 101 of FIGS. 1A, 1B, and 1C, the nanowire 142 of FIG. 1C, the nanowires 602, 604, and 606 of FIG. 10, the pairs of nanowires 1202-1224 of FIG. 12, one or more other devices or circuits configured to forming a conductive channel, or any combination thereof. The means for forming the conductive channel has a dimension parallel to a surface of the means for supporting of less than 100 nanometers.

In conjunction with the described implementations, a system is disclosed that may include means for means for supporting an integrated circuit, such as the substrate 202 of FIGS. 2-10, the substrate 1102 of FIGS. 11-22, the substrate 1102 of FIGS. 29-43, one or more other devices configured to support an integrated circuit (e.g., a bulk silicon wafer or die), or any combination thereof. The system also includes first means for collecting charge carriers coupled to the means for supporting. For example, the means for collecting charge carriers may correspond to or include one or more of drain regions, such as the drain region layers 104 and 108 of FIGS. 1A, 1B, and 1C, the third drain region layer 124 of FIG. 1B, the drain regions 914 and 918 of FIG. 10, the drain regions 1912 and 1914 of FIG. 19, the drain regions 4012 and 4014 of FIG. 40, one or more other devices or circuits configured to collect charge carriers, or any combination thereof.

The system may also include means for providing charge carriers coupled to the means for supporting. For example, the means for providing charge carriers may include or correspond to one or more of source regions, such as the source region layers 102, 106 and 110 of FIGS. 1A, 1B, and 1C, the source regions 812, 816, and 820 of FIG. 10, the source regions 1812, 1814, and 1816 of FIG. 18, the source regions 3912, 3914, and 3916 of FIG. 39, one or more other devices or circuits configured to provide charge carriers, or any combination thereof.

The system also includes first means for controlling a conductive channel, such as one or more gate regions. For example, the first means for controlling a conductive channel may include or correspond to the gate region layers 103, 105, 107, and 109 of FIGS. 1A, 1B, and 1C, the gate region 1013, 1015, 1017, and 1019 of FIG. 10, the PMOS gate regions 2012, 2014, 2016, and 2018 of FIG. 20, the NMOS gate regions 2112, 2114, 2116, and 2118 of FIG. 21, the PMOS gate regions 4112, 4114, 4116, and 4118 of FIG. 41, the NMOS gate regions 4212, 4214, 4216, and 4218 of FIG. 42, one or more other devices or circuits configured to controlling a conductive channel, or any combination thereof. The first means for controlling the conductive channel may be positioned between the means for providing charge carriers and the first means for collecting charge carriers.

The system also includes second means for collecting charge carriers coupled to the means for supporting. For example, the second means for collecting charge carriers may include or correspond to one or more of drain regions, such as the drain region layers 104 and 108 of FIGS. 1A, 1B, and 1C, the third drain region layer 124 of FIG. 1B, the drain regions 914 and 918 of FIG. 10, the drain regions 1912 and 1914 of FIG. 19, the drain regions 4012 and 4014 of FIG. 40, one or more other devices or circuits configured to collect charge carriers, or any combination thereof.

The system also includes second means for controlling a conductive channel, such as one or more gate regions. For example, the second means for controlling a conductive channel may include or correspond to the gate region layers 103, 105, 107, and 109 of FIGS. 1A, 1B, and 1C, the gate region 1013, 1015, 1017, and 1019 of FIG. 10, the PMOS gate regions 2012, 2014, 2016, and 2018 of FIG. 20, the NMOS gate regions 2112, 2114, 2116, and 2118 of FIG. 21, the PMOS gate regions 4112, 4114, 4116, and 4118 of FIG. 41, the NMOS gate regions 4212, 4214, 4216, and 4218 of FIG. 42, one or more other devices or circuits configured to controlling a conductive channel, or any combination thereof. The second means for controlling the conductive channel is positioned between the second means for collecting charge carriers and the means for providing charge carriers.

The system also includes means for forming the conductive channel coupled to the first means for collecting charge carriers, to the first means for controlling the conductive channel, to the means for providing charge carriers, to the second means for controlling the conductive channel, and to the second means for collecting charge carriers. The means for forming the conductive channel may include or correspond to one or more nanowires, such as the nanowire 101 of FIGS. 1A, 1B, and 1C, the nanowire 142 of FIG. 1C, the nanowires 602, 604, and 606 of FIG. 10, the pairs of nanowires 1202-1224 of FIG. 12, one or more other devices or circuits configured to forming a conductive channel, or any combination thereof. The means for forming the conductive channel has a dimension parallel to a surface of the means for supporting of less than 100 nanometers.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then integrated into electronic devices, as described further with reference to FIG. 47.

Referring to FIG. 47, a particular illustrative implementation of an electronic device manufacturing (e.g., fabricating) process is depicted and generally designated 4700. Physical device information 4702 is received at the manufacturing process 4700, such as at a research computer 4706. The physical device information 4702 may include design information representing at least one physical property of a semiconductor device, such as the nanowire FET stacks 100, 120, 140 of FIGS. 1A, 1B and 1C, the integrated circuits 200 or 300 of FIGS. 2 and 3, the integrated circuit 1000 of FIG. 10, the integrated circuit 2200 of FIG. 22, the integrated circuit 4300 of FIG. 4300, or any combination thereof. For example, the physical device information 4702 may include physical parameters, material characteristics, and structure information that is entered via a user interface 4704 coupled to the research computer 4706. The research computer 4706 includes a processor 4708, such as one or more processing cores, coupled to a computer readable medium (e.g., a non-transitory computer-readable storage medium), such as a memory 4710. The memory 4710 may store computer readable instructions that are executable to cause the processor 4708 to transform the physical device information 4702 to comply with a file format and to generate a library file 4712.

In a particular implementation, the library file 4712 includes at least one data file including the transformed design information. For example, the library file 4712 may include a library of semiconductor devices including a device that includes the nanowire FET stacks 100, 120, 140 of FIGS. 1A, 1B and 1C, the integrated circuits 200 or 300 of FIGS. 2 and 3, the integrated circuit 1000 of FIG. 10, the integrated circuit 2200 of FIG. 22, the integrated circuit 4300 of FIG. 4300, or any combination thereof, that is provided for use with an electronic design automation (EDA) tool 4720.

The library file 4712 may be used in conjunction with the EDA tool 4720 at a design computer 4714 including a processor 4716, such as one or more processing cores, coupled to a memory 4718. The EDA tool 4720 may be stored as processor executable instructions at the memory 4718 to enable a user of the design computer 4714 to design a circuit including the nanowire FET stacks 100, 120, 140 of FIGS. 1A, 1B and 1C, the integrated circuits 200 or 300 of FIGS. 2 and 3, the integrated circuit 1000 of FIG. 10, the integrated circuit 2200 of FIG. 22, the integrated circuit 4300 of FIG. 4300, or any combination thereof, of the library file 4712. For example, a user of the design computer 4714 may enter circuit design information 4722 via a user interface 4724 coupled to the design computer 4714. The circuit design information 4722 may include design information representing at least one physical property of a semiconductor device, such as nanowire FET stacks 100, 120, 140 of FIGS. 1A, 1B and 1C, the integrated circuits 200 or 300 of FIGS. 2 and 3, the integrated circuit 1000 of FIG. 10, the integrated circuit 2200 of FIG. 22, the integrated circuit 4300 of FIG. 4300, or any combination thereof. To illustrate, the circuit design property may include identification of particular circuits and relationships to other elements in a circuit design, positioning information, feature size information, interconnection information, or other information representing a physical property of a semiconductor device.

The design computer 4714 may be configured to transform the design information, including the circuit design information 4722, to comply with a file format. To illustrate, the file format may include a database binary file format representing planar geometric shapes, text labels, and other information about a circuit layout in a hierarchical format, such as a Graphic Data System (GDSII) file format. The design computer 4714 may be configured to generate a data file including the transformed design information, such as a GDSII file 4726 that includes information describing the nanowire FET stacks 100, 120, 140 of FIGS. 1A, 1B and 1C, the integrated circuits 200 or 300 of FIGS. 2 and 3, the integrated circuit 1000 of FIG. 10, the integrated circuit 2200 of FIG. 22, the integrated circuit 4300 of FIG. 4300, or any combination thereof, in addition to other circuits or information. To illustrate, the data file may include information corresponding to a system-on-chip (SOC) that includes the nanowire FET stacks 100, 120, 140 of FIGS. 1A, 1B and 1C, the integrated circuits 200 or 300 of FIGS. 2 and 3, the integrated circuit 1000 of FIG. 10, the integrated circuit 2200 of FIG. 22, the integrated circuit 4300 of FIG. 4300, or any combination thereof, and that also includes additional electronic circuits and components within the SOC.

The GDSII file 4726 may be received at a fabrication process 4728 to fabricate the nanowire FET stacks 100, 120, 140 of FIGS. 1A, 1B and 1C, the integrated circuits 200 or 300 of FIGS. 2 and 3, the integrated circuit 1000 of FIG. 10, the integrated circuit 2200 of FIG. 22, the integrated circuit 4300 of FIG. 4300, or any combination thereof, according to transformed information in the GDSII file 4726. For example, a device manufacturing process may include providing the GDSII file 4726 to a mask manufacturer 4730 to create one or more masks, such as masks to be used with photolithography processing, illustrated as a representative mask 4732. The mask 4732 may be used during the fabrication process to generate one or more wafers 4733, which may be tested and separated into dies, such as a representative die 4736. The die 4736 includes a circuit including a device that includes the nanowire FET stacks 100, 120, 140 of FIGS. 1A, 1B and 1C, the integrated circuits 200 or 300 of FIGS. 2 and 3, the integrated circuit 1000 of FIG. 10, the integrated circuit 2200 of FIG. 22, the integrated circuit 4300 of FIG. 4300, or any combination thereof.

For example, the fabrication process 4728 may include a processor 4734 and a memory 4735 to initiate, control, or a combination thereof, the fabrication process 4728. The memory 4735 may include executable instructions such as computer-readable instructions or processor-readable instructions. The executable instructions may include one or more instructions that are executable by a computer such as the processor 4734. In a particular implementation, the executable instructions may cause a computer to perform the method 4400 of FIG. 44 or the method 4500 of FIG. 45 or at least a portion thereof.

The fabrication process 4728 may be implemented by a fabrication system that is fully automated or partially automated. For example, the fabrication process 4728 may be automated according to a schedule. The fabrication system may include fabrication equipment (e.g., processing tools) to perform one or more operations to form a semiconductor device. For example, the fabrication equipment may be configured to deposit one or more materials using vapor deposition (e.g., chemical vapor deposition (CVD), physical vapor deposition (PVD), or a combination thereof), pattern materials using a single-mask or multi-mask litho-etch process (e.g., two-mask LELE), pattern materials using a litho-freeze-litho-etch (LFLE) process, pattern materials using a self-aligned double patterning (SADP) process, epitaxially grow one or more materials, conformally deposit one or more materials, apply a hardmask, apply an etching mask, perform etching, perform planarization, form a dummy gate stack, form a gate stack, perform a standard clean 1 type, etc. In a particular implementation, the fabrication process 4728 corresponds to a semiconductor manufacturing process associated with a technology node smaller than 14 nm (e.g., 10 nm, 7 nm, etc.). The specific process or combination of processes used to manufacture a device (e.g., including the nanowire FET stacks 100, 120, 140 of FIGS. 1A, 1B and 1C, the integrated circuits 200 or 300 of FIGS. 2 and 3, the integrated circuit 1000 of FIG. 10, the integrated circuit 2200 of FIG. 22, the integrated circuit 4300 of FIG. 4300, or any combination thereof) may be based on design constraints and available materials/equipment. Thus, in particular implementations, different processes may be used than described with reference to FIGS. 1A-46 during manufacture of the device.

As an illustrative example, a two-mask LELE process used during Vial formation for the nanowire FET stacks 100, 120, 140 of FIGS. 1A, 1B and 1C, the integrated circuits 200 or 300 of FIGS. 2 and 3, the integrated circuit 1000 of FIG. 10, the integrated circuit 2200 of FIG. 22, the integrated circuit 4300 of FIG. 4300, or a combination thereof, may include using a first photoresist mask to form a first pattern on a first layer (e.g., a nitride layer) of a device and etching the first pattern. A second mask may then be used to form a second pattern on the device and the combined pattern may be etched down to a second, lower layer (e.g., an oxide layer) of the device. In the combined pattern, features (e.g., lines) of the first pattern and the second pattern may be interleaved. The combined pattern may thus have smaller feature (e.g., line) pitch as compared to the first pattern and the second pattern.

As another illustrative example, a SADP process used to pattern an M1 or M2 layer of the nanowire FET stacks 100, 120, 140 of FIGS. 1A, 1B and 1C, the integrated circuits 200 or 300 of FIGS. 2 and 3, the integrated circuit 1000 of FIG. 10, the integrated circuit 2200 of FIG. 22, the integrated circuit 4300 of FIG. 4300, or a combination thereof, may include forming a "dummy" pattern on a device. A conforming dielectric layer may be formed (e.g., deposited) over the dummy pattern and may be etched. During etching, all of the dielectric layer except "spacers" of dielectric material adjacent to sidewalls of the dummy pattern may be removed. The dummy pattern may then be removed (e.g., without etching), leaving behind the spacers, which may form a pattern that has higher feature (e.g., line) density than the dummy pattern. The higher-density spacer pattern may be used to pattern the M1 or M2 layer.

The fabrication system (e.g., an automated system that performs the fabrication process 4728) may have a distributed architecture (e.g., a hierarchy). For example, the fabrication system may include one or more processors, such as the processor 4734, one or more memories, such as the memory 4735, controllers, or a combination thereof, that are distributed according to the distributed architecture. The distributed architecture may include a high-level processor that controls or initiates operations of one or more low-level systems. For example, a high-level portion of the fabrication process 4728 may include one or more processors, such as the processor 4734, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level. Each of the one or more low-level systems may be associated with one or more corresponding pieces of fabrication equipment (e.g., processing tools). In a particular implementation, the fabrication system may include multiple processors that are distributed in the fabrication system. For example, a controller of a low-level system component may include a processor, such as the processor 4734.

Alternatively, the processor 4734 may be a part of a high-level system, subsystem, or component of the fabrication system. In another implementation, the processor 4734 includes distributed processing at various levels and components of a fabrication system.

The executable instructions included in the memory 4735 may enable the processor 4734 to form (or initiate formation of) the nanowire FET stacks 100, 120, 140 of FIGS. 1A, 1B and 1C, the integrated circuits 200 or 300 of FIGS. 2 and 3, the integrated circuit 1000 of FIG. 10, the integrated circuit 2200 of FIG. 22, the integrated circuit 4300 of FIG. 4300, or a combination thereof. In a particular implementation, the memory 4735 is a non-transitory computer-readable medium storing computer-executable instructions that are executable by the processor 4734 to cause the processor 4734 to initiate formation of a device in accordance with at least a portion of the method 4400 of FIG. 44 or the method 4500 of FIG. 45. For example, the computer executable instructions may be executable to cause the processor 4734 to initiate formation of the nanowire FET stacks 100, 120, 140 of FIGS. 1A, 1B and 1C, the integrated circuits 200 or 300 of FIGS. 2 and 3, the integrated circuit 1000 of FIG. 10, the integrated circuit 2200 of FIG. 22, the integrated circuit 4300 of FIG. 4300, or a combination thereof. As an illustrative example, the processor 4734 may initiate or control one or more steps of the method 4400 of FIG. 44 or the method 4500 of FIG. 45.

The die 4736 may be provided to a packaging process 4738 where the die 4736 is incorporated into a representative package 4740. For example, the package 4740 may include the single die 4736 or multiple dies, such as a system-in-package (SiP) arrangement. The package 4740 may be configured to conform to one or more standards or specifications, such as Joint Electron Device Engineering Council (JEDEC) standards.

Information regarding the package 4740 may be distributed to various product designers, such as via a component library stored at a computer 4746. The computer 4746 may include a processor 4748, such as one or more processing cores, coupled to a memory 4750. A printed circuit board (PCB) tool may be stored as processor executable instructions at the memory 4750 to process PCB design information 4742 received from a user of the computer 4746 via a user interface 4744. The PCB design information 4742 may include physical positioning information of a packaged semiconductor device on a circuit board, the packaged semiconductor device corresponding to the package 4740 including the nanowire FET stacks 100, 120, 140 of FIGS. 1A, 1B and 1C, the integrated circuits 200 or 300 of FIGS.

2 and 3, the integrated circuit 1000 of FIG. 10, the integrated circuit 2200 of FIG. 22, the integrated circuit 4300 of FIG. 4300, or any combination thereof.

The computer 4746 may be configured to transform the PCB design information 4742 to generate a data file, such as a GERBER file 4752 with data that includes physical positioning information of a packaged semiconductor device on a circuit board, as well as layout of electrical connections such as traces and vias, where the packaged semiconductor device corresponds to the package 4740 including the nanowire FET stacks 100, 120, 140 of FIGS. 1A, 1B and 1C, the integrated circuits 200 or 300 of FIGS. 2 and 3, the integrated circuit 1000 of FIG. 10, the integrated circuit 2200 of FIG. 22, the integrated circuit 4300 of FIG. 4300, or any combination thereof. In other implementations, the data file generated by the transformed PCB design information may have a format other than a GERBER format.

The GERBER file 4752 may be received at a board assembly process 4754 and used to create PCBs, such as a representative PCB 4756, manufactured in accordance with the design information stored within the GERBER file 4752. For example, the GERBER file 4752 may be uploaded to one or more machines to perform various steps of a PCB production process. The PCB 4756 may be populated with electronic components including the package 4740 to form a representative printed circuit assembly (PCA) 4758.

The PCA 4758 may be received at a product manufacturing process 4760 and integrated into one or more electronic devices, such as a first representative electronic device 4762 and a second representative electronic device 4764. For example, the first representative electronic device 4762, the second representative electronic device 4764, or both, may include or correspond to the wireless communication device 4600 of FIG. 46. As an illustrative, non-limiting example, the first representative electronic device 4762, the second representative electronic device 4764, or both, may include a communications device, a fixed location data unit, a mobile location data unit, a mobile phone, a cellular phone, a satellite phone, a computer, a tablet, a portable computer, or a desktop computer. Alternatively or additionally, the first representative electronic device 4762, the second representative electronic device 4764, or both, may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof, into which the into which the nanowire FET stacks 100, 120, 140 of FIGS. 1A, 1B and 1C, the integrated circuits 200 or 300 of FIGS. 2 and 3, the integrated circuit 1000 of FIG. 10, the integrated circuit 2200 of FIG. 22, the integrated circuit 4300 of FIG. 4300, or a combination thereof, is integrated.

As another illustrative, non-limiting example, one or more of the electronic devices 4762 and 4764 may include remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 47 illustrates remote units according to teachings of the disclosure, the disclosure is not limited to these illustrated units. Implementations of the disclosure may be suitably employed in any device which includes active integrated circuitry including memory and on-chip circuitry. For example, one or more of the electronic device 4762 and 4764 may include cars, trucks, airplanes, boats, other vehicles, or appliances, such as refrigerators, microwaves, washing machines, security systems, other appliances, or a combination thereof. In a particular implementation, one or more of the electronic device 4762 and 4764 may utilize memory, wireless communication, or a combination thereof.

A device that includes the nanowire FET stacks 100, 120, 140 of FIGS. 1A, 1B and 1C, the integrated circuits 200 or 300 of FIGS. 2 and 3, the integrated circuit 1000 of FIG. 10, the integrated circuit 2200 of FIG. 22, the integrated circuit 4300 of FIG. 4300, or any combination thereof, may be fabricated, processed, and incorporated into an electronic device, as described in the illustrative process 4700. One or more aspects of the implementations disclosed with respect to FIGS. 1A-13 may be included at various processing stages, such as within the library file 4712, the GDSII file 4726 (e.g., a file having a GDSII format), and the GERBER file 4752 (e.g., a file having a GERBER format), as well as stored at the memory 4710 of the research computer 4706, the memory 4718 of the design computer 4714, the memory 4750 of the computer 4746, the memory of one or more other computers or processors (not shown) used at the various stages, such as at the board assembly process 4754, and also incorporated into one or more other physical implementations such as the mask 4732, the die 4736, the package 4740, the PCA 4758, other products such as prototype circuits or devices (not shown), or any combination thereof. Although various representative stages of production from a physical device design to a final product are depicted, in other implementations fewer stages may be used or additional stages may be included. Similarly, the process 4700 may be performed by a single entity or by one or more entities performing various stages of the process 4700.

Although one or more of FIGS. 1A-47 may illustrate systems, devices, methods, or a combination thereof, according to the teachings of the disclosure, the disclosure is not limited to these illustrated systems, devices, methods, or a combination thereof. Implementations of the disclosure may be suitably employed in any device that includes integrated circuitry including memory, a processor, and on-chip circuitry.

One or more functions or components of any of FIGS. 1A-47 as illustrated or described herein may be combined with one or more other portions of another of FIGS. 1A-47. Accordingly, no single implementation described herein should be construed as limiting and implementations of the disclosure may be suitably combined without departing form the teachings of the disclosure.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the implementations disclosed herein may be included directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal. A storage device is not a signal.

The previous description of the disclosed implementations is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. A device comprising:
   a substrate;
   a first nanowire field effect transistor (FET);
   a second nanowire FET positioned between the substrate and the first nanowire FET;
   a first nanowire electrically coupled to the first nanowire FET and to the second nanowire FET;
   a common source line coupled to a source region of each of the first nanowire FET and the second nanowire FET;
   a common drain line coupled to a drain region of each of the first nanowire FET and the second nanowire FET; and
   a common gate line coupled to a gate region of each of the first nanowire FET and the second nanowire FET.

2. The device of claim 1, further comprising multiple nanowires, the multiple nanowires including the first nanowire, wherein each of the multiple nanowires extends in a direction substantially perpendicular to a surface of the substrate.

3. The device of claim 2, wherein each of the multiple nanowires is electrically coupled to the first nanowire FET and to the second nanowire FET.

4. The device of claim 1, wherein the first nanowire FET and the second nanowire FET form a first nanowire FET stack, and further comprising a second nanowire FET stack coupled to the substrate.

5. The device of claim 4, wherein the second nanowire FET stack includes a plurality of nanowire FETs and a second nanowire coupled to each nanowire FET of the plurality of nanowire FETs.

6. The device of claim 4, wherein the second nanowire FET stack includes a second nanowire electrically coupled to a plurality of nanowire FETs of the second nanowire FET stack, wherein the first nanowire includes a first material and the second nanowire includes a second material that is different from the first material.

7. The device of claim 6, further comprising an isolation trench between the first nanowire FET stack and the second nanowire FET stack, wherein first material includes an N-type dopant and the second material includes a P-type dopant.

8. The device of claim 4, wherein the first nanowire FET stack includes a first number of nanowire FETs and the second nanowire FET stack includes a second number of nanowire FETs, the second number different from the first number, and wherein the first nanowire FET stack has a first a drive strength different from a second drive strength of the second nanowire FET stack.

9. The device of claim 4, further comprising a plurality of additional nanowire FET stacks coupled to the substrate, the first nanowire FET stack, the second nanowire FET stack, and the plurality of additional nanowire FET stacks arranged in a grid.

10. The device of claim 4, further comprising an isolation trench between the first nanowire FET stack and the second nanowire FET stack.

11. The device of claim 4, further comprising a communications device, a personal digital assistant (PDA), a navigation device, a fixed location data unit, a set top box, a music player, a video player, an entertainment unit, or a computer into which the first nanowire FET stack and the second nanowire FET stack are integrated.

12. The device of claim 1, further comprising at least one additional nanowire FET positioned between the substrate and the second nanowire FET, the first nanowire electrically coupled to the at least one additional nanowire FET.

13. The device of claim 1, wherein the first nanowire FET includes a first source region, a first drain region, and a first gate region between the first source region and the first drain region, and the second nanowire FET includes the first drain region, a second source region, and a second gate region between the first drain region and the second source region.

14. The device of claim 1, wherein the first nanowire FET includes a first drain region, a first source region, and a first gate region between the first drain region and the first source region, and the second nanowire FET includes the first source region, a second drain region, and a second gate region between the first source region and the second drain region.

15. The device of claim 1, wherein the first nanowire FET and the second nanowire FET form a nanowire FET stack, and wherein the first nanowire FET and the second nanowire FET of the nanowire FET stack are configured to act in conjunction as a single transistor.

16. The device of claim 15, wherein a drive strength of the nanowire FET stack is based on a number of nanowire FETs included in the nanowire FET stack.

17. The device of claim 1, wherein the common source line, the common drain line, and the common gate line are arranged substantially perpendicular to a surface of the substrate.

18. The device of claim 4, further comprising:
   a second common source line coupled to a source region of each nanowire FET of the second nanowire FET stack;
   a second common drain line coupled to a drain region of each nanowire FET of the second nanowire FET stack; and
   a second common gate line coupled to a gate regions of each nanowire FET of the second nanowire FET stack.

19. A device comprising:
means for supporting an integrated circuit;
first means for providing charge carriers coupled to the means for supporting;
means for collecting charge carriers coupled to the means for supporting;
first means for controlling a conductive channel, the first means for controlling the conductive channel positioned between the first means for providing charge carriers and the means for collecting charge carriers;
second means for providing charge carriers coupled to the means for supporting;
second means for controlling the conductive channel, the second means for controlling the conductive channel positioned between the second means for providing charge carriers and the means for collecting charge carriers;
means for forming the conductive channel coupled to the first means for providing charge carriers, to the first means for controlling the conductive channel, to the means for collecting charge carriers, to the second means for controlling the conductive channel, and to the second means for providing charge carriers, the means for forming the conductive channel having a dimension parallel to a surface of the means for supporting of less than 100 nanometers; and
means for electrically coupling the first means for providing charge carriers and the second means for providing charge carriers;
means for electrically coupling the first means for collecting charge carriers and the second means for collecting charge carriers; and
means for electrically coupling the first means for controlling the conductive channel arid the second means for controlling the conductive channel.

20. The device of claim 19, wherein the dimension of the means for forming the conductive channel parallel to the surface of the means for supporting is less than 10 nanometers.

21. The device of claim 19, further comprising:
at least one second means for collecting charge carriers coupled to the means for supporting; and
at least one additional means for controlling the conductive channel positioned between the at least one second means for collecting charge carriers and the second means for providing charge carriers, wherein the means for forming the conductive channel coupled to the at least one second means for collecting charge carriers and to the at least one additional means for controlling the conductive channel.

22. A device comprising:
means for supporting an integrated circuit;
first means for collecting charge carriers coupled to the means for supporting;
means for providing charge carriers coupled to the means for supporting;
first means for controlling a conductive channel, the first means for controlling the conductive channel positioned between the first means for collecting charge carriers and the means for providing charge carriers;
second means for collecting charge carriers coupled to the means for supporting;
second means for controlling the conductive channel, the second means for controlling the conductive channel positioned between the second means for collecting charge carriers and the means for providing charge carriers;
means for forming the conductive channel coupled to the first means for collecting charge carriers, to the first means for controlling the conductive channel, to the means for providing charge carriers, to the second means for controlling the conductive channel, and to the second means for collecting charge carriers, the means for forming the conductive channel having a dimension parallel to a surface of the means for supporting less than 100 nanometers;
means for electrically coupling the first means for providing charge carriers and the second means for providing charge carriers;
means for electrically coupling the first means for collecting charge carriers and the second means for collecting charge carriers; and
means for electrically coupling the first means for controlling the conductive channel and the second means for controlling the conductive channel.

23. The device of claim 22, wherein the dimension of the means for forming the conductive channel parallel to the surface of the means for supporting is less than 10 nanometers.

24. The device of claim 22, further comprising:
at least one second means for providing charge carriers coupled to the means for supporting; and
at least one additional means for controlling the conductive channel positioned between the at least one second means for providing charge carriers and the second means for collecting charge carriers, wherein the means for forming the conductive channel is coupled to the at least one second means for providing charge carriers and to the at least one additional means for controlling the conductive channel.

25. A method comprising:
forming a first nanowire field effect transistor (FET) on a substrate;
forming a second nanowire FET on the first nanowire FET to form a nanowire FET stack having a nanowire that is electrically coupled to the first nanowire FET and to the second nanowire FET;
forming a common source line coupled to a source region of each of the first nanowire FET and the second nanowire FET;
forming a common drain line coupled to a drain region of each of the first nanowire FET and the second nanowire FET; and
forming a common gate line coupled to a gate region of each of the first nanowire FET and the second nanowire FET.

26. The method of claim 25, wherein forming the first nanowire FET includes:
forming a first source region electrically coupled to the nanowire;
forming a first drain region electrically coupled to the nanowire; and
forming a first gate region between the first source region and the first drain region, the first gate region electrically coupled to the nanowire.

27. The method of claim 26, wherein forming the second nanowire FET includes:
forming a second source region electrically coupled to the nanowire; and
forming a second gate region between the first drain region and the second source region, the second gate region electrically coupled to the nanowire.

28. The method of claim 26, wherein forming the second nanowire FET include:

forming a second drain region electrically coupled to the nanowire; and forming a second gate region between the first source region and the second drain region, the second gate region electrically coupled to the nanowire.

29. The method of claim 25, further comprising before forming the first nanowire FET and the second nanowire FET, forming a layer stack on the substrate, the layer stack including dummy layers separated by spacer layers, wherein the dummy layers include gate region dummy layers, drain region dummy layers and source region dummy layers.

30. The method of claim 29, wherein the first nanowire FET and the second nanowire FET are formed concurrently by:

performing a first set of selective etches to form an opening in the dummy layers;

depositing a first set of one or more materials in the opening to form the nanowire;

performing a second set of selective etches to remove the gate region dummy layers;

depositing a second set of one or more materials to form a gate region of each nanowire FET of the nanowire FET stack;

performing a third set of selective etches to remove the drain region dummy layers;

depositing a third set of one or more materials to faun a drain region of each nanowire FET of the nanowire FET stack;

performing a fourth set of selective etches to remove the source region dummy layers; and depositing a fourth set of one or more materials to form a source region of each nanowire FET of the nanowire FET stack.

31. A non-transitory computer-readable medium comprising processor executable instructions that, when executed by a processor, cause the processor to:

initiate formation of a nanowire field effect transistor (FET) stack on a substrate by:

forming a first nanowire FET on the substrate;

forming a second nanowire FET on the first nanowire FET such that a nanowire is electrically coupled to the first nanowire FET and to the second nanowire FET;

forming a common source line coupled to a source region of each of the first nanowire FET and the second nanowire FET;

forming a common drain line coupled to a drain region of each of the first nanowire FET and the second nanowire FET; and forming a common gate line coupled to a gate region of each of the first nanowire FET and the second nanowire FET.

32. The non-transitory computer-readable medium of claim 31, wherein initiating formation of the nanowire FET stack on the substrate further includes forming a layer stack on the substrate, the layer stack including gate region dummy layers, drain region dummy layers and source region dummy layers.

33. The non-transitory computer-readable medium of claim 32, wherein initiating formation of the nanowire FET stack on the substrate further includes, after forming the layer stack:

performing a first set of selective etches to form an opening in the layer stack;

depositing a first set of one or more materials in the opening to form the nanowire;

performing a second set of selective etches to remove the gate region dummy layers;

depositing a second set of one or more materials to form a gate region of each nanowire FET of the nanowire FET stack;

performing a third set of selective etches to remove the drain region dummy layers;

depositing a third set of one or more materials to form a drain region of each nanowire FET of the nanowire FET stack;

performing a fourth set of selective etches to remove the source region dummy layers; and depositing a fourth set of one or more materials to form a source region of each nanowire FET of the nanowire FET stack.

* * * * *